(12) United States Patent
Kawano et al.

(10) Patent No.: US 7,005,238 B2
(45) Date of Patent: Feb. 28, 2006

(54) APPARATUS FOR PROCESSING SUBSTRATE AND METHOD OF PROCESSING THE SAME

(75) Inventors: Kenji Kawano, Yokohama (JP); Shinichi Ito, Yokohama (JP); Eishi Shiobara, Inagi (JP); Daisuke Kawamura, Yokohama (JP); Kei Hayasaki, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/030,135

(22) Filed: Jan. 7, 2005

(65) Prior Publication Data

US 2005/0158670 A1 Jul. 21, 2005

Related U.S. Application Data

(63) Continuation of application No. 10/026,419, filed on Dec. 26, 2001, now Pat. No. 6,881,058.

(30) Foreign Application Priority Data

Dec. 26, 2000 (JP) ............................ 2000-394354
Jan. 19, 2001 (JP) ............................ 2001-011299
Dec. 19, 2001 (JP) ............................ 2001-385349

(51) Int. Cl.
    *G03C 5/00* (2006.01)

(52) U.S. Cl. ...................... 430/311; 430/330; 430/322; 432/152

(58) Field of Classification Search ................ 430/311, 430/330, 322; 432/152
See application file for complete search history.

(56) References Cited

U.S. PATENT DOCUMENTS 5,434,644 A   7/1995   Kitano et al.
6,072,162 A   6/2000   Ito et al.

(Continued)

FOREIGN PATENT DOCUMENTS

JP          07-163929          6/1995

(Continued)

OTHER PUBLICATIONS

Kihara, N. et al., "Effect of Acid Evaporation in Chemically Amplified Resists on Insoluble Layer Formation", Journal of Photopolymer Science and Technology, vol. 8, No. 4, pp. 561-570, (1995).

(Continued)

*Primary Examiner*—John A. McPherson
*Assistant Examiner*—Daborah Chacko-Davis
(74) *Attorney, Agent, or Firm*—Finnegan, Henderson, Farabow, Garrett & Dunner, L.L.P.

(57) ABSTRACT

A heating apparatus for a substrate to be processed with a coating film has a chamber with an inner space, a heating plate heating the substrate to be processed in the inner space, and a partition member. The heating plate has a support surface which supports the substrate to be processed within the chamber. The partition member is arranged in the chamber so as to face the support surface. The partition member partitions the inner space into first and second spaces, and has a plurality of pores which allow the first and second spaces to communicate with each other. The support surface of the heating plate is set in the first space. An air stream formation mechanism forming an air stream is arranged in the second space. This mechanism discharges a substance evaporated from the photoresist film.

20 Claims, 34 Drawing Sheets

U.S. PATENT DOCUMENTS

| | | |
|---|---|---|
| 6,191,397 B1 | 2/2001 | Hayasaki et al. |
| 6,301,435 B1 | 10/2001 | Ito et al. |
| 6,585,430 B1 * | 7/2003 | Matsuyama et al. ........ 396/611 |
| 2002/0086259 A1 | 7/2002 | Shirakawa et al. |

FOREIGN PATENT DOCUMENTS

| | | |
|---|---|---|
| JP | 10-335238 | 12/1998 |
| JP | 11-38644 | 2/1999 |
| JP | 2000-146444 | 5/2000 |
| JP | 2000-173883 | 6/2000 |
| JP | 2000-188251 | 7/2000 |

OTHER PUBLICATIONS

Office Action from Japanese Patent Application No. 2001-385349, dated Nov. 11, 2004.

* cited by examiner

APPARATUS FOR PROCESSING SUBSTRATE AND METHOD OF PROCESSING THE SAME

CROSS-REFERENCE TO RELATED APPLICATIONS

This application is a division of application Ser. No. 10/026,419, filed Dec. 26, 2001 now U.S. Pat. No. 6,881,058, which is incorporated in its entirety herein by reference. This application is also based upon and claims priority from prior Japanese Patent Application Nos. 2000-394354, filed Dec. 26, 2000, 2001-011299, filed Jan. 19, 2001, and 2001-385349, filed Dec. 19, 2001, the entire contents of all of which are incorporated herein by reference.

BACKGROUND OF THE INVENTION

1. Field of the Invention

The present invention relates to an apparatus for processing substrate and method of processing the same and, more particularly, to an apparatus for processing a coating film, a heating apparatus for a coating film, heating method using the heating apparatus and resist pattern formation method relating to a lithography process.

2. Description of the Related Art

The manufacture of a semiconductor device uses a resist pattern in formation of an element region, processing of electrode wiring, and the like. This resist pattern is generally formed as follows. After a resist coating film is formed on a semiconductor wafer, heating processing called pre-bake is performed. In pre-bake, a solvent in the resist is volatilized. Then, a predetermined pattern is transferred to the resist film by exposure.

Along with micropatterning of semiconductor elements, high resolution is required in lithography. To meet this demand, the wavelength of exposure light used is being shortened. In photolithography, a KrF excimer laser (wavelength: 248 nm) has widely been used as an exposure light source.

Along with a shortened wavelength of exposure light, a photoresist called a chemically amplified resist as a photosensitive resin (photoresist) material for transferring a pattern has been devised and put into practical use. The chemically amplified resist contains an acid generator which generates an acid by exposure. The acid generated by exposure decomposes (positive type) or crosslinks (negative type) a resin. The property that the solubility to a developing solution changes is utilized in the subsequent developing step.

The chemically amplified resist is excellent in resolution but is sensitive to the environment. The chemically amplified resist reacts with a basic material in air, and the acid is deactivated to degrade the pattern shape or resolution. To prevent this degradation, the environment is controlled. To control the environment, a chemical filter or the like is generally attached in a coater/developer for coating/developing a resist.

Most of chemically amplified resists require a heating processing step called PEB (Post Exposure Bake) after the exposure step. PEB diffuses an acid generated in the exposure step. After the PEB processing step, the chemically amplified resist is exposed to a developing solution to form a desired resist pattern.

The chemically amplified resist is known to disappear due to evaporation of the acid in PEB processing, in addition to deactivation of the acid. Several conventional methods of reducing disappearance of the resist due to evaporation of the acid in PEB processing have been proposed. For example, the temperature of pre-bake performed to volatilize the solvent after resist coating is set higher than a general one, and the PEB temperature is set lower than a general one, thereby reducing evaporation of the acid ("Effect of acid evaporation in Chemically Amplified resists on insoluble layer formation" Journal of Photopolymer Science and Technology Vol. 8, Number 4 (1995), pp. 561–570: to be referred to as reference 1 hereinafter). As another method, evaporation of the acid is reduced by executing PEB processing at a pressure higher than general atmospheric pressure (Jpn. Pat. KOKAI Publication No. 11-38644: to be referred to as reference 2 hereinafter).

According to reference 1, the evaporation amount of the acid in PEB can be reduced. However, pre-bake processing and PEB processing are done under conditions greatly different from optimal temperature conditions (normal conditions). The original resist performance such as the margin of exposure dose (amount) of focus cannot be fully exploited.

PEB processing requires a heating apparatus capable of preventing gas or particles produced upon heating from being deposited inside a chamber and serving as a particle generation source, as shown in FIG. 65. This heating apparatus comprises an air inlet port 6501 formed in one side surface of a chamber 6500, and a discharge port 6502 formed in the facing other side surface. A gas 6504 is flowed between the air inlet port 6501 and air outlet port 6502 along the upper surface of a semiconductor wafer W on a hot plate 6503, thereby generating an air stream within the chamber.

As shown in FIG. 66, acids evaporated in PEB is carried downstream by the air stream, as indicated by arrows in FIG. 66, and adsorbed to the wafer again. The acid concentration on the resist surface differs between a chip at the uppermost stream of the air stream and a chip at the lowermost stream. Thus, the width of resist pattern varies within the wafer plane after developing processing.

In reference 2, evaporation of the acid can be reduced, but no measure is adopted for adsorption of an evaporated acid. Since the evaporated acid is adsorbed to a semiconductor wafer again, it is difficult to prevent variations in resist width within the wafer plane after developing processing.

BRIEF SUMMARY OF THE INVENTION

According to a first aspect of the present invention, there is provided a heating apparatus for a coating film, comprising: a chamber having an inner space, a heating plate heating a substrate to be processed, the heating plate having a support surface that supports a substrate to be processed with a coating film in the chamber; a partition member arranged in the chamber so as to face the support surface, the partition member partitioning the inner space into first and second spaces and having a plurality of pores allowing the first and second spaces to connect with each other, and the support surface being set in the first space; and an air stream formation mechanism forming an air stream in the second space in order to discharge a substance evaporated from the coating film.

According to a second aspect of the present invention, there is provided a processing method for a resist film, comprising: forming a photoresist film on a substrate to be processed; heating the substrate to be processed with the photoresist film within a chamber having a partition member, the partition member partitioning the chamber into first and second spaces and having a plurality of pores allowing the first and second spaces to connect with each other, and the substrate to be processed being set in the first space; flowing a substance evaporated from the substrate to be processed into the second space via the plurality of pores and discharging the evaporated substance from the second space by an air stream during the heating; exposing the resist film by irradiating with an energy radiation to form an exposure region having a latent image pattern; and developing the resist film by exposing the resist film to a developing solution to selectively remove part of the photoresist film, and forming a desired pattern on the substrate to be processed.

DETAILED DESCRIPTION OF THE INVENTION

Figure 1:
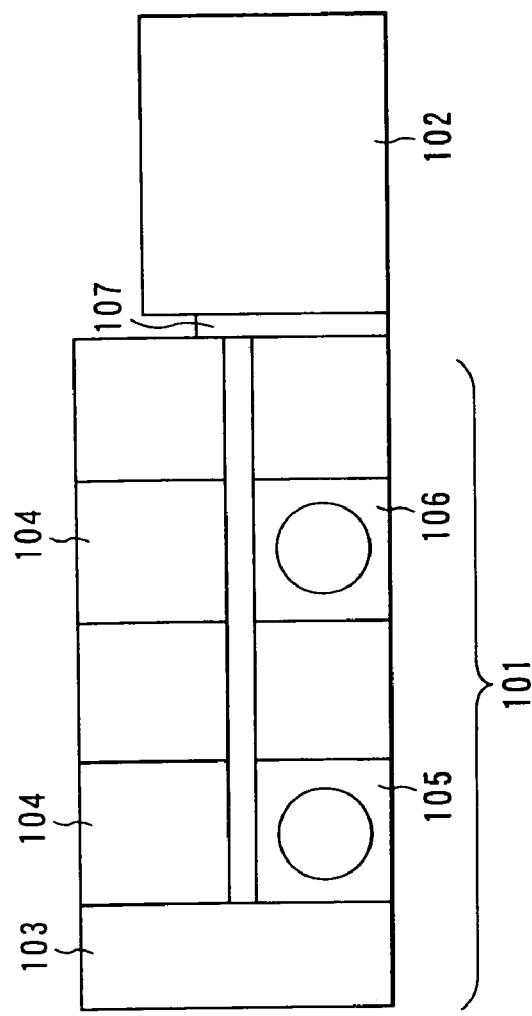
FIG. 1 is a plan view schematically showing a substrate processing apparatus according to each embodiment of the present invention.

Embodiments of the present invention will be described in detail below with reference to the several views of the accompanying drawing. In the following description, the same reference numerals denote the same parts having almost the same functions and arrangements, and a repetitive description thereof will be done as needed.

FIG. 1 is a plan view showing a substrate processing apparatus used in each embodiment of the present invention. This substrate processing apparatus is constituted by a coating/developing apparatus (coater/developer) 101 and exposure apparatus 102. The coating/developing apparatus 101 comprises a wafer station 103, heating apparatuses (heaters) 104, a coater 105, a developer 106, and an interface 107. The layout of these units is merely an example, and the present invention is not limited to this.

(First Embodiment)

A heating apparatus and a substrate processing method (substrate processing method hereinafter) using the same according to the first embodiment of the present invention will be described with reference to FIG. 2.

Figure 2:
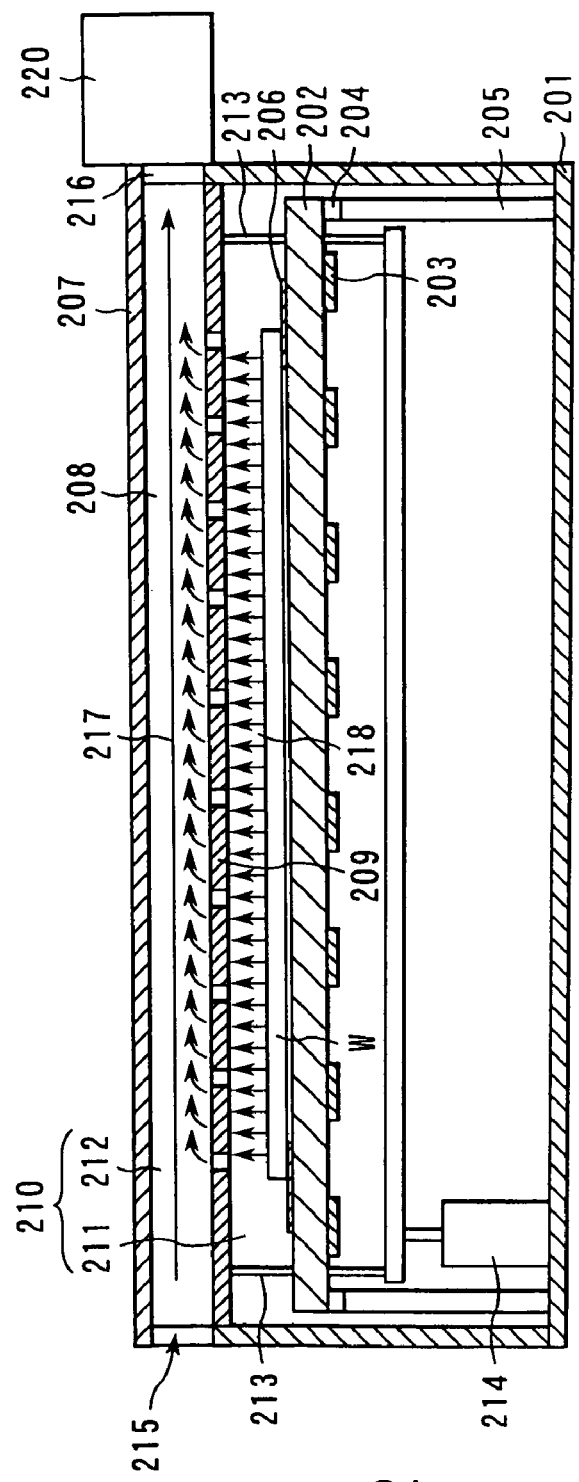
FIG. 2 is a sectional view schematically showing a heating apparatus according to the first embodiment of the present invention.

FIG. 2 is a sectional view schematically showing the heating apparatus according to the first embodiment.

This heating apparatus has a housing 201. The housing 201 has a heating means. The heating means is made up of a hot plate 202 and heater 203. A substrate to be processed, e.g., semiconductor wafer W (to be simply referred to as a wafer hereinafter) is set on the upper surface of the hot plate 202. The heater 203 is divided into a plurality of parts and arranged on the lower surface of the hot plate 202. The respective heaters 203 are independently controlled to a constant set temperature within the wafer W by a control unit (not shown).

The hot plate 202 is supported by a frame 205 via a heat insulator 204. The wafer W to be heated is held on the hot plate 202 at an interval of 0.1 mm by a proximity gap 206. The wafer W is heated for a predetermined time.

An aluminum top plate 207 is set above the hot is plate 202. The hot plate 202, housing 201, and top plate 207 constitute a chamber 208. A porous ceramic plate 209 is installed in the chamber 208 above the hot plate 202 so as to face the hot plate 202. The porous ceramic plate 209 functions as a partition member and has many pores. The porous ceramic plate 209 is made of, e.g., SiC with a pore diameter of 50 μm and a porosity of 40%.

The porous ceramic plate 209 partitions a space 210 within the chamber 208 into lower and upper spaces, i.e., first and second space sections 211 and 212. The first space section 211 includes the hot plate 202 which supports the wafer W. The second space section 212 does not include the hot plate 202.

The porous ceramic plate 209 is supported by a plurality of support pins 213. The support pins 213 are vertically moved by an elevating mechanism 214 disposed below the hot plate 202. The interval between the porous ceramic plate 209 and the wafer W on the hot plate 202 is adjusted by vertically moving the porous ceramic plate 209. The porous ceramic plate 209 can be easily detached from the heating apparatus and cleaned at any time.

An air inlet port 215 is formed in one side surface of the chamber 208 in the second space section 212. A discharge port 216 connected to a discharge means 220 is formed in the other side surface facing the air inlet port 215. An air stream 217 is formed in one direction from the air inlet port 215 to the discharge port 216.

The volume of air in the first space section 211 expands by heating. The expanded air is vertically drawn toward the porous ceramic plate 209 by the air stream 217 in the second space section 212. Then, the air is entrapped into the second space section 212 via the pores of the porous ceramic plate 209. In other words, an air flow 218 almost perpendicular to the wafer W is formed in the first space section 211.

PEB processing and resist pattern formation using the heating apparatus will be explained.

A coating film as an antireflection film is formed on a wafer W by spin coating. The wafer W is baked at 190° C. for 60 sec to form a 60-nm thick antireflection film.

After a positive chemically amplified resist is applied onto the wafer W, the wafer W undergoes heating processing called pre-bake at 140° C. for 90 sec. In pre-bake, a solvent in the resist is volatilized. As a result, a 400-nm thick resist film is formed on the antireflection film. The chemically amplified resist is made of a solvent mixture of ethyl lactate and 3-ethyl ethoxypropionate using a phenol-based resin as a base polymer. The same chemically amplified resist is used in subsequent embodiments.

After pre-bake, the wafer W is cooled to room temperature. The wafer W is transferred to an exposure apparatus using as a light source a KrF excimer laser (Deep UV laser) with a wavelength of 248 nm. The wafer W is subjected to reduction projection exposure via an exposure mask.

Figure 3:
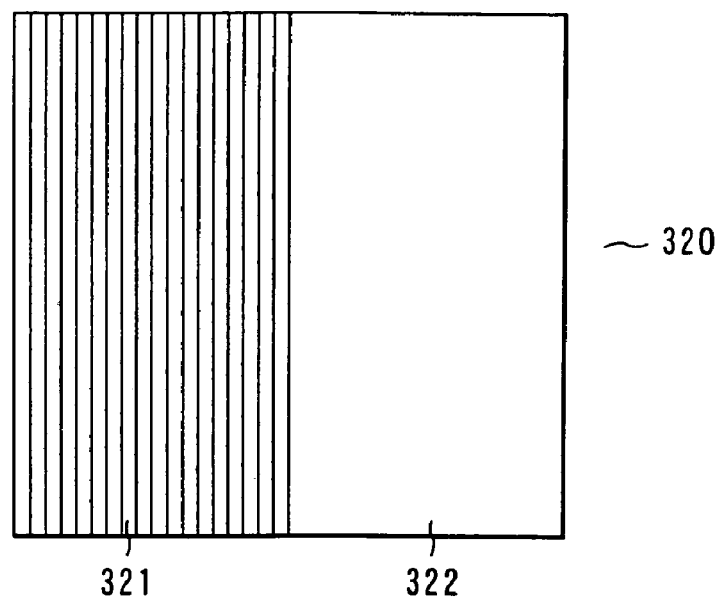
FIG. 3 is a view showing a pattern obtained when an exposure mask is transferred onto a wafer.

FIG. 3 is an enlarged view showing a pattern obtained when the exposure apparatus transfers the pattern of the exposure mask used in the first embodiment onto the wafer W. In FIG. 3, one exposure region 320 (to be simply referred to as an exposure chip hereinafter) has a line pattern region 321 on the left half and a flat exposure region 322 where no resist remains.

Figure 4:
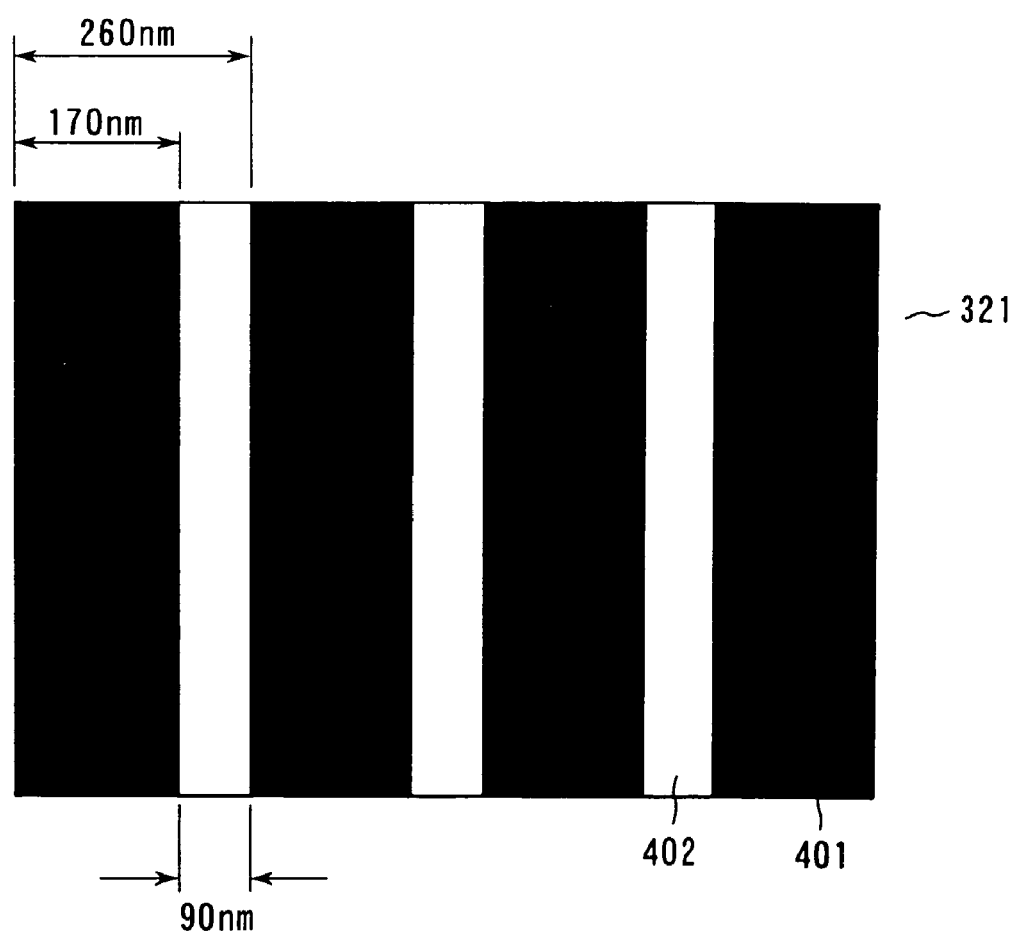
FIG. 4 is an enlarged view showing a line pattern region on the pattern of FIG. 3.

FIG. 4 is an enlarged view showing the line pattern region 321. In FIG. 4, reference numeral 401 denotes a line portion; and 402, a space portion. As shown in FIG. 4, repetitive patterns with a line width=170 nm and a space width=90 nm are laid out at a pitch=260 nm in the line pattern region 321.

Figure 5:
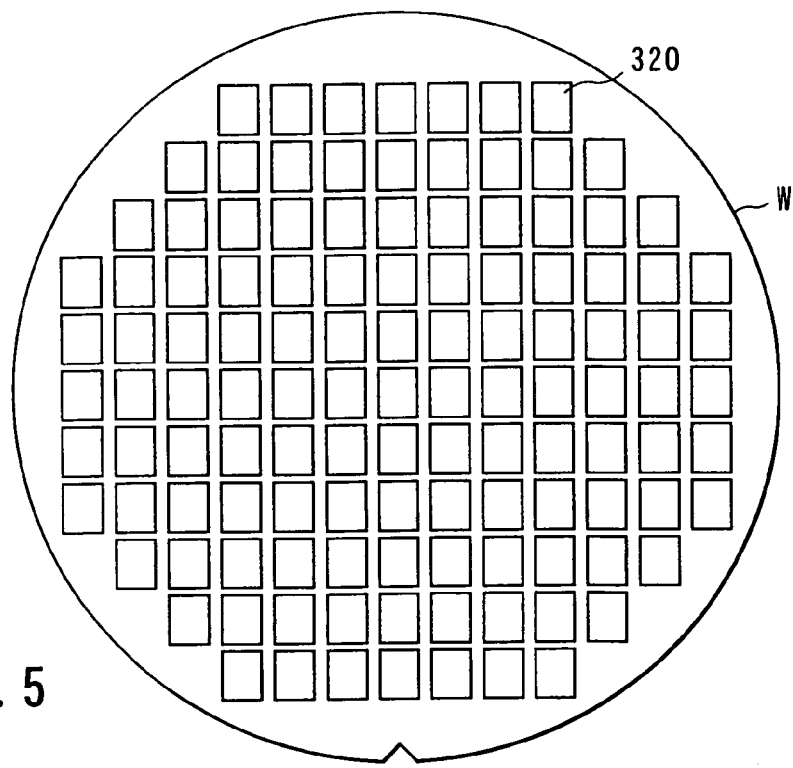
FIG. 5 is a view showing a layout of exposure chips on a wafer.

As shown in FIG. 5, exposure chips 320 are transferred in an array of 11 (vertical)×13 (horizontal) on the wafer W, thereby forming a latent image.

After exposure, the wafer W is transferred to the heating apparatus of the first embodiment, and set above the hot plate 202 at an interval of 0.1 mm. While the air stream 217 is flowed in one direction within the second space section 212, the wafer W undergoes PEB processing at 140° C. for 90 sec.

After PEB processing, the wafer W is cooled to room temperature. The wafer W is transferred to the developing unit where the wafer W is subjected to alkali developing processing for 60 sec. After developing processing, the wafer W is rinsed with pure water and spin-dried to form a resist pattern.

Figure 65:
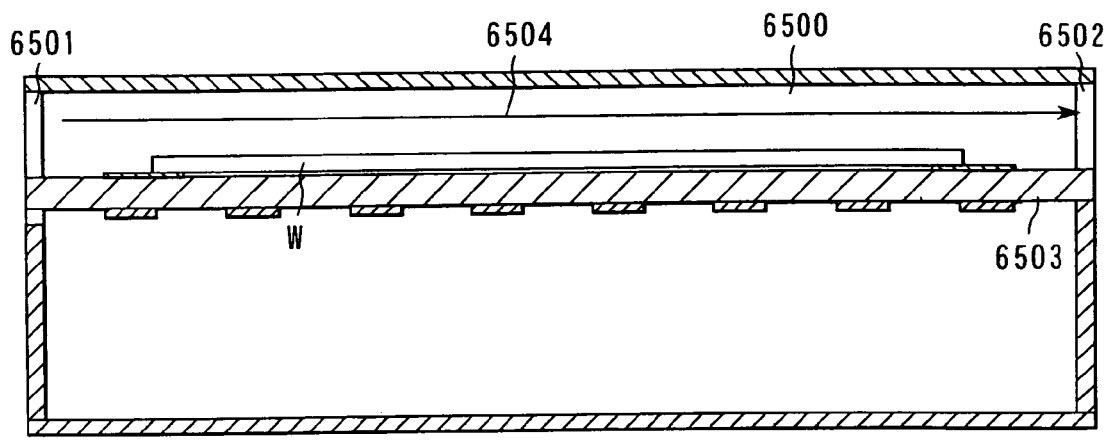
FIG. 65 is a sectional view schematically showing a conventional heating apparatus.

The comparison between the in-plane distribution of the resist pattern width obtained by using the heating apparatus of the first embodiment and the result of PEB processing using the conventional heating apparatus shown in FIG. 65 will be explained.

Figure 67:
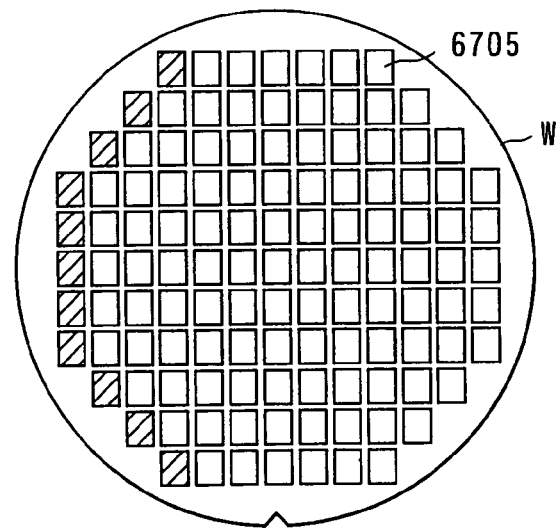
FIG. 67 is a plan view showing the in-plane distribution of the quality of a pattern transfer result attained by heating processing using the conventional heating apparatus.

FIG. 67 shows the in-plane distribution of the quality of a pattern transfer result attained by using the conventional heating apparatus.

Figure 66:
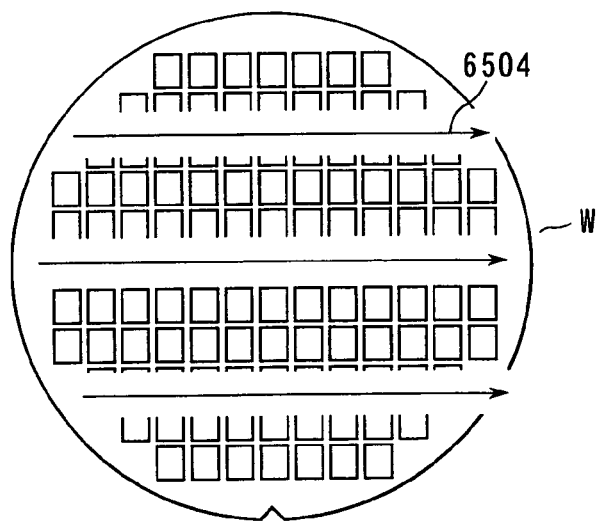
FIG. 66 is a plan view showing the positional relationship between the air stream direction and the exposure chip during conventional heating processing.

Exposure chips hatched in FIG. 67 are determined as NG when a developed resist pattern is observed from above it with an SEM (Scanning Electron Microscope). That is, the resist pattern is not resolved. As shown in FIG. 67, exposure chips at the uppermost stream of an air stream in PEB processing are NG. This is because the exposure dose changes depending on the chip due to the following reason. In the conventional heating apparatus, the air stream 6504 containing acids evaporated from a resist film is supplied from the left end to the right end, as indicated by arrows in FIG. 66. As a result, the acids evaporated from an exposure chip at the uppermost stream of the air stream are carried downstream by the air stream, and adsorbed again to an exposure chip surface at the downstream. The total acid amount is therefore (generated acid)−(evaporated acid)+(adsorbed acid). A chip at the uppermost stream of the air stream is free from the adsorbed acid, so that the effective exposure dose decreases in comparison with a chip at the downstream. Even if the same energy (exposure dose and the amount of heat during PEB) is applied to respective exposure chips 6705, the line width of a resist pattern formed after developing varies. With the use of a positive resist, this difference is large on an exposure chip at the uppermost stream.

Figure 6:
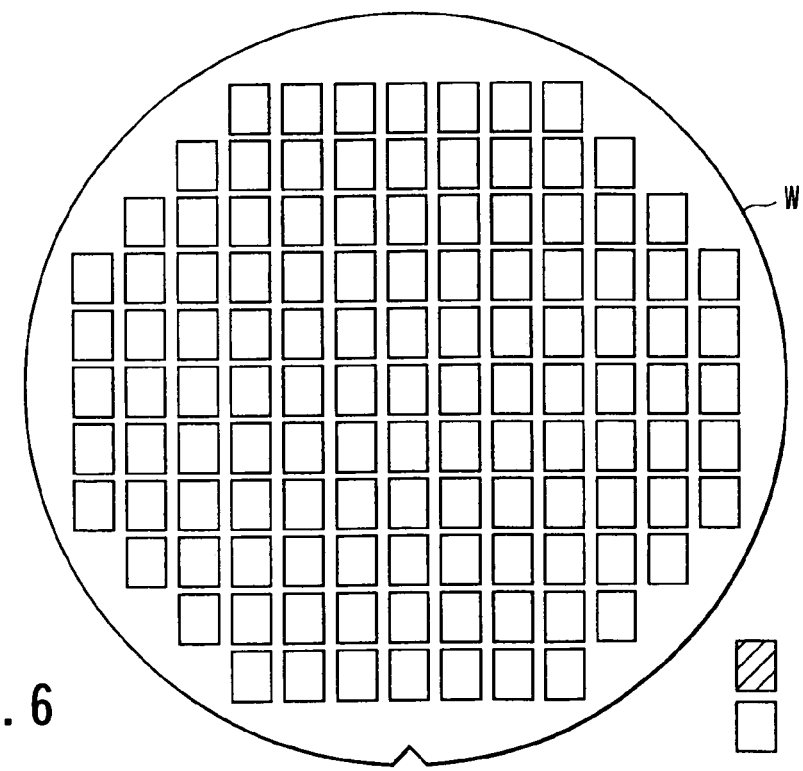
FIG. 6 is a view showing the in-plane wafer distribution of the quality of a pattern transfer result attained by using the heating apparatus according to the first embodiment of the present invention.

FIG. 6 is a view showing the in-plane distribution of the quality of a pattern transfer result attained by using the heating apparatus according to the first embodiment. As shown in FIG. 6, no NG exposure chip is observed, and a good pattern transfer result is obtained.

Figure 8A:
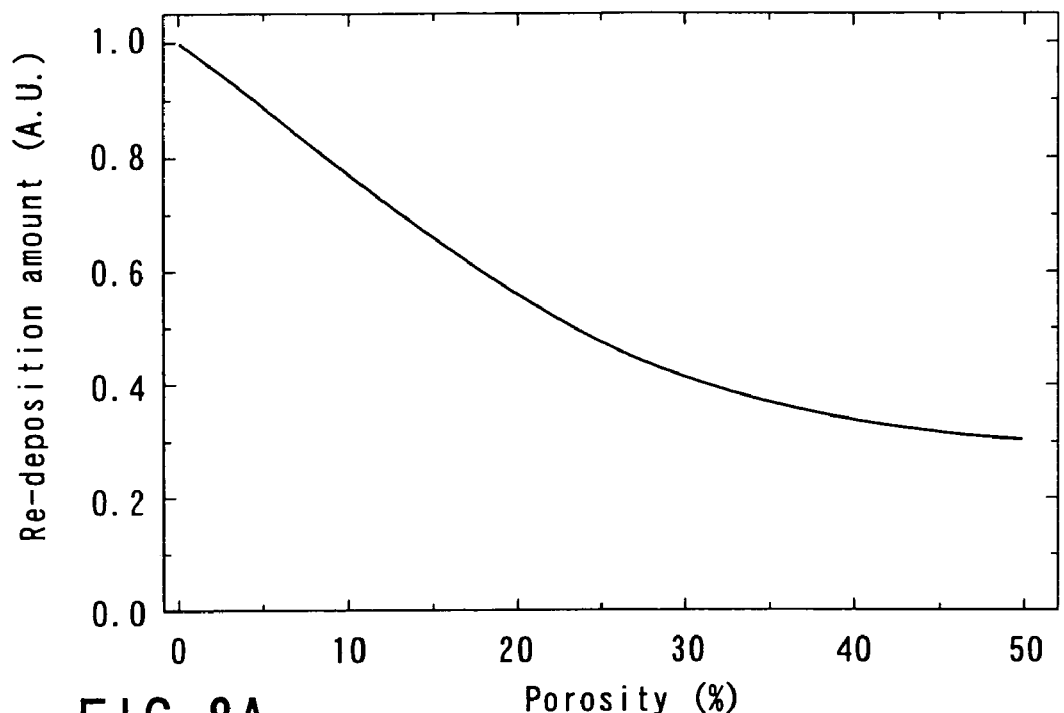
FIG. 8A is a graph showing the relationship between the porosity and adsorption of evaporated substance.

The first embodiment adopts a porous ceramic plate with a pore diameter of 50 μm and a porosity of 40% because of the following reason. FIG. 8A shows the relationship between the porosity of a porous ceramic plate with a pore diameter of 50 μm and the adsorption amount of evaporated acids (normalized for a porosity of 0). As is apparent from FIG. 8A, the adsorption amount suppression effect is saturated at a porosity of 40%. Thus, the porosity of the porous ceramic plate used is set to 40%.

According to the first embodiment, an air flow containing acids evaporated in the first space section is drawn almost perpendicularly to the wafer W by an air stream in the second space section within the chamber in the PEB processing step. The drawn air flow is entrapped into the second space section via the pores of the porous ceramic plate. Thus, the evaporated acids are not deposited again downstream. The acid density on the resist surface is almost uniform between exposure shots within the plane of the wafer W. The exposure dose does not substantially vary, and the uniformity of the resist width within the plane of the wafer W can be improved. In the PEB processing step, PEB processing can be done under optimal temperature conditions, and the original resist performance such as the margin of exposure dose or focus can be fully exploited.

(Second Embodiment)

A heating apparatus and a substrate processing method using the same according to the second embodiment of the present invention will be described with reference to FIG. 7. The second embodiment is different from the first embodiment only in the heating means.

Figure 7:
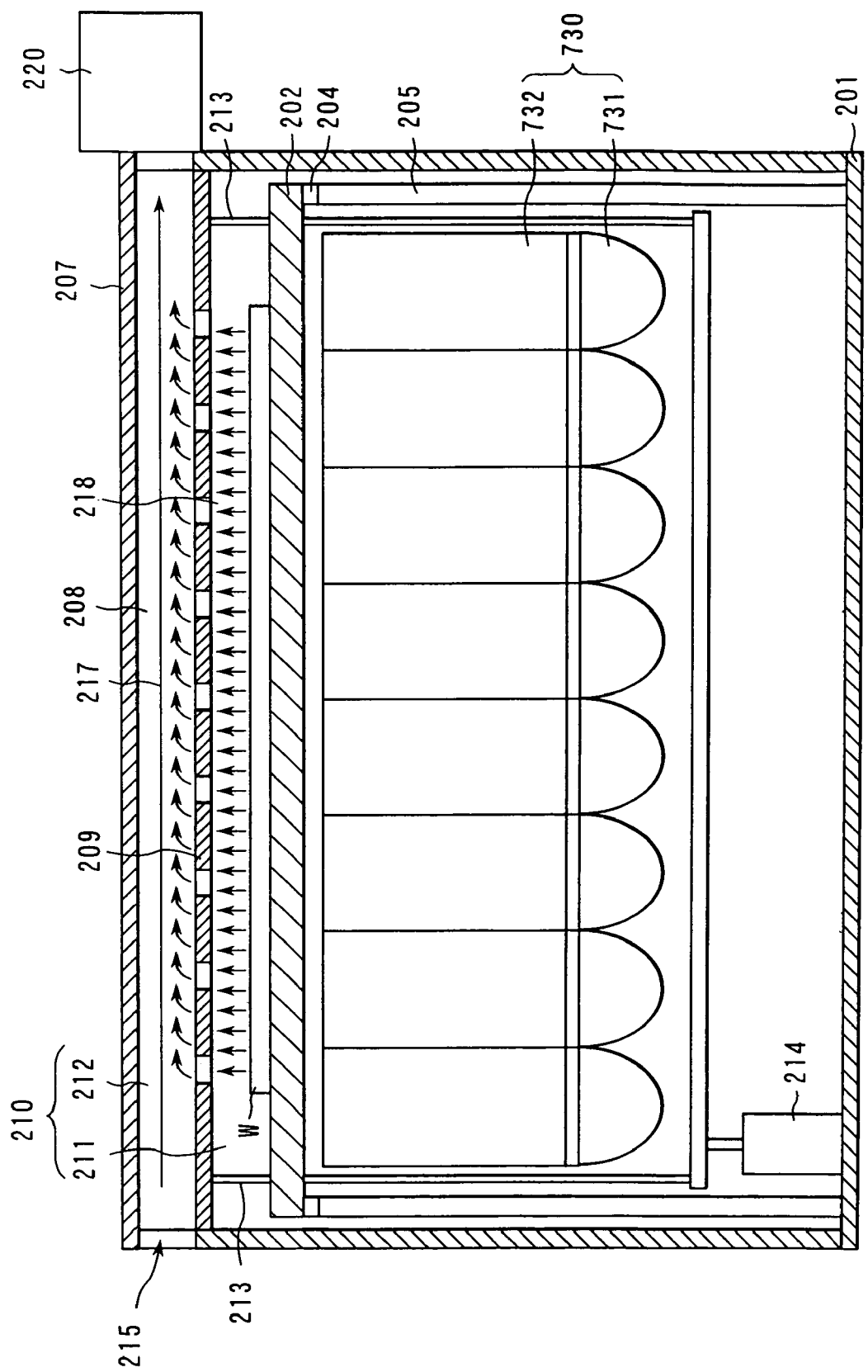
FIG. 7 is a sectional view schematically showing a heating apparatus according to the second embodiment of the present invention.

FIG. 7 is a sectional view schematically showing the heating apparatus according to the second embodiment. A description of the same part as in the first embodiment will be omitted, and only a difference will be described.

A heat source 730 for heating a hot plate 202 is below the lower surface of the hot plate 202. The hot plate 202 and heat source 730 constitute a heating means.

The heat source 730 is made up of a halogen lamp 731 and light guide 732. The light guide 732 includes prismatic blocks. Light emitted by the halogen lamp 731 enters the light guide 732. The incident light travels while being mostly total-reflected by the side surface of the light guide, and reaches the hot plate 202.

The hot plate 202 is heated by absorbing light from the light guide 732. The power of the halogen lamp 731 is controlled by the temperature of a thermocouple (not shown) buried in the hot plate 202, and adjusted to a desired temperature (140° C.). In the second embodiment, a porous ceramic plate 209 is made of a material with a pore diameter of 100 μm and a porosity of 50%.

PEB processing and resist pattern formation using the heating apparatus will be explained.

A coating film as an antireflection film is formed on a wafer W by spin coating. The wafer W is baked at 190° C. for 60 sec to form a 60-nm thick antireflection film.

After a positive chemically amplified resist is applied onto the wafer W, the wafer W is pre-baked at 140° C. for 90 sec. In this way, a 400-nm thick resist film is formed on the antireflection film.

After pre-bake, the wafer W is cooled to room temperature. The wafer W is transferred to an exposure apparatus using a KrF excimer laser with a wavelength of 248 nm as a light source. The wafer W is subjected to reduction projection exposure via an exposure mask.

As shown in FIG. 5, exposure chips including 150-nm line & space patterns are transferred via the exposure mask in an array of 11 (vertical)×13 (horizontal) on the wafer W, thereby forming a latent image.

After exposure, the wafer W is transferred to the heating apparatus of the second embodiment, and set on the hot plate 202. While an air stream 217 is flowed in one direction within a second space section 212, the wafer W undergoes PEB processing at 140° C. for 90 sec. After PEB processing, the wafer W undergoes the same processing as that of the first embodiment to form a resist pattern.

The second embodiment achieved the following results of measuring the resist line width within the plane of the wafer W after developing. In-plane width variations between the 150-nm line & space patterns were reduced to 4.3 nm, which is much smaller than 9.7 nm (3σ) in PEB processing by the conventional heating apparatus.

Note that the first and second embodiments have exemplified the line pattern and the line & space pattern. However, the present invention is not limited to these patterns, and the same effects can be obtained even by another pattern, hole pattern for example.

The first and second embodiments have exemplified the numerical values of the pore diameter and porosity of the porous ceramic plate, but the present invention is not limited to these numerical values. For example, an optimal porosity is desirably attained from the relationship between the porosity and the adsorption amount of an evaporated acid, as shown in FIG. 8A.

In the first and second embodiments, the heating apparatus is applied to the PEB processing step. The heating apparatus can also be applied to another step in resist pattern formation, e.g., the heating processing step after formation of a coating film.

(Third Embodiment)

A heating apparatus and a substrate processing method using the same according to the third embodiment of the present invention will be described with reference to FIG. 9. A description of the same part as in the first embodiment will be omitted, and only a difference will be described. The third embodiment uses an adsorption member to adsorb an evaporated substance.

Figure 9:
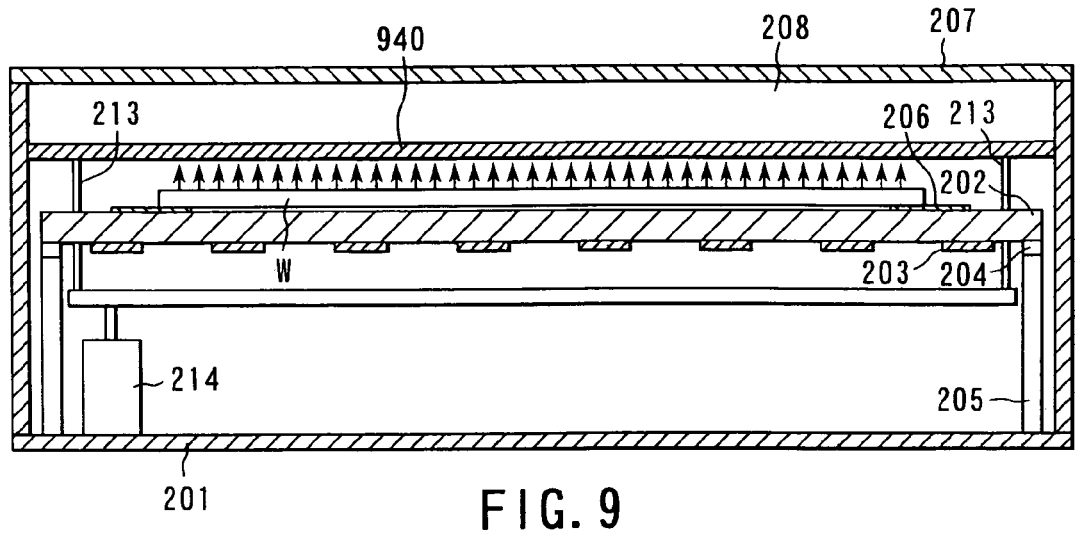
FIG. 9 is a sectional view schematically showing a heating apparatus according to the third embodiment of the present invention.

FIG. 9 is a sectional view schematically showing the heating apparatus according to the third embodiment.

An adsorption member 940 is installed above a hot plate 202 in a chamber 208 so as to face the hot plate 202. The distance between the adsorption member 940 and the hot plate 202 is 0.5 mm. The adsorption member 940 is supported by a plurality of support pins 213.

As the adsorption member 940, a surface-polished single-crystal silicon plate is adopted. The adsorption member 940 may be made of an oxide such as ceramics, alumina, or silica, or a nitride. Alternatively, the surface of such a member may be coated with an oxide or nitride film.

A substance evaporated from a wafer W during heating processing is adsorbed by the surface of the adsorption member 940 set near the wafer W.

PEB processing and resist pattern formation using the heating apparatus will be explained.

Up to exposure, processing is the same as that of the first embodiment. By exposure, exposure chips identical to those of the first embodiment are transferred in an array of 11 (vertical)×13 (horizontal) on the wafer W to form a latent image.

After exposure, the wafer W is transferred to the heating apparatus of the third embodiment, and set above the hot plate 202 at an interval of 0.1 mm. Then, the wafer W undergoes PEB processing at 140° C. for 90 sec. After PEB processing, the wafer W undergoes the same processing as that of the first embodiment to form a resist pattern.

FIG. 6 is a view showing the in-plane distribution of the quality of a pattern transfer result attained by using the heating apparatus according to the third embodiment. No NG exposure chip is observed within the plane of the wafer W, and a good pattern transfer result is obtained.

Figure 8B:
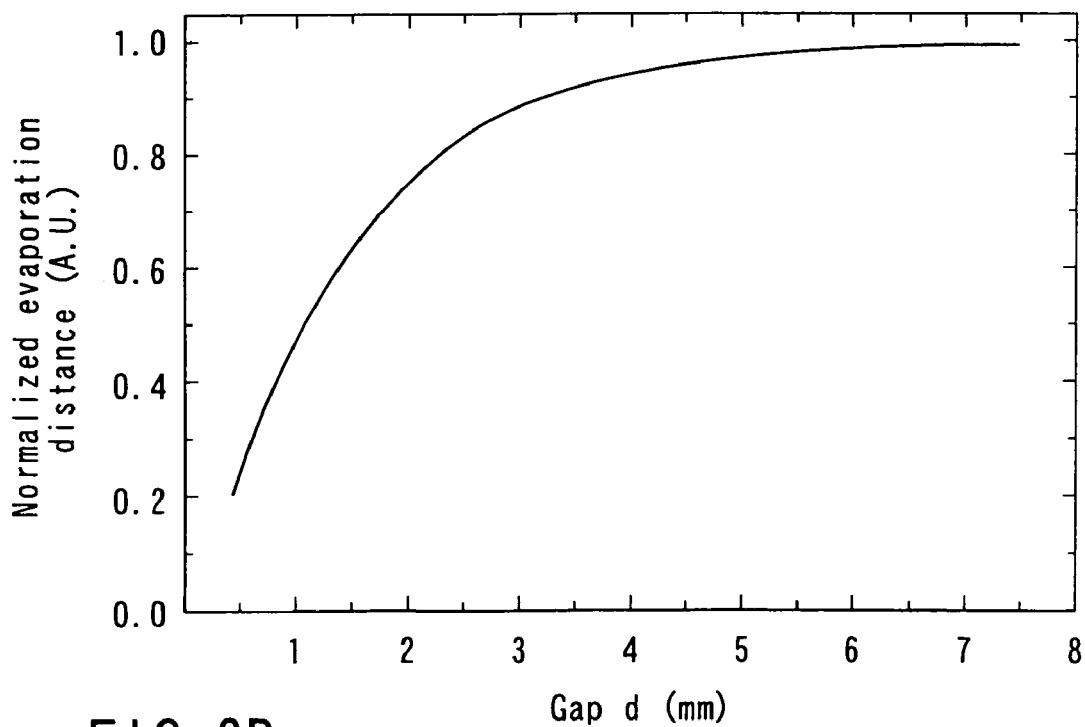
FIG. 8B is a graph showing the relationship between the distance (gap) between an adsorption plate and a hot plate, and the evaporation distance of acids.

In the third embodiment, the distance (gap) between the hot plate and the adsorption member is 0.5 mm because of the following reason. FIG. 8B is a graph showing the relationship between a gap d between the adsorption member and the hot plate, and the spread distance (normalized for a gap of 7.5 mm) of evaporated and adsorbed acids to the resist surface. As the gap becomes smaller, the acid spread distance becomes shorter. However, the gap must be controlled with high precision (evaporation distance varies within the plane of the wafer W). Considering this, the gap is set to 0.5 mm which can be relatively easily controlled.

According to the third embodiment, acids evaporated from a resist film are adsorbed by the adsorption member 940 in the PEB processing step, and is not adsorbed to the wafer W again. The uniformity of the resist width within the plane of the wafer W can be improved without causing variations in effective exposure dose by adsorption to the evaporated acids on the wafer W. Since PEB processing can be performed under optimal temperature conditions in the PEB processing step, the original resist performance such as the margin of the exposure dose of focus can be fully exploited.

(Fourth Embodiment)

A heating apparatus and a substrate processing method using the same according to the fourth embodiment of the present invention will be described with reference to FIG. 10. A description of the same part as in the second and third embodiments will be omitted, and only a difference will be described. The fourth embodiment is different from the third embodiment in the heating means.

Figure 10:
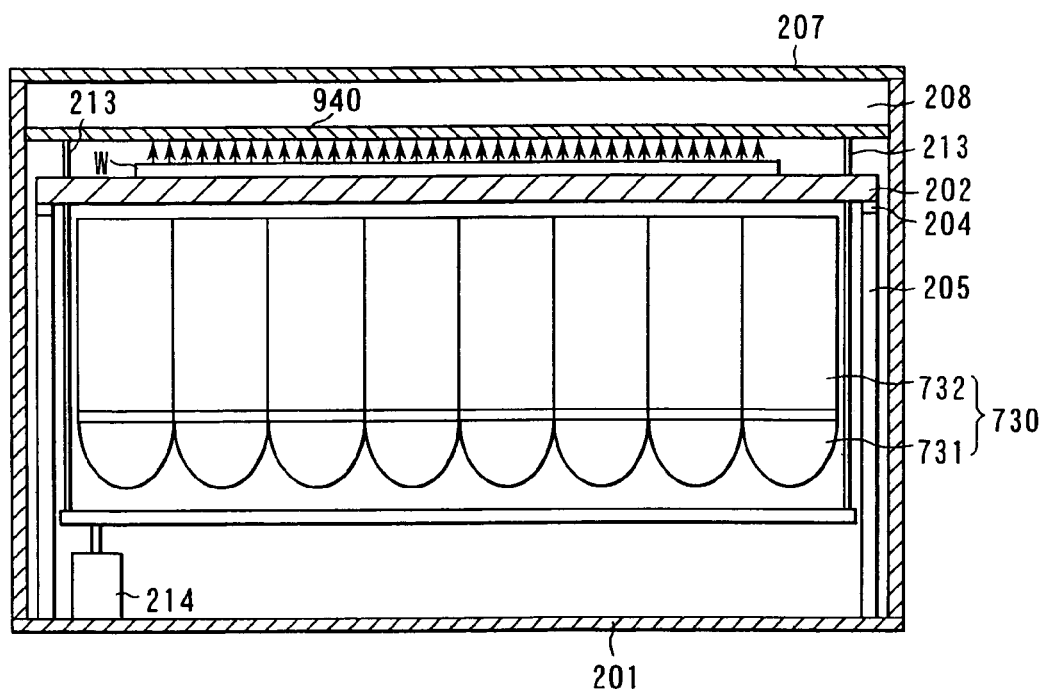
FIG. 10 is a sectional view schematically showing a heating apparatus according to the fourth embodiment of the present invention.

FIG. 10 is a sectional view schematically showing the heating apparatus according to the fourth embodiment.

An adsorption member 940 is installed above a hot plate 202 in a chamber 208 so as to face the hot plate 202. The distance between the adsorption member 940 and the hot plate 202 is 0.5 mm.

A substance evaporated from a wafer W during heating processing is adsorbed by the surface of the adsorption member 940 set near the wafer W.

PEB processing and resist pattern formation using the heating apparatus will be explained.

Up to exposure, processing is the same as that of the second embodiment. By exposure, exposure chips including 130-nm line & space patterns are transferred in an array of 11 (vertical)×13 (horizontal) on the wafer W to form a latent image, as shown in FIG. 5.

After exposure, the wafer W is transferred to the heating apparatus of the fourth embodiment, and set on the hot plate 202. The wafer W undergoes PEB processing at 140° C. for 90 sec. After PEB processing, the wafer W undergoes the same processing as that of the first embodiment to form a resist pattern.

The fourth embodiment achieved the following results of measuring the resist line width within the plane of the wafer W after developing. In-plane width variations between the 130-nm line & space patterns were reduced to 4.1 nm, which is much smaller than 9.5 nm (3σ) in PEB processing by the conventional heating apparatus.

In the third and fourth embodiments, a heater may be arranged on the lower surface of a single-crystal silicon plate serving as an adsorption member. The heater heats the single-crystal silicon plate after the wafer W is extracted from the heating apparatus. This heating may also be applied to eliminate adsorbed acids and clean the surface of the single-crystal silicon plate. In this case, intake and discharge holes are desirably formed in the side surface of the chamber to discharge the eliminated acids.

In the third and fourth embodiments, the heating apparatus is applied to the PEB processing step. The heating apparatus can also be applied to another step in resist pattern formation, e.g., the heating processing step after formation of a coating film.

(Fifth Embodiment)

A heating apparatus and a substrate processing method using the same according to the fifth embodiment of the present invention will be described with reference to FIG. 11. A description of the same part as in the first embodiment will be omitted, and only a difference will be described. In the fifth embodiment, the heating apparatus is applied to a heating processing step before an energy radiation is emitted, e.g., to the pre-bake step after the resist coating step.

Figure 11:
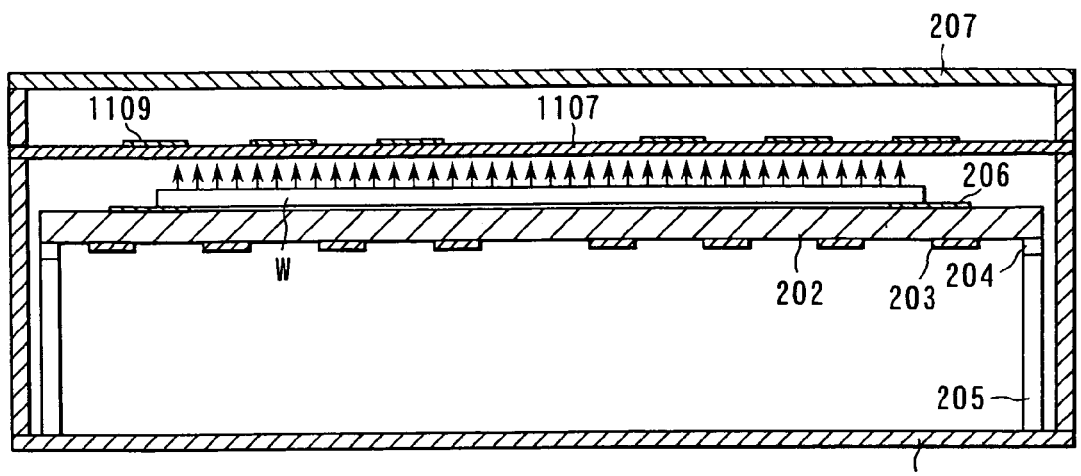
FIG. 11 is a sectional view schematically showing a heating apparatus according to the fifth embodiment of the present invention.

FIG. 11 is a sectional view schematically showing the heating apparatus according to the fifth embodiment.

In the fifth embodiment, the proximity gap between a hot plate 202 and a wafer W is 0.5 mm.

The hot plate 202, a housing 201, and a top plate 207 constitute a chamber 208. A proximity plate 1107 is installed above the hot plate 202 in the chamber 208 so as to face the hot plate 202. The distance between the proximity plate 1107 and the hot plate 202 is 2.0 mm.

A heater 1109 for heating the proximity plate is concentrically set on the proximity plate 1107. The heater 1109 is controlled by a temperature sensor and temperature control unit (neither is shown). By controlling the heater 1109, the temperature of the proximity plate 1107 is controlled. A surface of the proximity plate 1107 that faces the wafer W is planished.

The proximity plate 1107 is made of aluminum. The proximity plate 1107 may be formed from, e.g., SUS which is easy to process and has high thermal conductivity. A heat dissipation unit (not shown) for promoting heat dissipation can be disposed on the surface of the proximity plate 1107. The heat dissipation unit enables higher-precision temperature control.

A substrate processing method using the heating apparatus will be described. A liquid film made of a solid resist component and solvent is formed on a wafer W. Formation of the liquid film adopts meniscus coating utilizing the capillary phenomenon disclosed in Jpn. Pat. KOKAI Publication No. 7-163929. Alternatively, the liquid film may be formed by a coating method disclosed in Jpn. Pat. KOKAI Publication No. 2000-188251 in which a very thin nozzle is reciprocated on a substrate to be processed. The embodiment of the present invention does not depend on the coating method and can employ any method of forming a solid film from a liquid film state. The embodiment can also be applied to formation of a solid film other than formation of a resist film.

The wafer W is transferred to the heating processing apparatus of the fifth embodiment. The wafer W is heated while the temperature of the hot plate 202 is so controlled as to heat the wafer W to 140° C. In the fifth embodiment, the temperature of the proximity plate 1107 is controlled to, e.g., 100° C. After heating processing for 180 sec, the wafer W is transferred to a cooling apparatus where it is cooled to almost room temperature. Accordingly, a 300-nm thick solid resist film is formed.

By heating the proximity plate 1107, the solvent as an evaporated substance is prevented from liquefying (condensation) on the proximity plate.

If condensation of the evaporated substance occurs on the proximity plate, this contaminates the heating apparatus. Falling droplets dissolve the solid film to degrade the film thickness distribution. The heating processing apparatus of the fifth embodiment can solve these problems and form a solid film excellent in film thickness uniformity.

The temperature of the proximity plate is controlled to 100° C. in the fifth embodiment, but is not limited to this. It is important to control the proximity plate to a temperature at which an evaporated substance does not liquefy in accordance with a liquid film to be heated.

A discharge means may be arranged in the heating processing apparatus to discharge air during heating processing as far as the film thickness distribution of a solid film to be formed is not adversely affected.

(Sixth Embodiment)

A heating apparatus and a substrate processing method using the same according to the sixth embodiment of the present invention will be described with reference to FIGS. 12 and 13. A description of the same part as in the first embodiment will be omitted, and only a difference will be described. The sixth embodiment employs a plate member with a cooling means as the top plate of a chamber.

Figure 12:
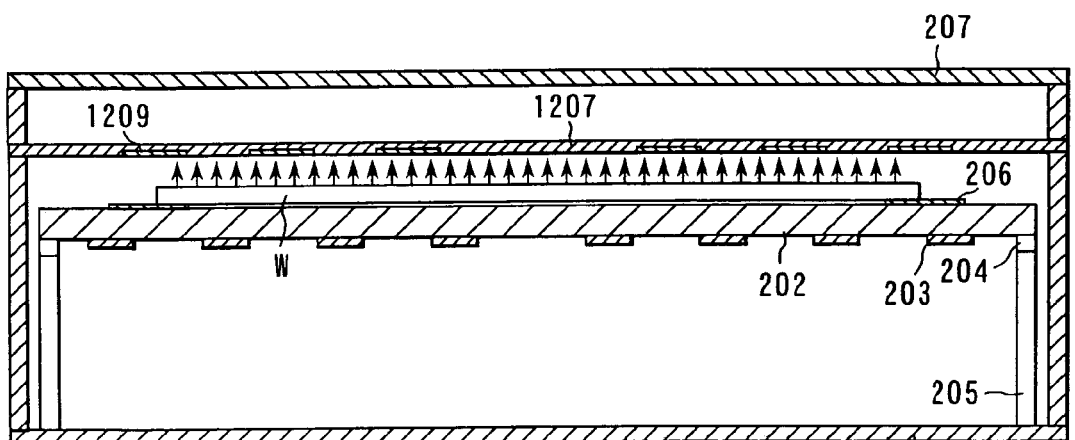
FIG. 12 is a sectional view schematically showing a heating apparatus according to the sixth embodiment of the present invention.
Figure 13:
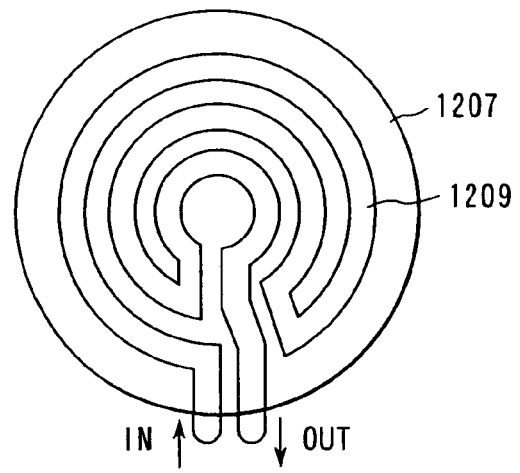
FIG. 13 is a plan view showing a plate member.

FIG. 12 is a sectional view schematically showing the heating apparatus according to the sixth embodiment of the present invention.

An aluminum plate member 1207 is set above a hot plate 202. The hot plate 202, a housing 201, and the plate member 1207 constitute a chamber 208.

The plate member 1207 is installed above the hot plate 202 in the chamber 208 so as to face the hot plate 202. The distance between the plate member 1207 and the hot plate 202 is 0.8 mm.

Details of the plate member 1207 will be described with reference to FIG. 13. FIG. 13 is a plan view schematically showing the plate member 1207. A water distributing pipe 1209 is formed inside the plate member 1207. Circulating cooling water flows from "IN" to "OUT" through the plate member 1207. The temperature of the plate member 1207 is controlled by a thermocouple (not shown) disposed on the plate member 1207 so as to be always set around room temperature. A surface of the plate member 1207 that faces the wafer W is planished.

The plate member 1207 is made of aluminum. The plate member 1207 may be formed from, e.g., SUS which is easy to process and has high thermal conductivity.

PEB processing using the heating apparatus will be explained.

Similar to the first embodiment, a 85-nm thick antireflection film is formed on a wafer W. After a positive chemically amplified resist is applied onto the wafer W, the wafer W is pre-baked at 100° C. for 90 sec. As a result, a 300-nm thick resist film is formed on the antireflection film.

After pre-bake, the wafer W is cooled to room temperature. The wafer W is transferred to an exposure apparatus using an ArF excimer laser with a wavelength of 193 nm as a light source. In the exposure apparatus, an exposure region including a 110-nm line & space pattern is transferred in an array of 13 (vertical)×15 (horizontal) on the wafer W via an exposure mask to form a latent image.

After exposure, the wafer W is transferred to the heating apparatus of the sixth embodiment, and set above the hot plate 202 at an interval of 0.1 mm. A substance evaporated from the wafer W during heating processing is adsorbed by the surface of the plate member 1207. The wafer W undergoes PEB processing at 110° C. for 90 sec. After PEB processing, the wafer W undergoes the same processing as that of the first embodiment to form a resist pattern.

The resist line size (width) was measured within the wafer plane after developing. As a result, in-plane width variations between the 110-nm line & space patterns were substantially halved in comparison with those obtained by using the conventional PEB processing apparatus.

According to the sixth embodiment, acids evaporated from a resist film are adsorbed by the plate member 1207 in the PEB processing step, and are not adsorbed to the wafer W again. The uniformity of the resist width within the plane of the wafer W can be improved without causing variations in effective exposure dose by adsorption of the evaporated acid to the wafer W.

(Seventh Embodiment)

A heating apparatus and a substrate processing method using the same according to the seventh embodiment of the present invention will be described with reference to FIG. 14. A description of the same part as in the first embodiment will be omitted, and only a difference will be described. In the seventh embodiment performs heating processing in the presence of an electric field.

Figure 14:
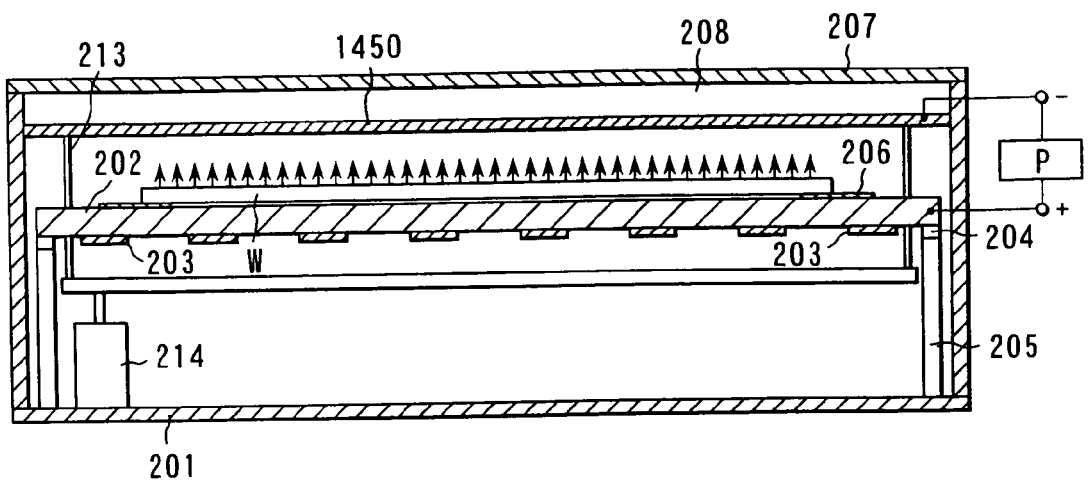
FIG. 14 is a sectional view schematically showing a heating apparatus according to the seventh embodiment of the present invention.

FIG. 14 is a sectional view schematically showing the heating apparatus according to the seventh embodiment.

An electrode member 1450 is installed above a hot plate 202 in a chamber 208 so as to face the hot plate 202. The distance between the hot plate 202 and the electrode member 1450 is 3.0 mm. The electrode member 1450 is supported by a plurality of support pins 214.

The electrode member 1450 is made of SUS. Alternatively, the electrode member 1450 may be made of a metal or semiconductor as far as the material is resistant to acids and is conductive. A surface of the electrode member 1450 that faces a wafer W may be coated with an insulating film such as an oxide or nitride film.

A power supply P applies a voltage between the hot plate 202 and the electrode member 1450. By this application, a vertical (perpendicular to the sheet surface of FIG. 14) electric field is generated between the hot plate 202 and the electrode member 1450 during heating processing.

In the seventh embodiment, a ground potential is applied to the hot plate 202, whereas a negative potential is applied to the electrode member 1450. This potential relationship suffices to set the electrode member 1450 to be lower in potential than the hot plate 202.

The generated electric field vertically moves a substance, e.g., acids which are evaporated from the wafer W and positively charged. The evaporated substance is adsorbed to the surface of the electrode member 1450. Hence, the acids evaporated from the resist are not adsorbed to the wafer W again.

PEB processing and resist pattern formation using the heating apparatus will be explained.

Up to exposure, processing is the same as that of the first embodiment. By exposure, exposure chips including 130-nm line & space patterns are transferred in an array of 11 (vertical)×13 (horizontal) on the wafer W to form a latent image, as shown in FIG. 5.

After exposure, the wafer W is transferred to the heating apparatus of the seventh embodiment, and set on the hot plate 202. While ground and negative potentials are respectively applied to the hot plate 202 and electrode member 1450, the wafer W undergoes PEB processing at 140° C. for 90 sec. After PEB processing, the wafer W undergoes the same processing as that of the first embodiment to form a resist pattern.

The seventh embodiment achieved the following results of measuring the resist line width within the plane of the wafer W after developing. In-plane width variations between the 140-nm line & space patterns were reduced to 3.8 nm, which is much smaller than 8.4 nm (3σ) in PEB processing by the conventional heating apparatus.

(Eighth Embodiment)

A heating apparatus and a substrate processing method using the same according to the eighth embodiment of the present invention will be described with reference to FIG. 15. A description of the same part as in the second and seventh embodiments will be omitted, and only a difference will be described. The eighth embodiment is different from the seventh embodiment in the heating means.

Figure 15:
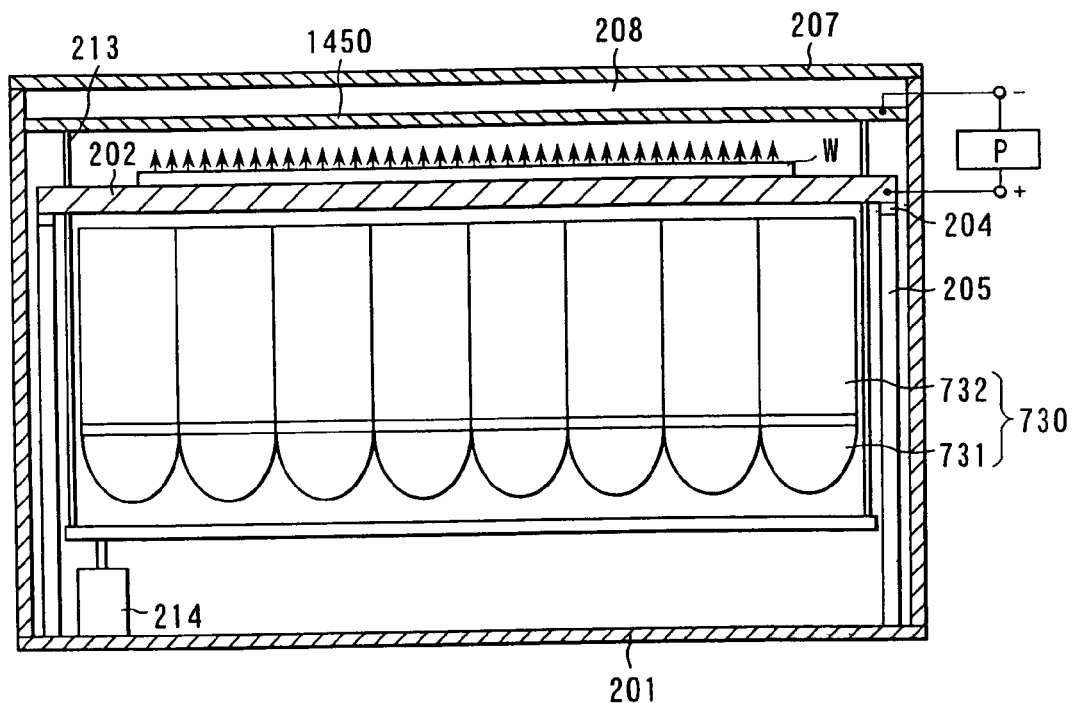
FIG. 15 is a sectional view schematically showing a heating apparatus according to the eighth embodiment of the present invention.

FIG. 15 is a sectional view schematically showing the heating apparatus according to the eighth embodiment.

Similar to the seventh embodiment, a power supply P applies ground and negative potentials to a hot plate 202 and electrode member 1450, respectively. Then, an electric field identical to that of the seventh embodiment is generated.

The generated electric field vertically moves a substance, e.g., acids which are evaporated from a wafer W and positively charged. The evaporated substance is adsorbed to the electrode member 1450. Thus, the acids evaporated from the resist are not adsorbed to the wafer W again.

The same processing as that of the seventh embodiment is performed using the heating apparatus. More specifically, an antireflection film and chemically amplified resist film are formed on a wafer W. Exposure chips including 130-nm line & space patterns are transferred via an exposure mask to form a latent image. The obtained wafer W undergoes PEB processing. In-plane width variations between the 160-nm line & space patterns were reduced to 3.4 nm, which is much smaller than 8.0 nm (3σ) in PEB processing by the conventional heating apparatus.

(Ninth Embodiment)

A heating apparatus and a substrate processing method using the same according to the ninth embodiment of the present invention will be described with reference to FIG. 16. A description of the same part as in the first and seventh embodiments will be omitted, and only a difference will be described. The ninth embodiment is different from the seventh embodiment in the electric field direction.

Figure 16:
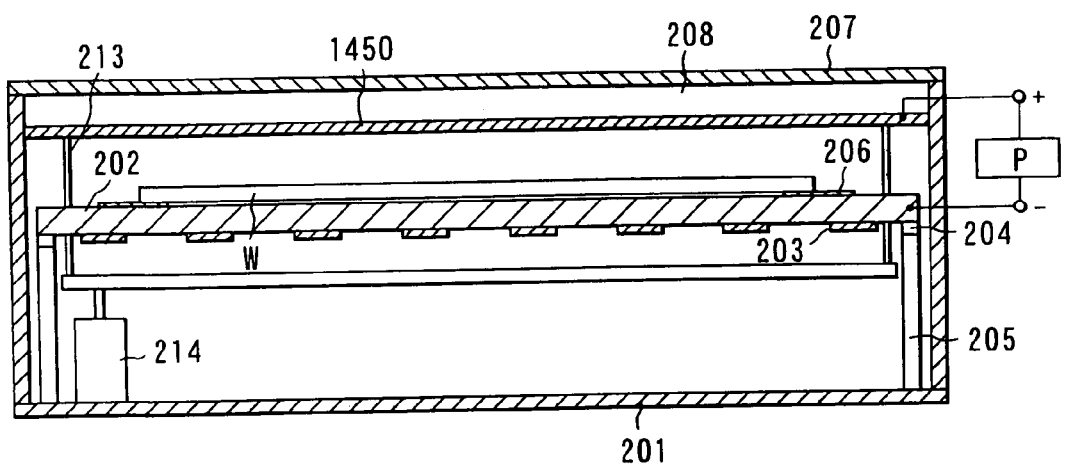
FIG. 16 is a sectional view schematically showing a heating apparatus according to the ninth embodiment of the present invention.

FIG. 16 is a sectional view schematically showing the heating apparatus according to the ninth embodiment.

In the ninth embodiment, opposite to the seventh and eighth embodiments, ground and positive potentials are respectively applied to a hot plate 202 and electrode member 1450. This potential relationship suffices to set the electrode member 1450 to be higher in potential than the hot plate 202.

Since a substance, e.g., acids evaporated from a wafer W are positively charged, evaporation of the acids from the resist is suppressed by a high potential applied to the electrode member 1450.

The heating apparatus according to the ninth embodiment can easily change the application voltage between the hot plate and the electrode member, can arbitrarily change the field strength, and can easily control suppression of the evaporated acid. Since the evaporated acid can be easily controlled in PEB processing using the heating apparatus of the ninth embodiment, the uniformity of the resist width can be easily controlled.

(10th Embodiment)

A heating apparatus and a substrate processing method using the same according to the 10th embodiment of the present invention will be described with reference to FIG. 17. A description of the same part as in the second and eighth embodiments will be omitted, and only a difference will be described. The 10th embodiment is different from the ninth embodiment in the heating means.

Figure 17:
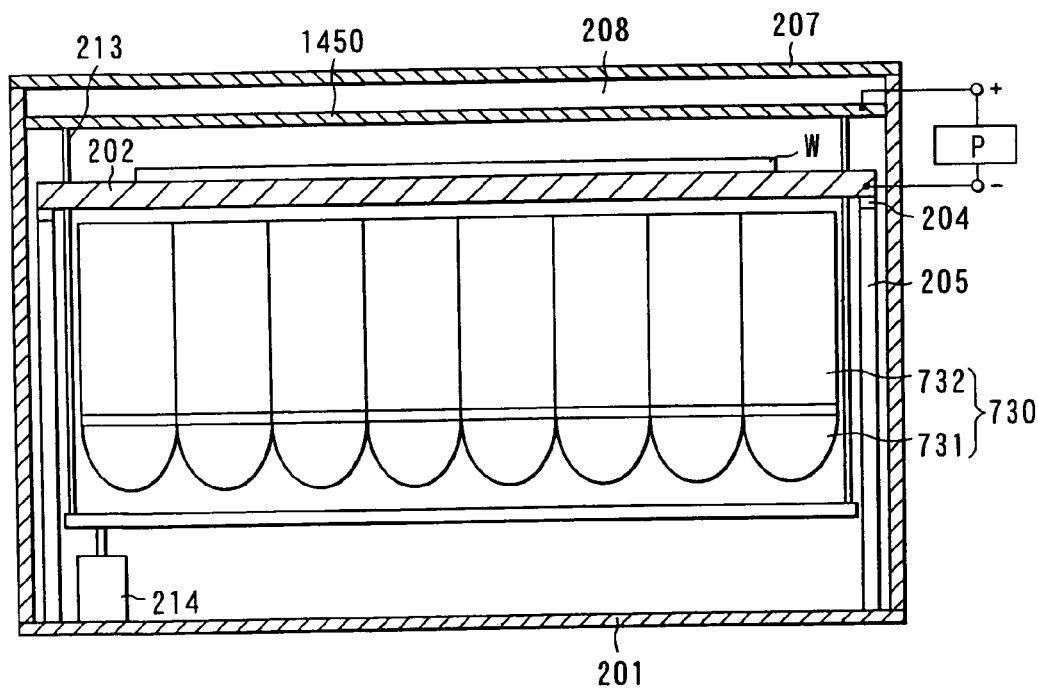
FIG. 17 is a sectional view schematically showing a heating apparatus according to the 10th embodiment of the present invention.

FIG. 17 is a sectional view schematically showing the heating apparatus according to the 10th embodiment.

In the 10th embodiment, opposite to the seventh and eighth embodiments, ground and positive potentials are respectively applied to a hot plate 202 and electrode member 1450. This potential relationship suffices to set the electrode member 1450 to be higher in potential than the hot plate 202.

Since a substance, e.g., acids evaporated from a wafer W are positively charged, evaporation of the acids from the resist is suppressed by a high potential applied to the electrode member 1450.

The heating apparatus according to the 10th embodiment can easily change the application voltage between the hot plate and the electrode member, arbitrarily change the field strength, and easily control suppression of the evaporated acid. Since the evaporated acid can be easily controlled in PEB processing using the heating apparatus of the 10th embodiment, the uniformity of the resist width can be easily controlled.

In the seventh to 10th embodiments, the surface of the electrode member may be cleaned by eliminating acids adsorbed by applying a positive potential to the electrode member after a wafer is extracted from the heating apparatus upon the end of heating processing. In this case, intake and discharge holes are desirably formed in the side surface of the chamber to discharge the eliminated acids.

In the first to fourth, seventh to 10th embodiments, the heating apparatus is applied to the PEB processing step. The heating apparatus can also be applied to another step in resist pattern formation, e.g., the heating processing step after formation of a coating film. This application brings the same effects as in the sixth embodiment.

(11th Embodiment)

A substrate processing method according to the 11th embodiment of the present invention will be described with reference to the several views of the accompanying drawing.

In the 11th embodiment, the exposure dose condition of each exposure chip is set in accordance with each exposure chip in the exposure step. Exposure conditions are closely related to the PEB processing step executed after the exposure step. The PEB processing step is performed by, e.g., the conventional heating apparatus shown in FIG. 65.

Up to pre-bake, processing is the same as that of the first embodiment. Similar to the first embodiment, exposure chips including 150-nm line & space patterns are transferred by exposure in an array of 11 (vertical)×13 (horizontal) on a wafer W to form a latent image. Exposure conditions are set as follows.

Figure 18:
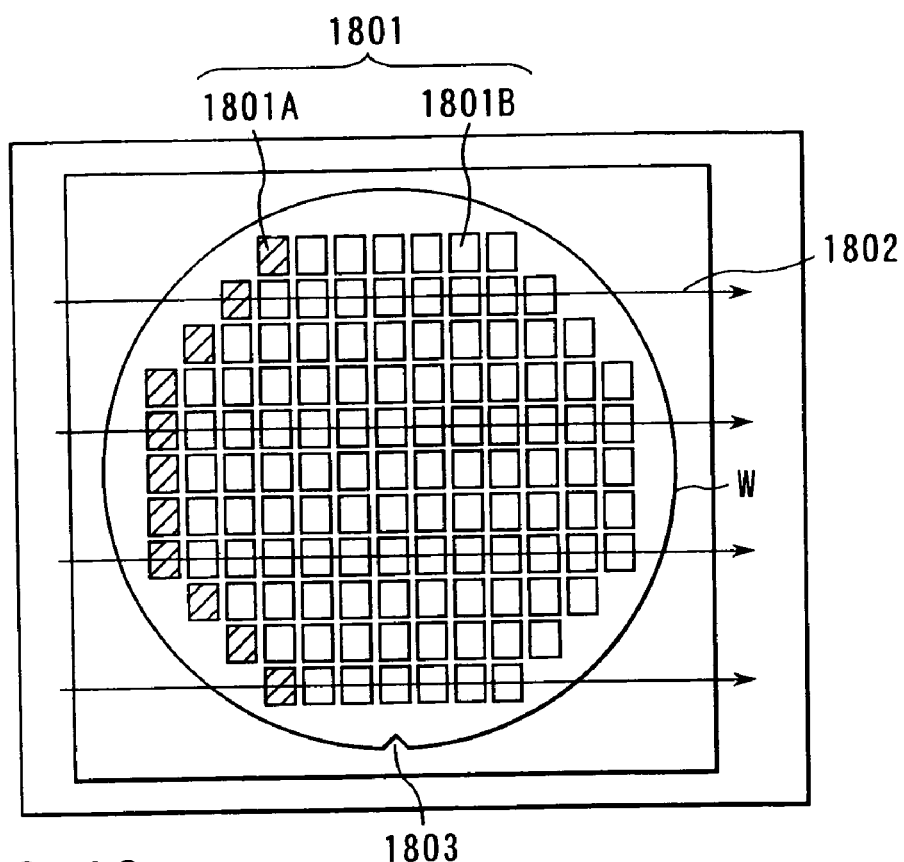
FIG. 18 is a plan view showing the positional relationship between the air stream direction in PEB and each exposure chip.

FIG. 18 shows the positional relationship between each exposure chip 1801 in the PEB processing step and the direction of an air stream 1802 during PEB processing.

In FIG. 18, the exposure chips 1801 on the wafer W are classified into uppermost-stream exposure chips 1801A at the uppermost stream of the air stream 1802 during PEB processing, and downstream exposure chips 1801B at the downstream of the air stream 1802. The exposure chips are classified in this fashion because the upstream exposure dose is smaller than the downstream exposure dose due to the above-described reason. Reference numeral 1803 denotes a notch.

In the 11th embodiment, the effective exposure dose is adjusted to be equal between the uppermost-stream exposure chips 1801A and the downstream exposure chips 1801B in the exposure step. That is, the exposure dose of the uppermost-stream exposure chips 1801A is set larger than the exposure dose for the downstream exposure chips 1801B by the following setting method.

Figure 19:
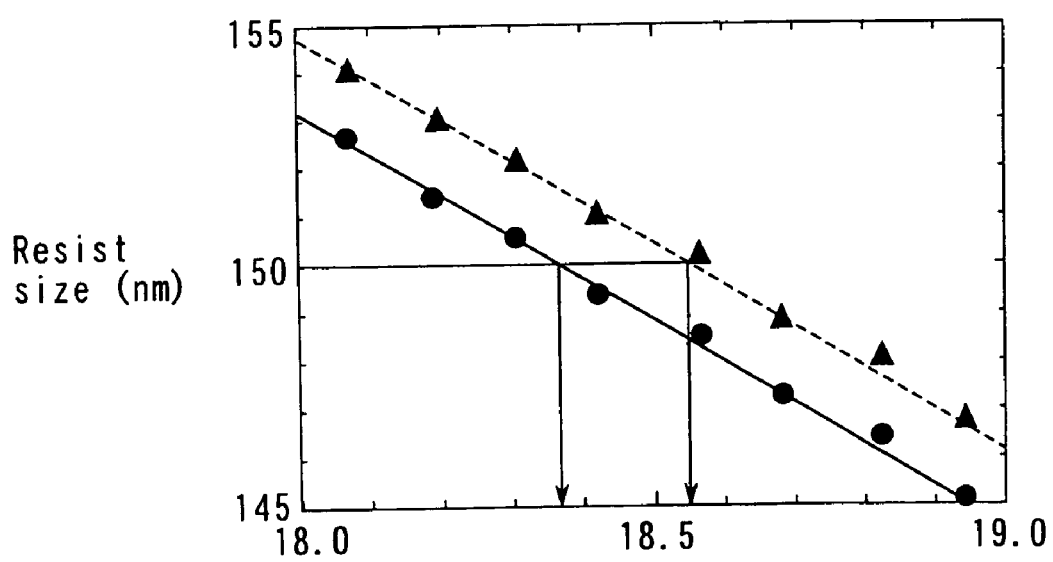
FIG. 19 is a graph showing the relationship between the exposure dose and the resist line width in a substrate processing method according to the 11th embodiment of the present invention.

FIG. 19 is a graph showing the relationship between the exposure dose and the width of a resist line formed through lithography. In FIG. 19, the solid line represents a downstream exposure chips, and the broken line represents an uppermost-stream exposure chips.

An exposure dose condition for a desired resist line width of 150 nm is obtained from FIG. 19 to find that the exposure dose is 18.55 mJ/cm$^2$ for the uppermost-stream exposure chips 1801A and 18.36 mJ/cm$^2$ for the downstream exposure chips 1801B.

By obtaining the relationship between the exposure dose and the finished resist line width in advance, an optimum exposure dose condition can be determined for each exposure chip 1801.

The uppermost-stream exposure chips 1801A and downstream exposure chips 1801B are exposed under different exposure dose conditions. After the exposure step, rotation correction is so executed as to make the notch 1803 of the wafer W be always in the same direction, e.g., downward in the exposure and PEB processing steps. Thereafter, the wafer W is transferred to the above-described heating apparatus where the wafer W is subjected to PEB processing at 140° C. for 90 sec. After PEB processing, the wafer W undergoes the same processing as that of the first embodiment to form a resist pattern.

The results of measuring the resist line width 20, within the plane of the wafer W after developing are as follows. In-plane width variations between 150-nm line & space patterns were reduced to 5.4 nm, which is much smaller than 11.6 nm (3σ) obtained when the exposure dose condition is not corrected.

The 11th embodiment has exemplified the use of one PEB heating apparatus. A plurality of wafers W can also be successively processed by using a plurality of PEB heating apparatuses. In this case, each wafer W must undergo rotation correction before PEB processing in accordance with a PEB heating apparatus to which the wafer W is to be transferred. The necessity of this operation will be explained below.

Figure 20:
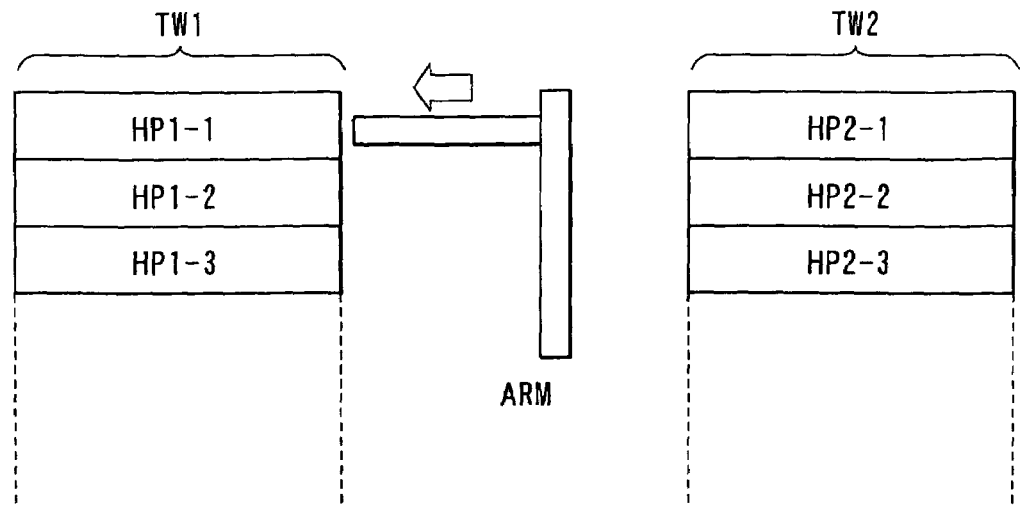
FIG. 20 is a view schematically showing a layout of heating units and the positional relationship with a wafer transfer arm.

FIG. 20 is a view schematically showing heating units in a coater/developer and an arm "ARM" for transferring the wafer W, and showing a state wherein the wafer W is transferred to HP1-1.

In FIG. 20, the heating units are formed from two towers (TW1 and TW2) each prepared by stacking a plurality of heating units in a rack. PEB units are positioned in HP1-1 of TW1 and HP2-1 of TW2. The remaining heating units are used for heating processing of an antireflection film and pre-bake performed immediately after resist coating.

Figure 21:
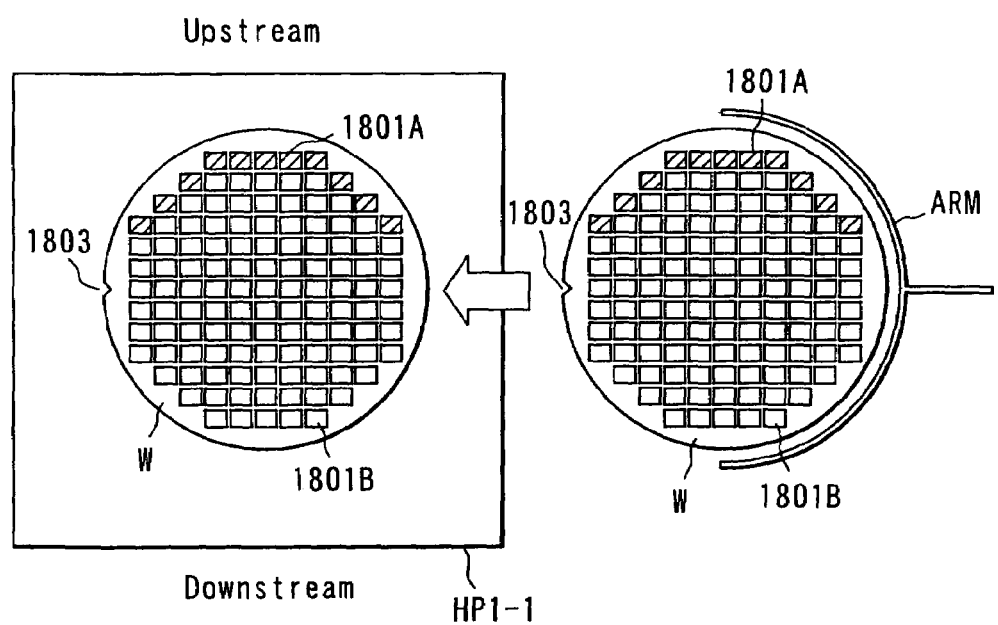
FIG. 21 is a view showing a state wherein a wafer is transferred to a PEB heating apparatus when viewed from above the wafer.

FIG. 21 is a view showing a state wherein the wafer W is transferred to HP1-1 when viewed from above the wafer W. As shown in FIG. 21, the notch 1803 of the wafer W is positioned left. The uppermost-stream exposure chips 1801A is normally positioned at the upstream of the air stream 1802.

Figure 22:
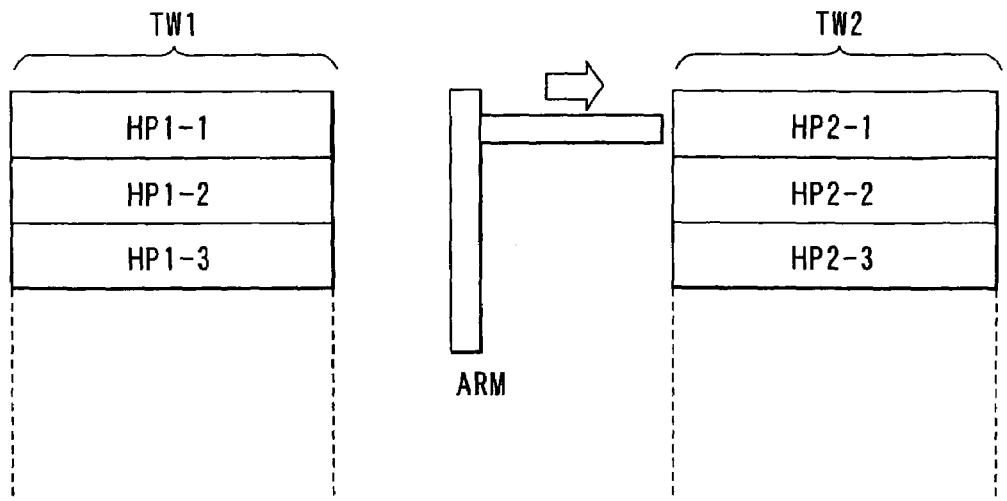
FIG. 22 is a view schematically showing a layout of heating units and the positional relationship with the wafer transfer arm.
Figure 23:
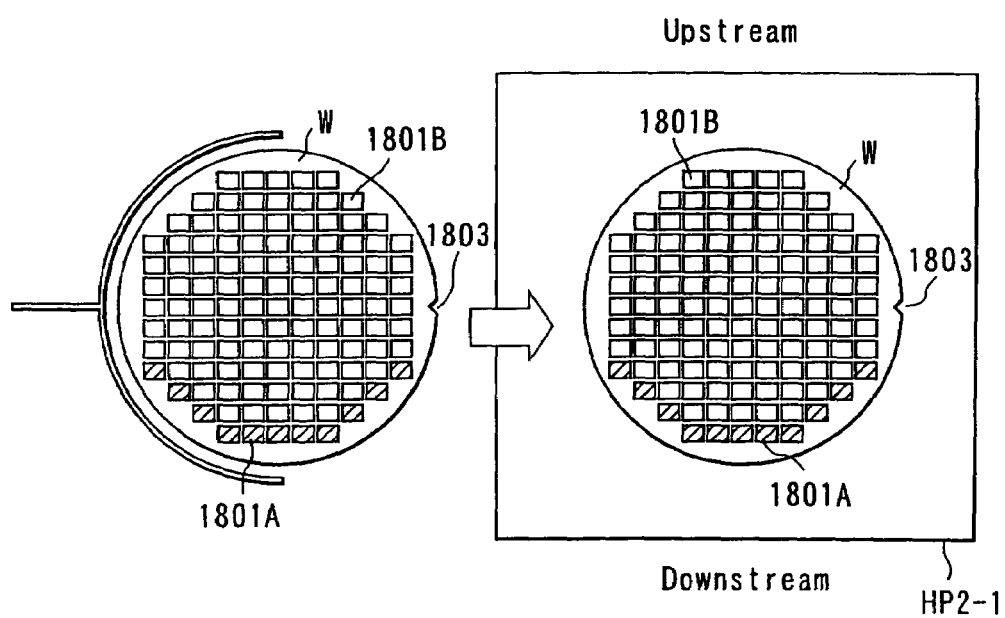
FIG. 23 is a view showing a state wherein a wafer is transferred to the PEB heating apparatus when viewed from above the wafer.
Figure 24:
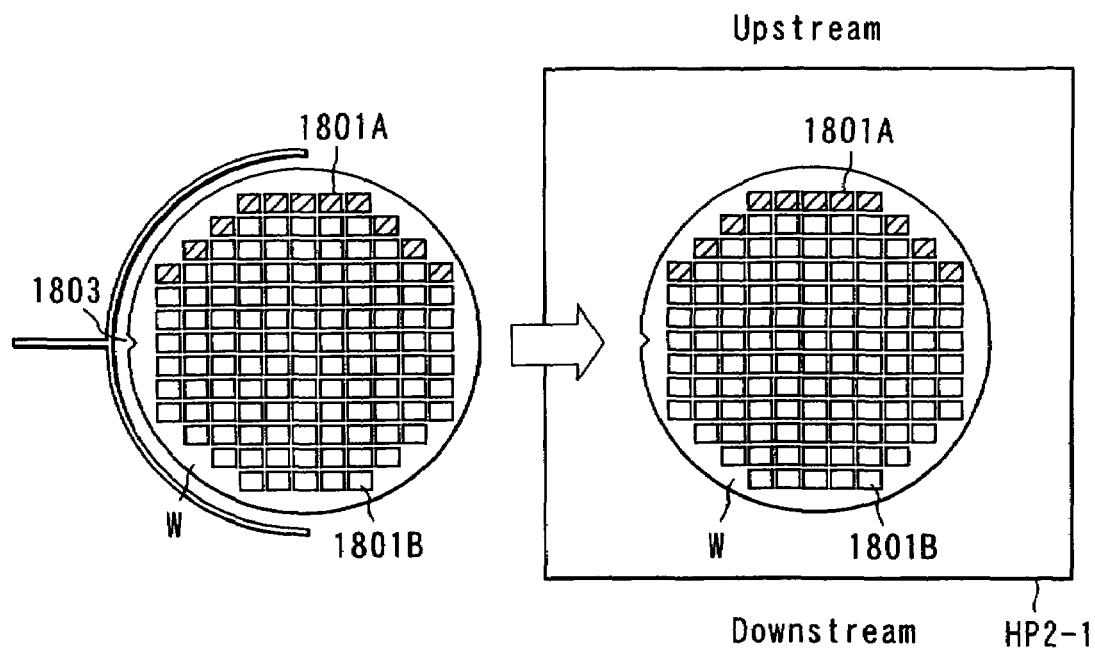
FIG. 24 is a view showing a state wherein a wafer is transferred to the PEB heating apparatus when viewed from above the wafer.

A state wherein the wafer W is to be transferred to HP2-1 will be explained with reference to FIGS. 22 and 23. As shown in FIG. 22, the relative positional relationship between the notch 1803 of the wafer W and the arm "ARM" does not change. Thus, the notch 1803 of the wafer W is positioned right in FIG. 22 in transferring the wafer W to HP2-1. As a result, the uppermost-stream exposure chips 1801A is positioned at the downstream of the air stream 1802. That is, the positional relationship of the uppermost-stream exposure chip to the air stream 1802 is rotated through 180° between transfer to HP1-1 and transfer to HP2-1. For this reason, when the wafer W is to be transferred to HP2-1, rotation correction must be performed before transfer.

When a plurality of wafers W are successively processed using a plurality of PEB heating apparatuses with the same apparatus structure, each wafer W must undergo rotation correction in accordance with a PEB unit to which the wafer W is to be transferred before being transferred to the PEB heating apparatus.

The wafer W may be exposed by setting uppermost-stream and downstream exposure chips for each wafer W without any rotation correction. In this case, the step becomes complicated and is not practical.

The 11th embodiment has exemplified a 150-nm line & space pattern. However, the present invention is not limited to this and can be applied to other patterns such as hole pattern.

(12th Embodiment)

A substrate processing method according to the 12th embodiment of the present invention will be described with reference to the several views of the accompanying drawing. In the 12th embodiment, the heating temperature in PEB processing is adjusted in accordance with the exposure chip.

Up to pre-bake, processing is the same as that of the first embodiment. By exposure, exposure chips including 140-nm line & space patterns are transferred in an array of 11 (vertical)×13 (horizontal) on a wafer W to form a latent image. In the 12th embodiment, the exposure dose condition is the same among all the exposure chips.

After exposure, rotation correction is so executed as to make a notch 1803 of the wafer W shown in FIG. 18 be always in the same direction, e.g., downward in the exposure and PEB processing steps. The wafer W is transferred to the above-described heating apparatus where the wafer W is subjected to PEB processing. Heating conditions are determined by the following procedures.

Figure 25:
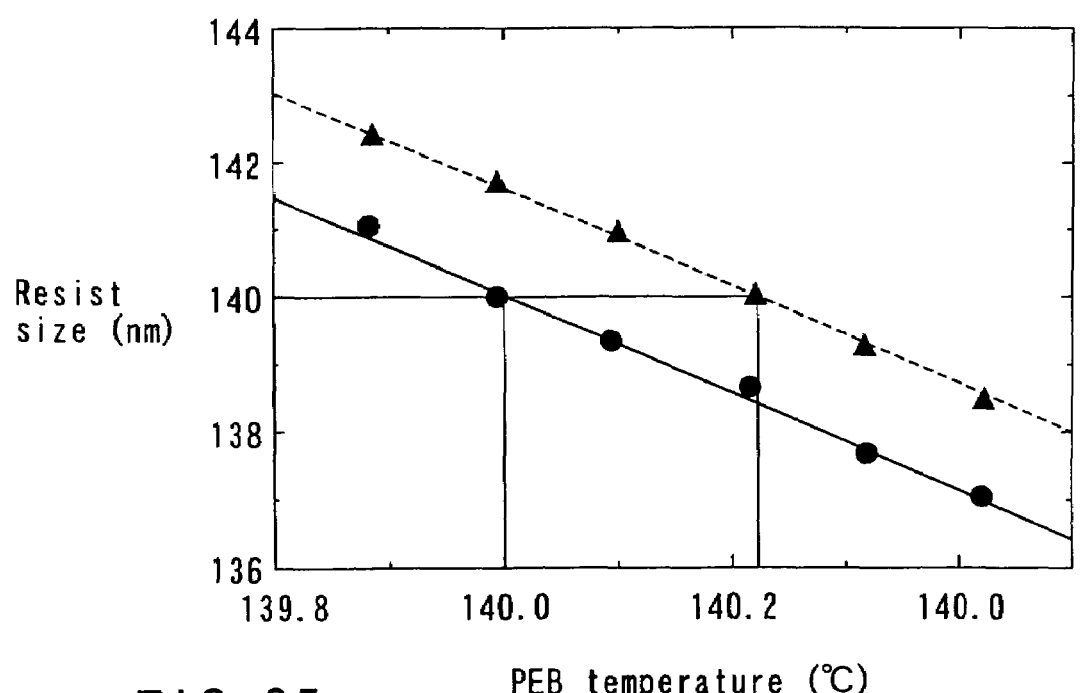
FIG. 25 is a graph showing the PEB processing temperature and the resist line width in a resist pattern formation method according to the 12th embodiment of the present invention.

FIG. 25 shows the relationship between the PEB processing temperature and the resist line width after developing. The solid line represents a downstream exposure chips, and the broken line represents an uppermost-stream exposure chips.

A PEB temperature condition for a desired resist line width of 140 nm is obtained from FIG. 25 to find that the PEB temperature is 140.23° C. for an uppermost-stream exposure chips 1801A and 140.00° C. for a downstream exposure chips 1801B.

By obtaining the relationship between the PEB processing temperature and the resist line width in advance, an optimum heating processing temperature condition can be determined for each exposure chip 1801.

In the 12th embodiment, heating conditions are set such that the heating temperature of the uppermost-stream exposure chips 1801A is 140.23° C. and that of the downstream exposure chips 1801B is 140.00° C.

As temperature setting, the setting temperature of a split heater corresponding to the region of the uppermost-stream exposure chips 1801A is adjusted higher. In this case, the setting temperature of a downstream heater is desirably adjusted because the upstream heater interferes with the downstream heater. For example, it is desirable to strictly adjust the setting temperature of each split heater by a temperature sensor such as a thermocouple using a plurality of temperature measurement devices buried in the wafer. W.

In this manner, the PEB processing temperature condition is determined, and PEB processing is done for 90 sec. After PEB processing, the wafer W is subjected to the same processing as that of the first embodiment to form a resist pattern.

The results of measuring the line width of a developed resist pattern within the plane of the wafer W are as follows. In-plane width variations between 140-nm isolated line patterns are reduced to 6.1 nm, which is much smaller than 12.3 nm (3σ) obtained when the exposure dose condition is not corrected.

(13th Embodiment)

A substrate processing method according to the 13th embodiment of the present invention will be described with reference to the several views of the accompanying drawing. In the 13th embodiment, correction of the exposure dose within the exposure region is performed within the wafer plane.

Figure 26:
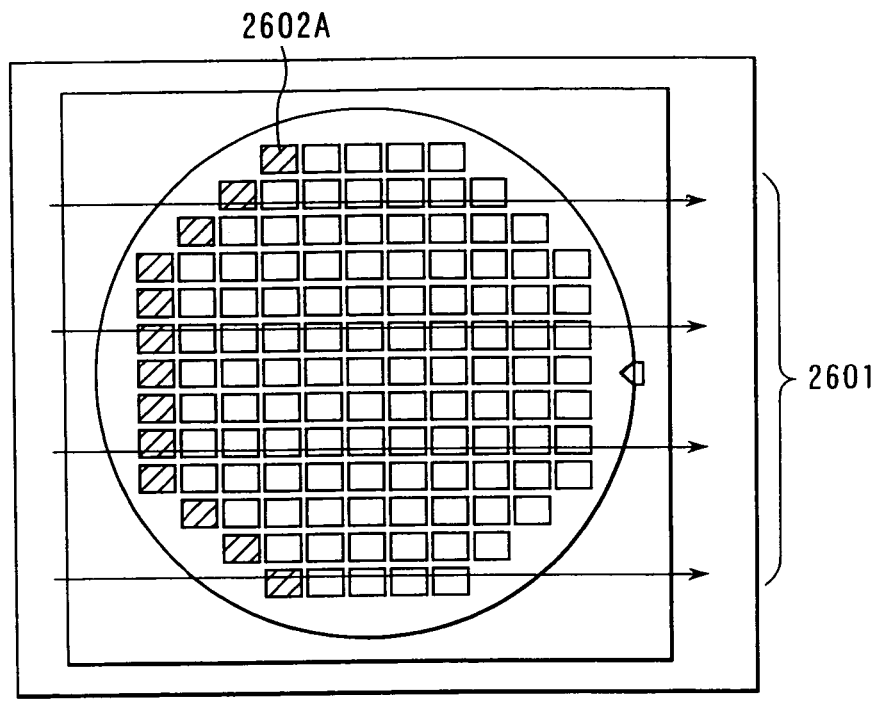
FIG. 26 is a plan view showing the positional relationship between the air stream direction and the exposure chip.

As shown in FIG. 26, only an uppermost-stream exposure region 2602A at the uppermost stream of an air stream 2601 during PEB is exposed and subjected to the PEB and developing steps to form evaluation sample 1. The resist pattern width is evaluated for the uppermost-stream exposure region 2602A on evaluation sample 1, and an exposure dose condition for a desired width is optimized (exposure dose is corrected).

Figure 27:
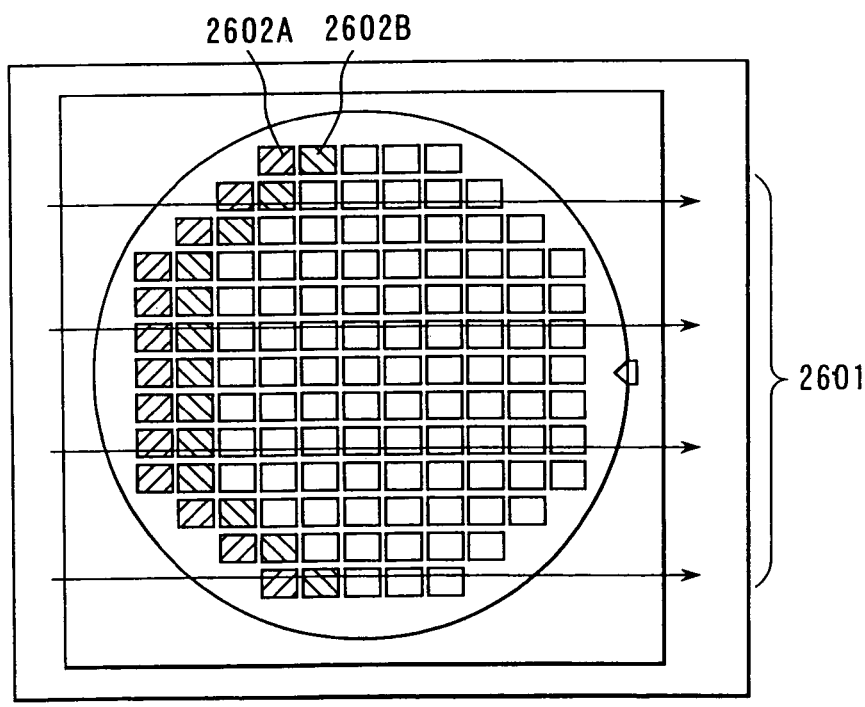
FIG. 27 is a plan view showing the positional relationship between the air stream direction and the exposure chip.

As shown in FIG. 27, the uppermost-stream exposure region 2602A is exposed under the optimized exposure dose condition. Then, an exposure region 2602B downstream by one stage is exposed to similarly form evaluation sample 2. The resist pattern width is evaluated for the exposure region 2602B on evaluation sample 2, and an exposure dose condition for a desired width is optimized (exposure dose is corrected). Such optimization of the exposure dose is executed downstream for all the exposure regions.

Exposure dose correction conditions are sequentially calculated from an exposure region at the upstream of an air stream in PEB to a downstream exposure region. This can realize efficient, high-precision correction.

Exposure regions are formed within a wafer under the obtained exposure dose conditions. The uniformity of the resist pattern width between exposure regions can be greatly improved.

(14th Embodiment)

A substrate processing method according to the 14th embodiment of the present invention will be described with reference to the several views of the accompanying drawing. In the 14th embodiment, the exposure dose is corrected within the exposure region. A detailed description of steps in lithography overlaps those in the 11th and 12th embodiments, and will be omitted.

Figure 28:
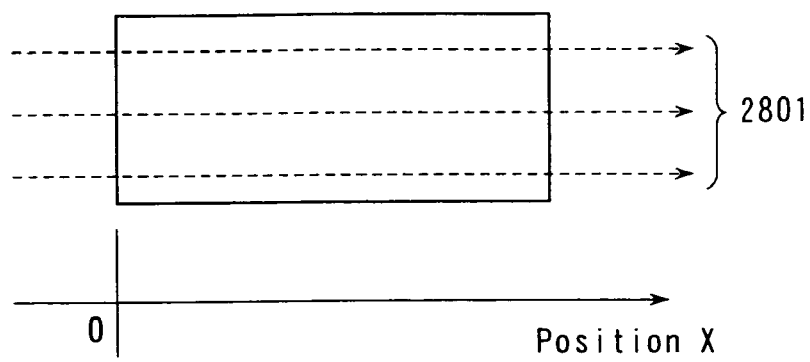
FIG. 28 is a plan view schematically showing the relative positional relationship between the exposure region and the air stream in PEB.

FIG. 28 schematically shows the relative positional relationship between the exposure region and an air stream in PEB. The direction from the upstream to downstream of an air stream 2801 is set as the X-axis, and the uppermost-stream edge of a chip is at X=0.

Figure 29:
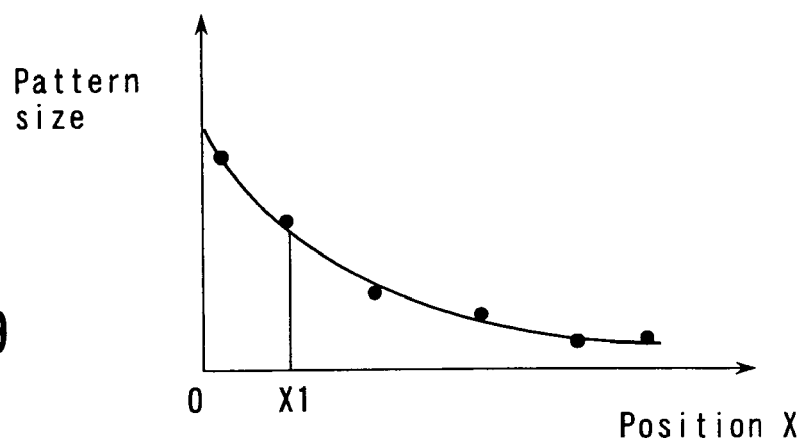
FIG. 29 is a graph schematically showing the relationship between a position X within the chip and the resist pattern width (line width) after developing with an exposure dose D.

FIG. 29 schematically shows the relationship between a position X within the chip and the width (line width) of a developed resist pattern for an exposure dose D. Owing to the above-mentioned reason, the effective exposure dose is smaller at the upstream than the downstream. With the use of a positive resist, the pattern width becomes larger at the upstream. Procedures of calculating an exposure dose to be corrected at the position X within the chip will be explained.

Figure 30:
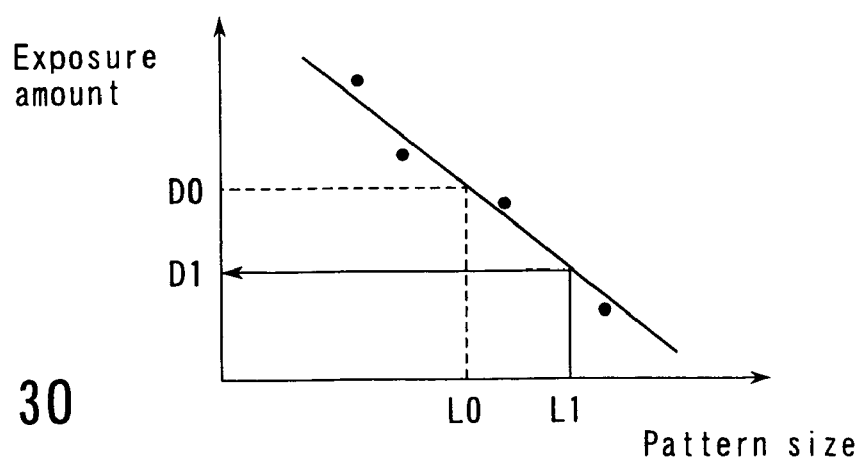
FIG. 30 is a graph showing the relationship between the width of resist pattern and exposure dose near D.
Figure 31:
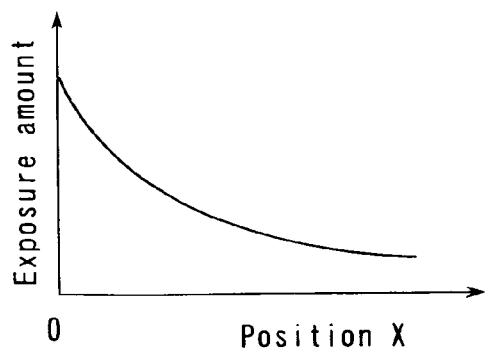
FIG. 31 is a graph schematically showing the relationship between the position X within the chip and the exposure dose.

FIG. 30 shows the relationship between the pattern width and the exposure dose near D. The relationship between the exposure dose and the pattern width is approximated by a linear function based on a pattern width measurement value. For a pattern width L1 at the position X=X1, an exposure dose D1 is calculated from the relationship in FIG. 30. Then, a ratio D1/D0 of the exposure dose D1 to an exposure dose D0 for a desired pattern width L0 is attained. D·(D1/D0) as the product obtained by multiplying D1/D0 by the exposure dose D is an optimal exposure dose at X=X1. By these procedures, an optimal exposure dose for the desired pattern width L0 is obtained at each position X. The results are shown in FIG. 31.

Correction of the exposure dose within the exposure region can be achieved by, e.g., the following method using a step & scan exposure apparatus.

Figure 32:
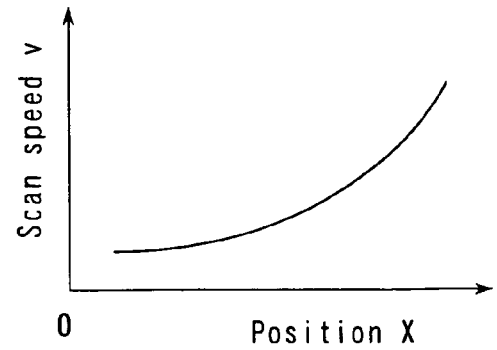
FIG. 32 is a graph schematically showing the relationship between the position X within the chip and the scan speed.

Letting P be the irradiation power of a light source in exposure, v be the scan speed, and s be the slit width of the illumination region, the exposure dose D is proportional to E·(s/v). From this equation, the relationship between the position X within the chip and the scan speed v is attained. The results are shown in FIG. 32. The exposure dose can be corrected by controlling the scan speed v within the exposure region.

Exposure dose correction conditions are calculated under the obtained exposure dose conditions, and exposure regions are formed. Accordingly, the uniformity of the resist pattern width within the exposure region is remarkably improved.

The pattern width simply decreases from the upstream to the downstream in the 14th embodiment, but the present invention is not limited to this. The relationship between the position X within the chip and the resist pattern width after developing must be obtained for each exposure mask, as shown in FIG. 29.

The relationship between the position X within the chip and the resist pattern width after developing changes depending on the position of an exposure region on the wafer. Thus, the relationship is desirably obtained in each exposure region to correct the exposure dose.

The relationship between the exposure dose and the pattern width is approximated by a linear function based on the pattern width measurement value in the 14th embodiment, but the present invention is not limited to this. The same effects can also be attained by approximation by a multi-dimensional function based on the width measurement value.

(15th Embodiment)

A substrate processing method according to the 15th embodiment of the present invention will be described with reference to the several views of the accompanying drawing. In the 15th embodiment, the exposure dose within the exposure region is changed. A detailed description of steps in lithography overlaps those in the 11th and 12th embodiments, and will be omitted.

Figure 33:
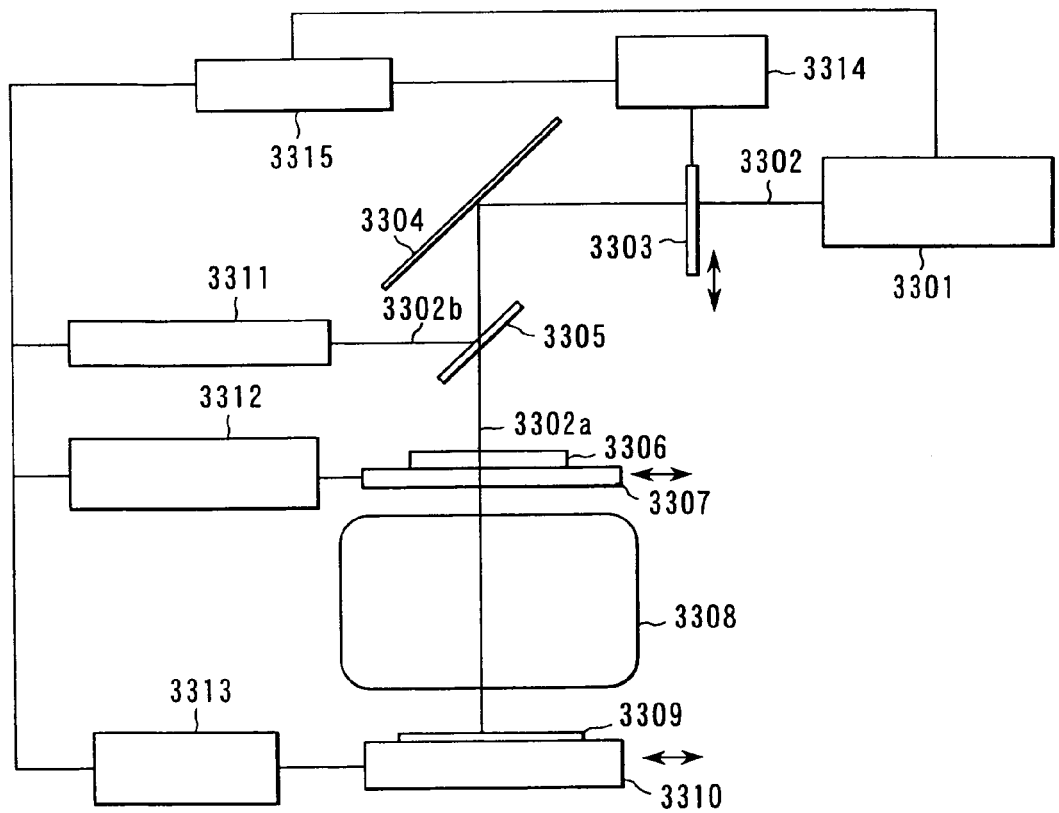
FIG. 33 is a view showing the arrangement of a step & scan projection exposure apparatus.

FIG. 33 shows the arrangement of a step & scan projection exposure apparatus. An illumination system 3301 is comprised of an excimer laser source, beam expander, fly-eye lens, and the like. An illumination beam 3302 emitted by the illumination system 3301 enters a beam splitter 3305 via an ND (Neutral Density) filter 3303 for adjusting the irradiation amount, and a mirror 3304. The incident beam is split into a projection exposure beam 3302a and a beam 3302b for monitoring the exposure dose. The projection exposure beam 3302a enters an exposure mask 3306. The beam having passed through the exposure mask 3306 transfers a pattern onto a wafer 3309 via a reduction projection optical system 3308.

The beam 3302b for monitoring the exposure dose is monitored by an exposure dose monitoring unit 3311. The monitoring result is fed back to the ND filter 3303 via a control unit 3312 and filter control unit 3313. The exposure mask 3306 and wafer 3309 are respectively held by an exposure mask stage 3307 and wafer stage 3310. The exposure mask stage 3307 is controlled by the exposure mask stage control unit 3312. The wafer stage 3310 is controlled by the wafer stage control unit 3313. The ND filter 3303 is controlled by a filter control unit 3314. The wafer stage 3310 and ND filter 3303 are controlled by a control unit 3315 via their control units 3313 and 3314, and scanned in synchronism with each other.

Figure 34:
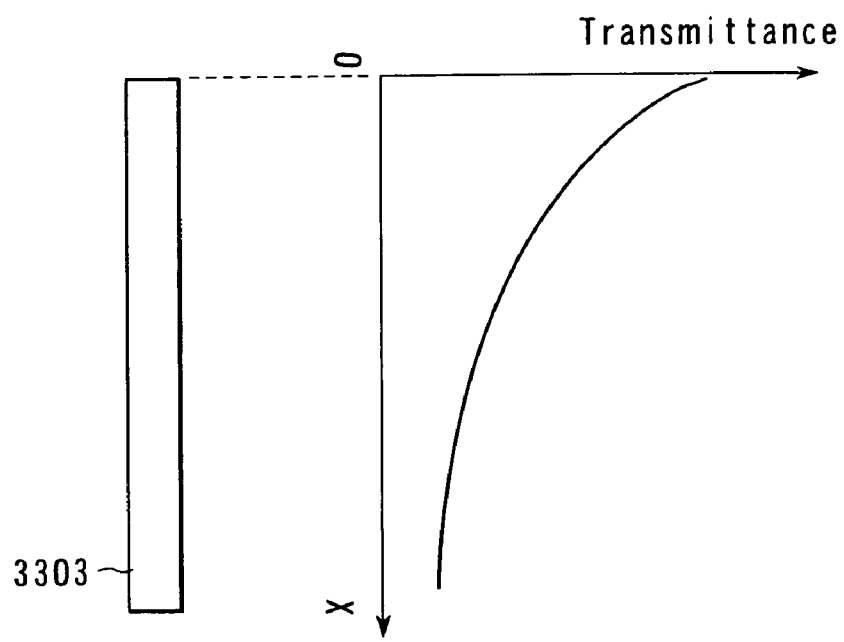
FIG. 34 is a graph schematically showing the transmittance distribution of an ND filter 3303 for adjusting the irradiation amount.

FIG. 34 schematically shows the transmittance distribution of the ND filter 3303. The transmittance distribution is so obtained as to correct variations in effective exposure dose caused by evaporation and absorption of acids in PEB. The ND filter 3303 having the transmittance distribution shown in FIG. 34 is scanned and moved with respect to the illumination beam 3302. This can change the light quantity incident on the exposure mask 3306, as shown in FIG. 31. As a result, the exposure dose can be corrected within the exposure region.

Exposure dose correction conditions were calculated under the obtained exposure dose conditions, and exposure regions are formed to remarkably improve the uniformity of the resist pattern width within the exposure region.

(16th Embodiment)

A substrate processing method according to the 16th embodiment of the present invention will be described with reference to the several views of the accompanying drawing. In the 16th embodiment, the exposure dose is corrected in accordance with a resist pattern ratio in the exposure region.

A coating film as an antireflection film is formed on a wafer W by spin coating. The wafer W is baked at 215° C. for 90 sec to form a 85-nm thick antireflection film.

After a positive chemically amplified resist is applied onto the wafer W, the wafer W is pre-baked at 110° C. for 90 sec. As a result, a 300-nm thick resist film is formed on the antireflection film.

After pre-bake, the wafer W is cooled to room temperature. The wafer W is transferred to a step & scan exposure apparatus using an ArF excimer laser (wavelength: 193 nm) as a light source. An exposure region is transferred onto the wafer W at NA=0.55, σ=0.75, and ε=0.67. The exposure region and a method of forming the exposure region will be explained in detail.

Figure 35:
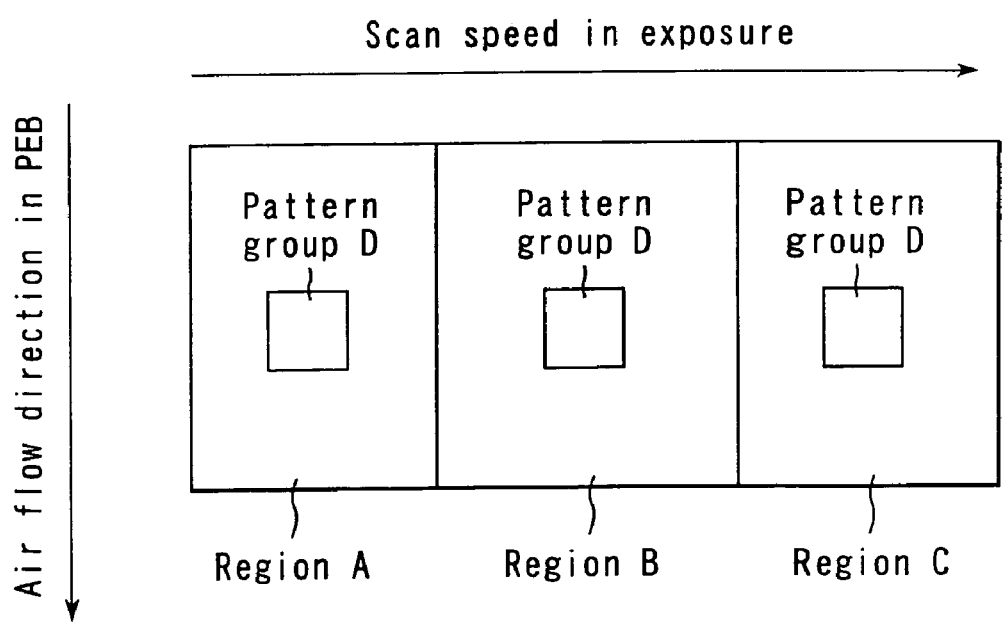
FIG. 35 is a view schematically showing part of the exposure region.

FIG. 35 schematically shows part of the exposure region. In FIG. 35, reference symbol D denotes a 110-nm line & space pattern group which requires the highest width precision within the exposure region. The pattern groups D exist in regions A, B, and C having different resist pattern ratios. The scan direction in exposure is from the left to right in FIG. 35, and the air stream direction in PEB after exposure is from the top to down in FIG. 35. The resist pattern ratio is 60% in the region A, 30% in the region B, and 0% in the region C. The resist pattern ratio represents the ratio of a resist pattern left after pattern formation in percentage.

As described above, the pattern width varies due to adsorption of a substance evaporated during PEB processing to the resist surface.

The adsorption amount differs between regions owing to the difference in resist pattern ratio, and as a result the pattern width varies. To prevent this, the correction exposure dose is calculated by the following procedures.

Figure 36:
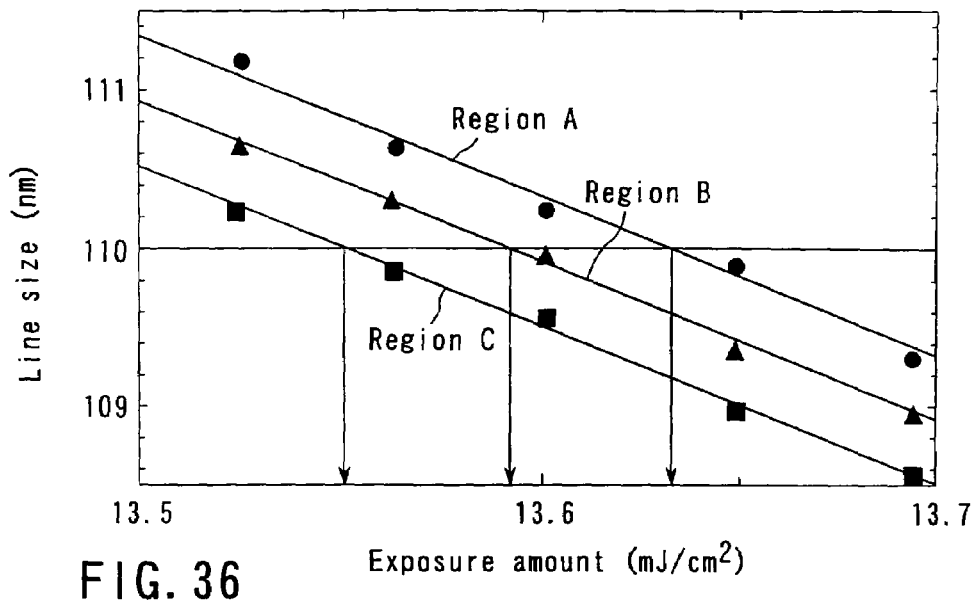
FIG. 36 is a graph showing the relationship between the exposure dose and the line width.

FIG. 36 shows the relationship between the exposure dose and the line width. In FIG. 36, respective straight lines represent the regions A, B, and C. These straight lines are calculated by approximating pattern measurement values by a linear function.

Exposure dose conditions for desired 110 nm are attained from the relationship in FIG. 36 for the regions A, B, and C. As a result, the exposure dose is 13.63 mJ/cm$^2$ for the region A, 13.59 mJ/cm$^2$ for the region B, and 13.55 mJ/cm$^2$ for the region C.

The regions A, B, and C are exposed by the calculated exposure doses (energy amounts). A method of correcting the exposure dose within the exposure region has been described in detail in the 14th and 15th embodiments, and a description thereof will be omitted.

Then, the wafer W is transferred to a PEB processing unit where it is heated at 130° C. for 90 sec. In the PEB processing unit, the air stream described in the 11th embodiment is supplied in one direction along the wafer. As shown in FIG. 35, the air stream in PEB is supplied in a direction different by 90° from the scan direction in exposure. After PEB processing, the wafer W undergoes the same processing as that of the first embodiment to form a resist pattern.

The resist line width is measured within the exposure region after developing. As a result, in-plane width variations between 110-nm line & space patterns are greatly reduced in comparison with a case wherein the exposure dose condition is not corrected.

The scan direction in exposure and the air stream direction in PEB are made different from each other by 90° in the 16th embodiment, but the present invention is not limited to this. It is important to obtain the relationship between the exposure dose and the pattern width shown in FIG. 36 in accordance with the resist pattern ratio, the air stream direction in PEB, and the stream speed, and to calculate the correction exposure dose.

The 16th embodiment has exemplified the correction method using the resist pattern ratio within the exposure region. Correction is desirably performed between exposure regions. As the correction method, it is desirable to sequentially execute correction from the upstream to the downstream in the air stream direction in PEB as described.

The relationship between the exposure dose and the pattern width is approximated by a linear function on the basis of the pattern width measurement value in the 16th embodiment, but the present invention is not limited to this. The same effects can also be attained by approximation by a multi-dimensional function based on the width measurement value.

(17th Embodiment)

A substrate processing method according to the 17th embodiment of the present invention will be described with reference to the several views of the accompanying drawing. In the 17th embodiment, the exposure dose is corrected in a light irradiation step different from exposure. More specifically, the exposure dose condition is the same between all exposure chips in transferring a desired pattern. After that, the exposure dose is adjusted in accordance with the position of each exposure chip.

Up to exposure, processing is the same as that of the 16th embodiment. By exposure, exposure chips including 130-nm isolated line patterns are transferred in an array of 11 (vertical)×13 (horizontal) (except for exposure chips outside the wafer) on a wafer to form a latent image.

Figure 37:
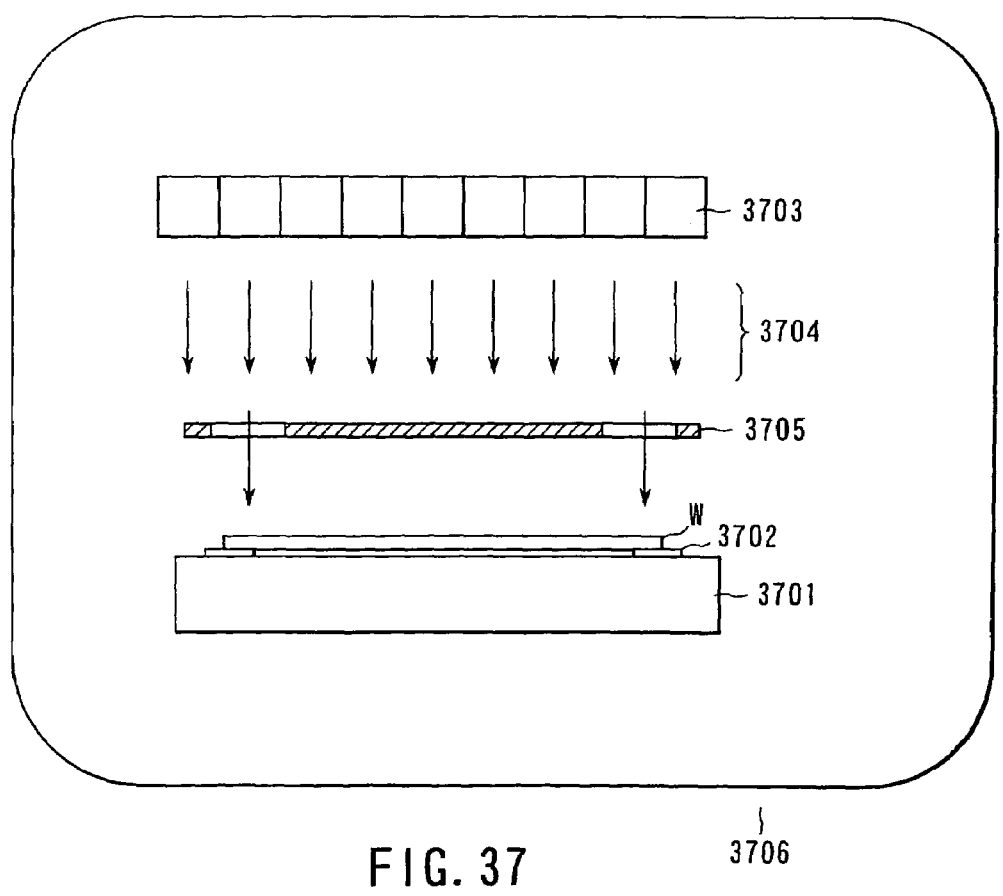
FIG. 37 is a view schematically showing a light irradiation system for adjusting the exposure dose.

FIG. 37 schematically shows a light irradiation system for adjusting the exposure dose. A wafer W is set on a stage 3701 via a proximity gap 3702. A light source 3703 for irradiating light is set above the wafer W. The light source 3703 is made up of a plurality of low-pressure mercury-vapor lamps. The light source 3703 emits irradiation light 3704. A wavelength selection filter (not shown) transmits only light with a wavelength of 193 nm out of the irradiation light 3704. The 193-nm light irradiates the wafer W via a mask 3705. This light irradiation system is installed in a nitrogen-purged chamber 3706.

Figure 38:
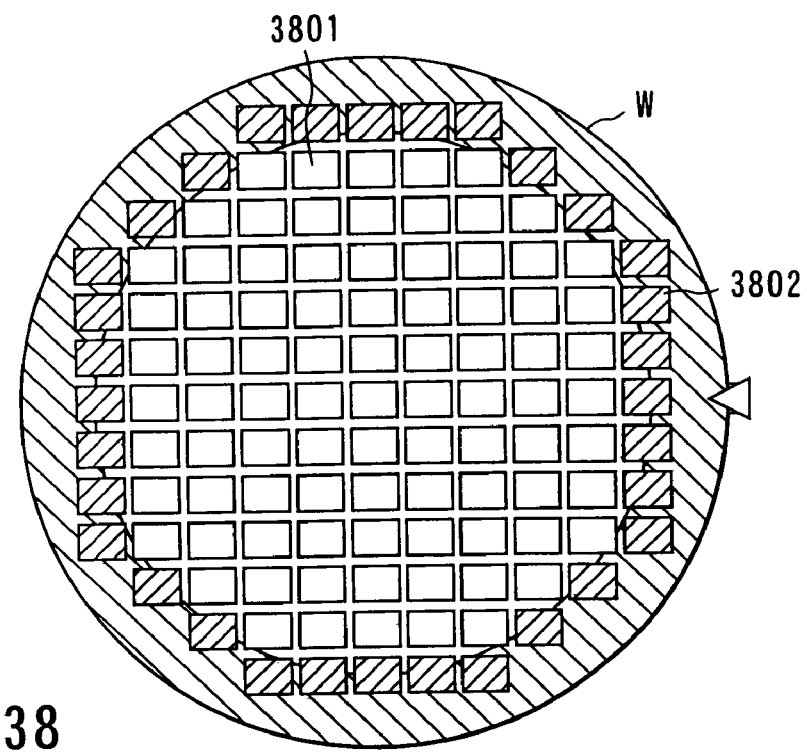
FIG. 38 is a plan view schematically showing the positional relationship between exposure regions 3801 formed on a wafer and light irradiation regions 3802 irradiated in correction.
Figure 39:
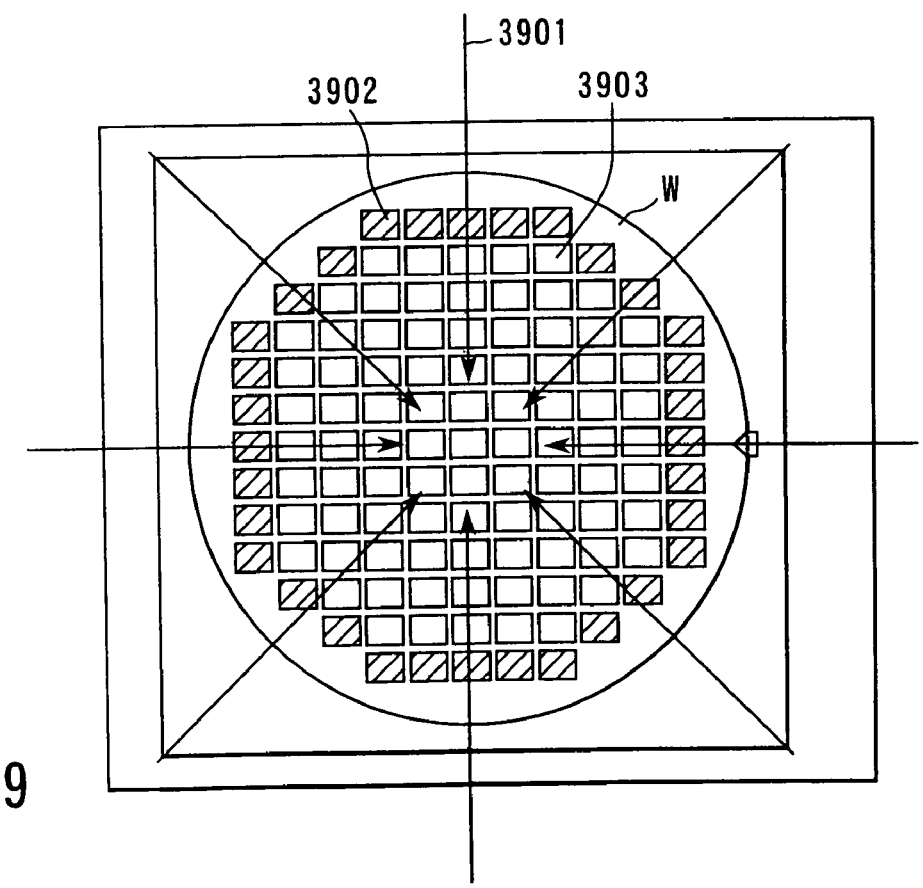
FIG. 39 is a plan view showing the positional relationship between the air stream direction and the exposure chip.

FIG. 38 schematically shows the positional relationship between exposure region 3801 formed on the wafer and light irradiation region 3802 irradiated in correction. The 17th embodiment uses a PEB unit in the PEB step in which a air stream 3901 is radially supplied from the peripheral portion to the center, as shown in FIG. 39. Thus, only the outermost exposure region (3902 in FIG. 39) at the uppermost stream of the air stream in PEB are irradiated with 193-nm light. The irradiation amount condition is 0.08 mJ/cm$^2$, and is attained by the following procedures. Reference numeral 3903 denotes a downstream exposure region.

Figure 40:
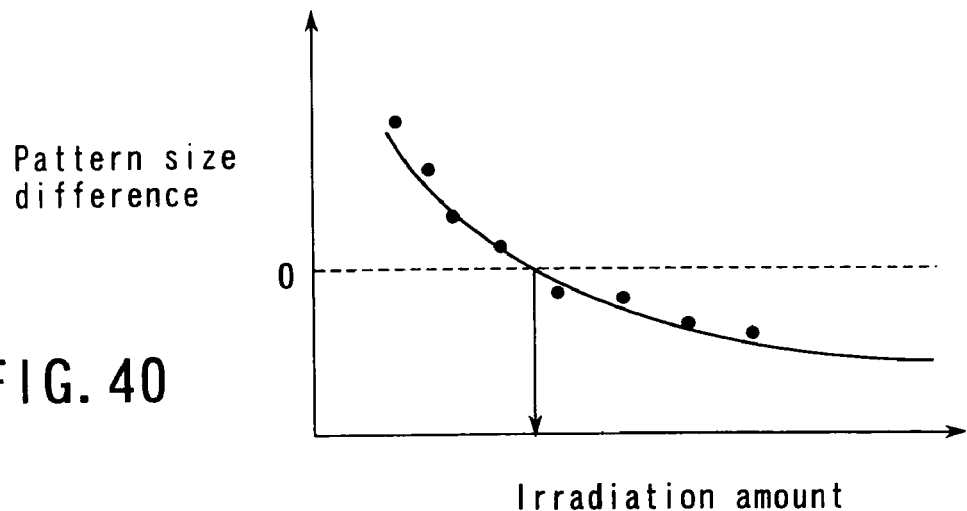
FIG. 40 is a graph showing the relationship between the irradiation amount in correction, and the width difference between an outermost (uppermost-stream) exposure region and an inner (downstream) exposure region.

FIG. 40 shows the relationship between the irradiation amount in correction, and the width difference between the outermost (uppermost-stream) exposure region and the inner (downstream) exposure region. The irradiation amount condition for a pattern width difference of 0 can be detected from the relationship between the correction irradiation amount condition and the pattern width difference.

The wafer W is transferred to a PEB processing unit where it is heated at 130° C. for 90 sec. In the PEB processing unit, the air stream is radially supplied from the peripheral portion to center of the wafer, as shown in FIG. 39. After PEB processing, the wafer W undergoes the same processing as that of the first embodiment to form a resist pattern.

The resist line width is measured within the exposure region after developing. As a result, in-plane width variations between 130-nm line patterns are greatly reduced in comparison with a case wherein the exposure dose condition is not corrected.

Figure 41:
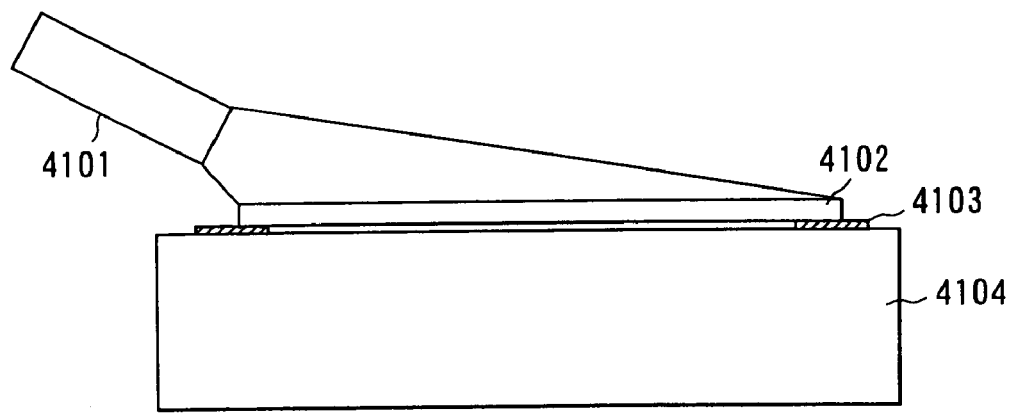
FIG. 41 is a view showing another example of a substrate processing method according to the 17th embodiment of the present invention.
Figure 42:
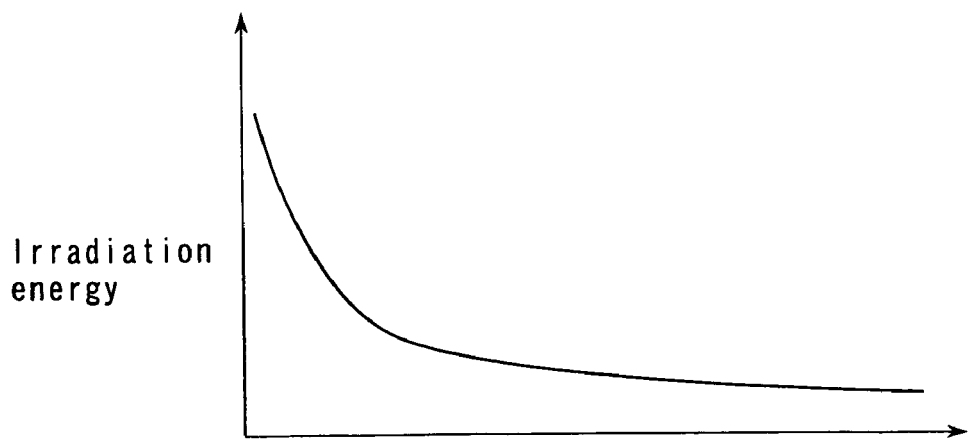
FIG. 42 is a graph showing the relationship between the position X within the chip and the irradiation energy in the example shown in FIG. 41.

The 17th embodiment adopts a radial air stream in PEB, but the present invention is not limited to this. If a PEB unit with a one-directional air stream is used, a lamp having divergence is employed as a light source, which enables diagonally irradiating the wafer from above it. In FIG. 41, reference numeral 4101 denotes a light source; 4102, a wafer; 4103, a proximity gap; and 4104, a stage. In this method, the irradiation amount is corrected by distributing the irradiation amount as shown in FIG. 42.

The 17th embodiment has exemplified correction of only the uppermost-stream exposure region, but the present invention is not limited to this. A filler whose transmittance changes may be used instead of the mask (3705 in FIG. 37).

The 17th embodiment employs a low-pressure mercury-vapor lamp as a light source in correction irradiation. However, the present invention is not limited to this and can use, e.g., a laser as a light source.

(18th Embodiment)

A substrate processing method according to the 18th embodiment of the present invention will be described with reference to the several views of the accompanying drawing. In the 18th embodiment, the exposure dose condition is the same between all exposure regions in transferring a desired pattern. Thereafter, the exposure dose is adjusted in accordance with the position of each exposure chip. The exposure dose is adjusted in another electron beam (to be referred to as EB hereinafter) irradiation step.

A positive chemically amplified resist for an EB is applied onto a wafer W by spin coating. The wafer W is pre-baked at 100 for 90 sec. As a result, a 300-nm thick resist film is formed on the wafer.

Figure 43:
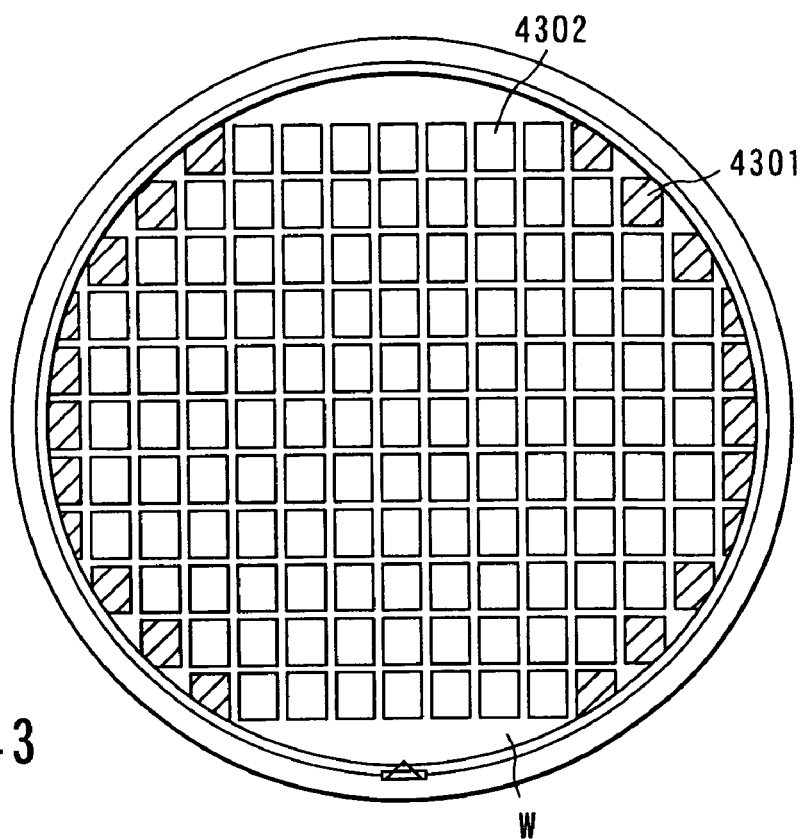
FIG. 43 is a plan view showing a layout of exposure chips on a wafer.

After pre-bake, the wafer W is cooled to room temperature. The wafer W is transferred to a pattern transfer apparatus using an EB as an exposure light source. As shown in FIG. 43, exposure regions including 100-nm line & space patterns are transferred in an array of 11 (vertical)×15 (horizontal) on the wafer to form a latent image. The exposure regions on the wafer are classified into notched exposure regions 4301 at the wafer edge and other exposure regions 4302.

Figure 44:
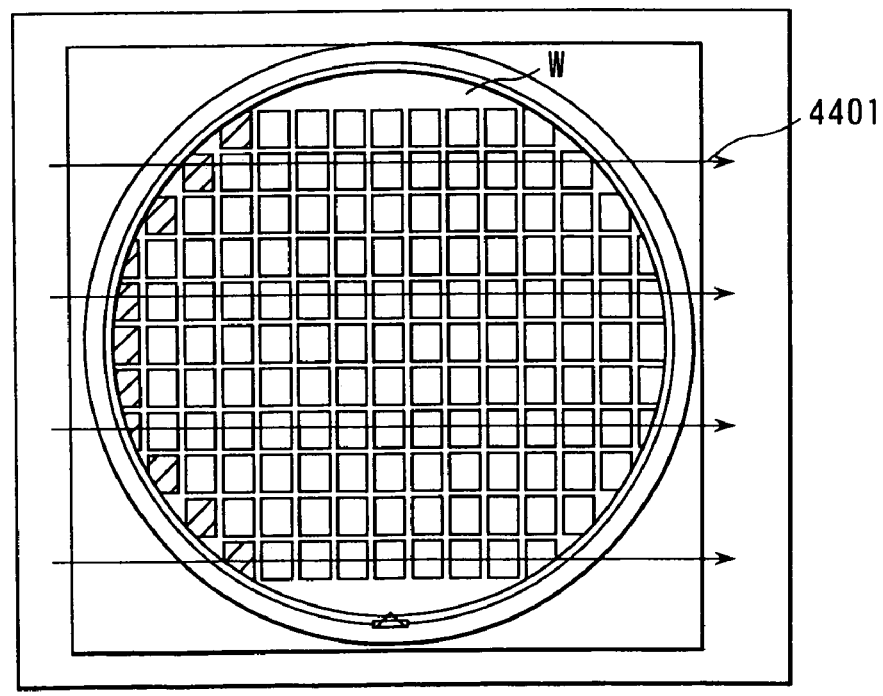
FIG. 44 is a plan view showing the positional relationship between the air stream direction and the exposure chip.
Figure 45:
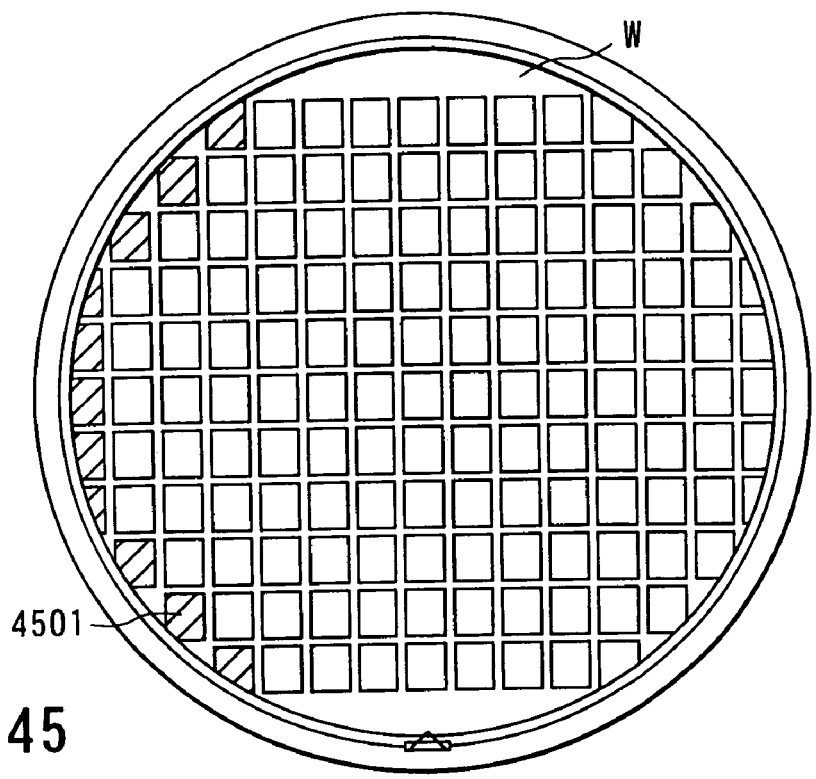
FIG. 45 is a plan view showing a layout of exposure chips on a wafer.

In a PEB unit used in the PEB step, an air stream 4401 is supplied in one direction along the wafer, as shown in FIG. 44. Hence, only exposure regions (4501 in FIG. 45) at the uppermost stream of the air stream are irradiated with the EB. The irradiation amount condition is attained by the following procedures.

Figure 46:
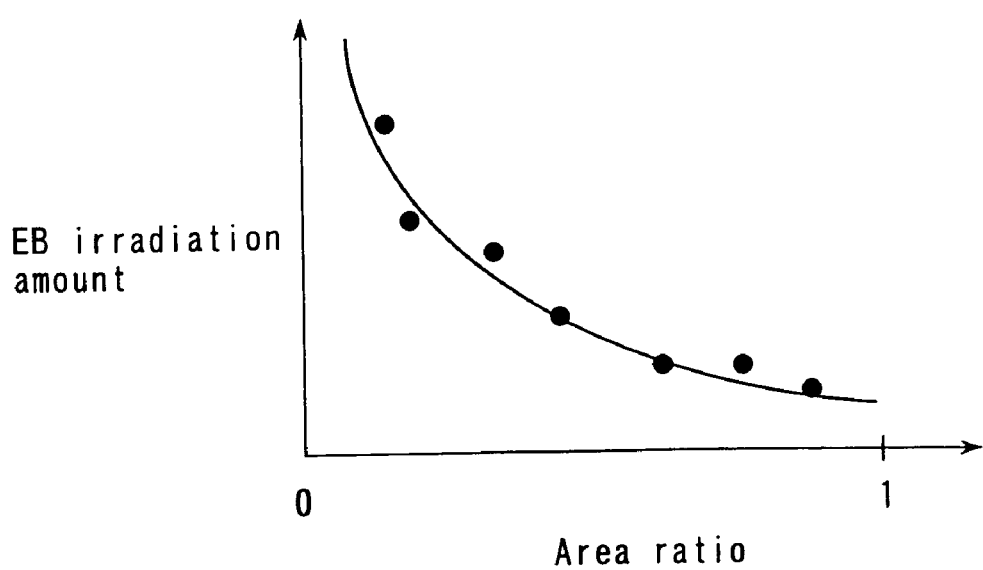
FIG. 46 is a graph showing the relationship between the area of a notched exposure region and an EB irradiation amount necessary for correcting pattern width variations.

FIG. 46 shows the relationship between the area of the notched exposure region (normalized by the original exposure region area) and an EB irradiation amount necessary for correcting pattern width variations. For a smaller area of the notched exposure region, a larger irradiation amount is required because the acids amount which evaporates in PEB is smaller. By this procedure, an irradiation amount necessary for correction is calculated in accordance with the area of the notched exposure region. The exposure dose is adjusted under the condition.

The wafer W is transferred to the PEB processing unit where it is heated at 110° C. for 90 sec. In the PEB processing unit, the air stream is supplied in one direction along the wafer, as shown in FIG. 44. After PEB processing, the wafer W undergoes the same processing as that of the first embodiment to form a resist pattern.

The resist line width is measured within the exposure region after developing. As a result, in-plane width variations between line & space patterns are greatly reduced in comparison with a case wherein the exposure dose condition is not corrected.

The 18th embodiment has exemplified correction of only an exposure region at the uppermost stream, but the present invention is not limited to this. The correction irradiation amount is desirably calculated from the upstream to the downstream, as described in the 13th embodiment.

(19th Embodiment)

A resist pattern formation method according to the 19th embodiment of the present invention will be described with reference to the several views of the accompanying drawing. In the 19th embodiment, the supply condition of a developer in developing is adjusted in accordance with the exposure chip.

Up to exposure, processing is the same as that of the 11th embodiment. By exposure, exposure chips including 150-nm line & space patterns are transferred in an array of 11 (vertical)×13 (horizontal) (except for exposure chips outside a wafer W) on the wafer to form a latent image. In the 19th embodiment, the exposure dose condition is the same between exposure chips. The PEB processing step is executed using, e.g., a general heating apparatus identical to the conventional one shown in FIG. 65.

In the 19th embodiment, the line width of a developed resist pattern is adjusted in the developing step so as to make an uppermost-stream exposure chips 1801A and a downstream exposure chips 1801B shown in FIG. 18 equal each other. For this purpose, the developing speed of the resist pattern on the wafer is adjusted. More specifically, the developing speed of the uppermost-stream exposure chips 1801A is increased by the following method.

A developing method in the 19th embodiment will be explained with reference to FIGS. 47A and 47B. A linear supply nozzle 4701 is scanned from one end (start position in FIGS. 47A and 47B) to the other end (end position in FIGS. 47A and 47B) of the wafer W while supplying a chemical. As a result, a chemical film 4702 is formed on the entire surface of a substrate to be processed.

In general, to uniformly develop the wafer surface, a developer film is formed while the nozzle supply amount, the distance between the nozzle and the wafer, and the nozzle scan speed are kept constant (1.0 L/min, 1.5 mm, and 120 mm/sec, respectively). After the wafer is kept still and developed for 60 sec, it is rinsed and spin-dried to form a resist pattern.

Figure 48:
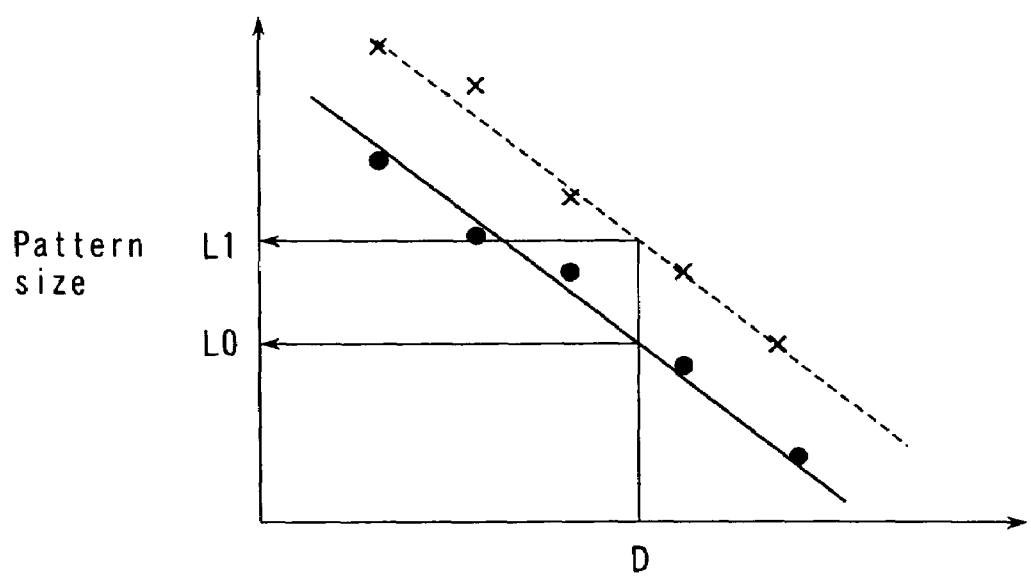
FIG. 48 is a graph showing the relationship between the exposure dose and the pattern width.

FIG. 48 shows the relationship between the exposure dose and the pattern width of a resist formed through lithography. In FIG. 48, the solid line represents a downstream exposure chips, and the broken line represents an uppermost-stream exposure chips. This relationship is obtained by measuring the width with respect to the exposure dose for uppermost-stream and downstream exposure chips. Since a desired width is 150 nm (L0) in the 19th embodiment, all the chips are exposed at 18.36 mJ/cm$^2$ (D). However, the width of the uppermost-stream exposure chips is 158 nm (L1) because of a small effective exposure dose.

For this reason, the exposure dose of the uppermost-stream exposure chips is effectively small, and the width becomes large. To prevent this in the 19th embodiment, the developer supply amount of the supply nozzle is increased on the uppermost-stream exposure chips, thereby increasing the solution substitution amount in supplying a developer.

This promotes developing to make the width of the uppermost-stream exposure chips equal that of the downstream exposure chips. More specifically, the supply amount is increased as follows.

Figure 49:
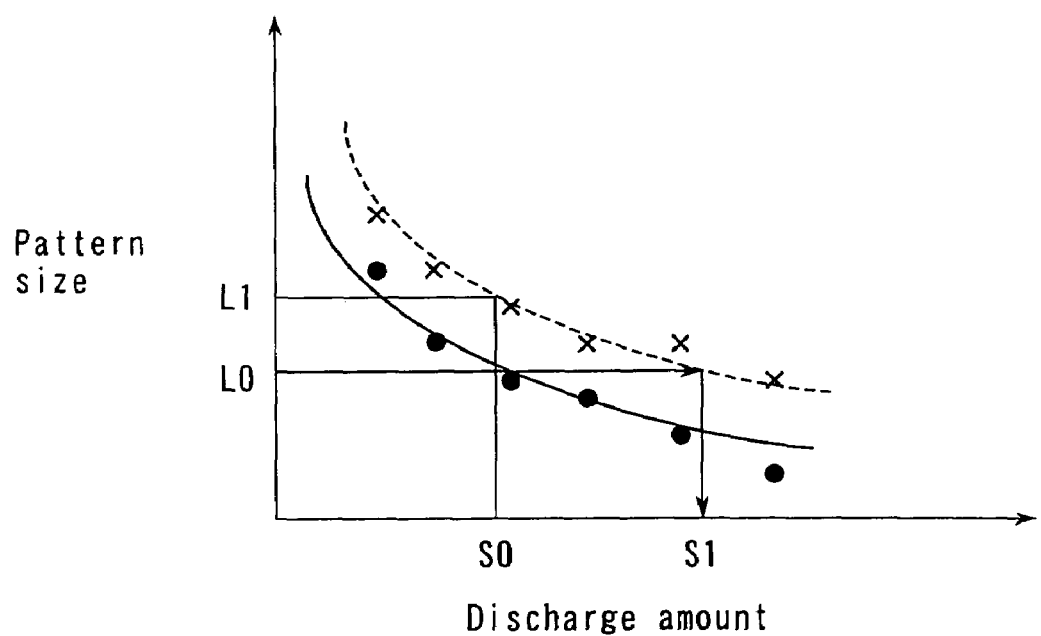
FIG. 49 is a graph showing the relationship between the supply amount of a developer and the pattern width.

FIG. 49 shows the relationship between the supply amount and the pattern width. The supply amount is determined using the relationship in FIG. 49. In FIG. 49, the solid line represents a downstream exposure chips, and the broken line represents an uppermost-stream exposure chips. This relationship is obtained by developing at different developing amounts a substrate to be processed that has been exposed at the exposure dose (D) and measuring the pattern widths of uppermost-stream and downstream exposure chips. With a normal supply amount of 1.0 L/min (S0), the downstream and uppermost-stream chips are finished with L0 and L1, respectively. From this relationship, the uppermost-stream chips which receive an effectively small exposure dose can be finished with the desired width (L0) by processing it at a supply amount S1 (1.2 L/min).

A detailed supply amount control method will be described with reference to FIGS. 50 and 51.

Figure 50:
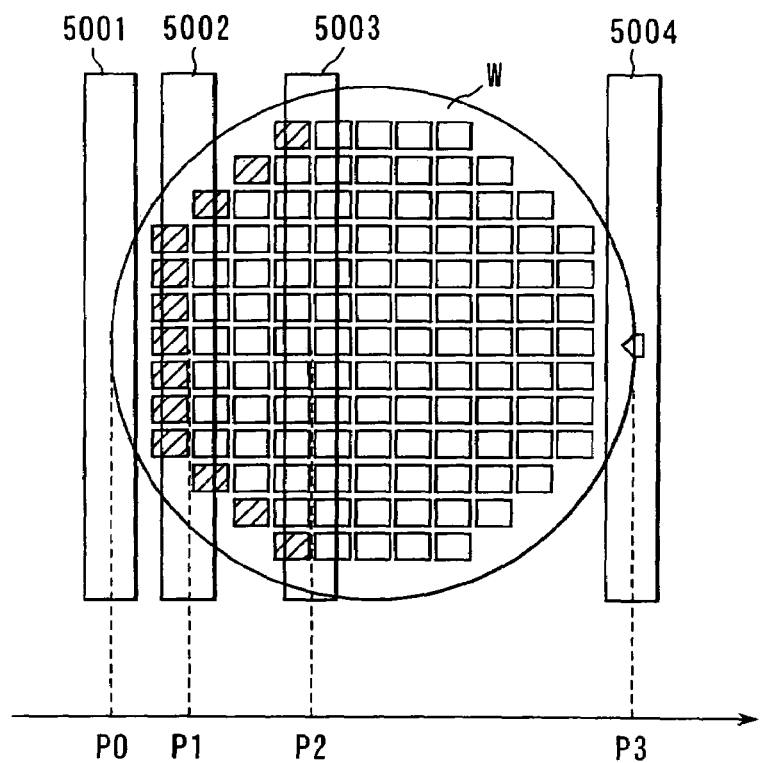
FIG. 50 is a plan view showing the position of a supply nozzle.

In FIG. 50, reference numeral 5001 (position P0) denotes a position where the supply port of the supply nozzle comes to the wafer W; 5002 (position P1), a position where the supply port of the supply nozzle passes through a line of uppermost-stream exposure chips; 5003 (position P2), a position where no uppermost-stream exposure chip exists; and 5004 (position P3), the other end of the wafer W.

Figure 51:
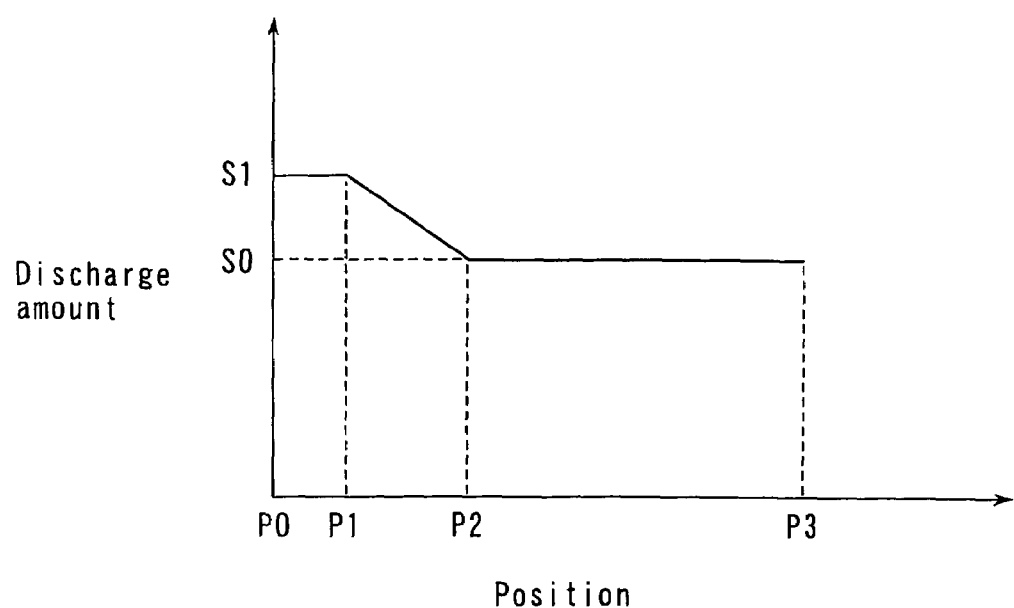
FIG. 51 is a graph showing the relationship between the nozzle position and the supply amount of a developer.

FIG. 51 shows the relationship between the position of the nozzle supply port and the supply amount. As shown in FIG. 51, the nozzle is scanned with the supply amount S1 when the supply port of the supply nozzle moves from the position P0 to the position P1, and with the supply amount S0 after the position P2. The supply amount is controlled to linearly decrease from S1 to S0 between the positions P1 and P2. The change in supply amount from the position P1 to the position P2 is not limited to this. The supply amount may be changed quadratically or the like so as to obtain the highest uniformity.

Although the 19th embodiment has exemplified the supply amount control method, the distance between the wafer and the nozzle or the nozzle scan speed can also be controlled.

Figure 52:
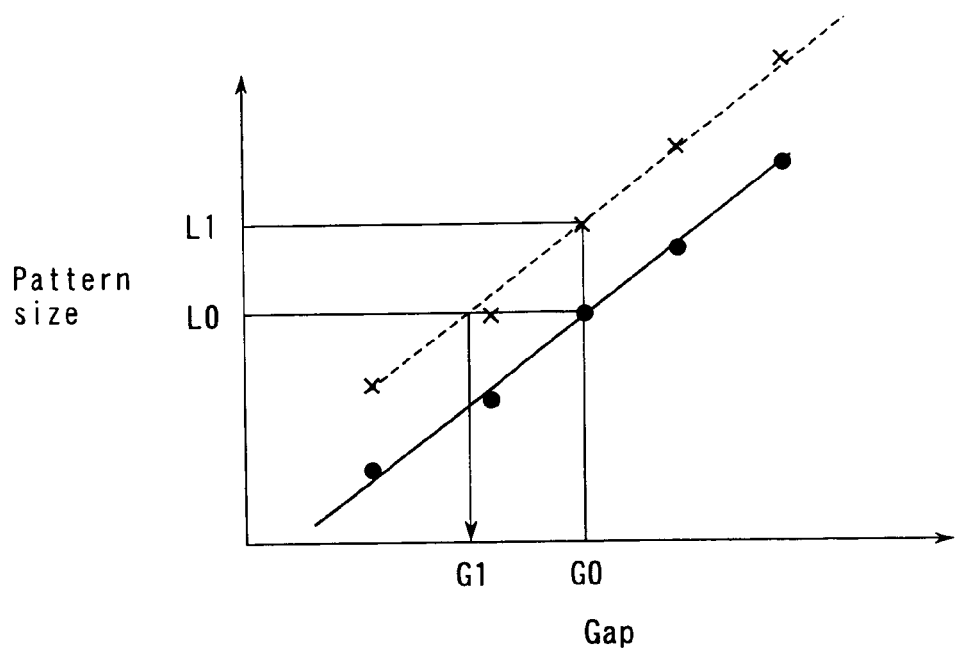
FIG. 52 is a graph showing the relationship between the pattern width, and the distance between a wafer and a nozzle (the gap in the graph)

FIG. 52 shows the relationship between the pattern width, and the distance (represented as a gap in FIG. 52) between the wafer and the nozzle. In FIG. 52, the solid line represents a downstream exposure chips, and the broken line represents an uppermost-stream exposure chips. The relationship in FIG. 52 is attained by developing at different gaps (1 to 2 mm) a substrate to be processed that has been exposed at the exposure dose (D) and measuring the pattern widths of uppermost-stream and downstream exposure chips.

When the pattern width is to be controlled by controlling the distance between the wafer and the nozzle, a gap (G1) on the uppermost-stream exposure chip is determined using the relationship shown in FIG. 52. G0 is a gap of 1.5 mm under normal conditions, and G1 is a gap of 1.2 mm on the uppermost-stream exposure chips.

Figure 53:
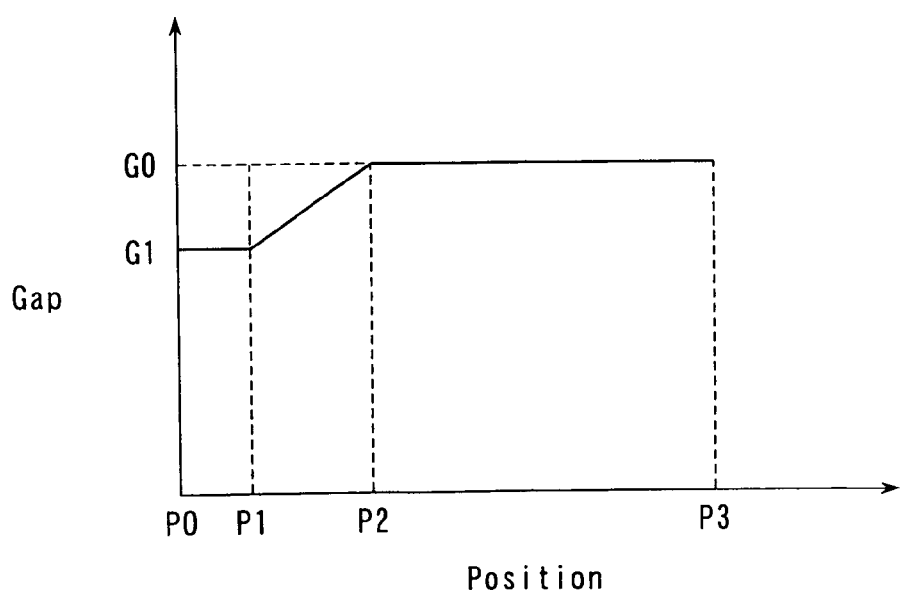
FIG. 53 is a graph showing the relationship between the position and the gap.

FIG. 53 shows the relationship between the position of the nozzle supply port, and the gap between the wafer and the nozzle. By using the relationship shown in FIG. 52, the nozzle is scanned by controlling gaps on uppermost-stream and downstream exposure chips to optimal values, as shown in FIG. 53. That is, the nozzle is scanned with the gap G1 when the supply port of the supply nozzle moves from the position P0 to the position P1, and with the gap G0 after the position P2. The gap is controlled to linearly increase from G1 to G0 between the positions P1 and P2. The change in gap from the position P1 to the position P2 is not limited to this. The gap may be changed quadratically so as to obtain the highest uniformity.

The developing speed can be adjusted by changing the gap because the pressure of the solution which hits the substrate surface can be changed. More specifically, developing can be accelerated by increasing the pressure or decelerated by decreasing the pressure. Since the supply pressure is adjusted directly within the distance (1 to 2 mm) to the substrate in the 19th embodiment, developing can be more promoted for a smaller distance. However, another experiment reveals that developing is more promoted for a larger distance when the supply port is spaced apart from the substrate surface by 5 mm or more. This is because the gravity effect is larger than the supply pressure. Therefore, the gap for adjusting developing is preferably determined by obtaining the relationship between the pattern width and the gap in accordance with conditions.

Figure 54:
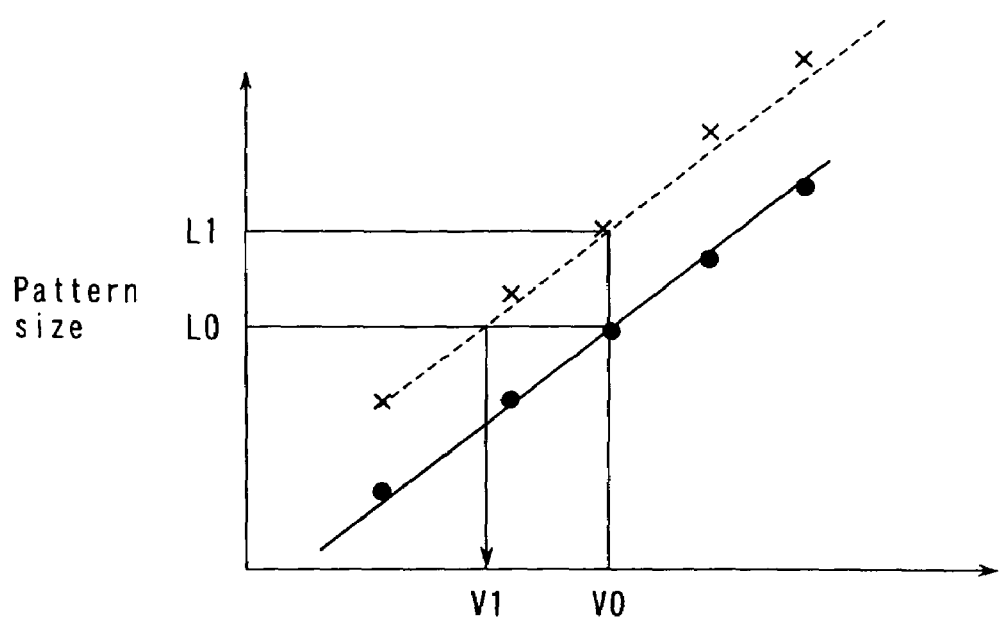
FIG. 54 is a graph showing the relationship between the nozzle scan speed and the pattern width.

FIG. 54 shows the relationship between the nozzle scan speed and the pattern width. In FIG. 54, the solid line represents a downstream exposure chips, and the broken line represents an uppermost-stream exposure chips. The relationship in FIG. 54 is obtained by developing at different nozzle scan speeds (100 to 140 mm/sec) a substrate to be processed that has been exposed at the exposure dose (D) and measuring the pattern widths of uppermost-stream and downstream exposure chips.

When the pattern width is to be controlled by controlling the nozzle scan speed, a scan speed (V1) on the uppermost-stream exposure chips is determined using the relationship shown in FIG. 54. V0 is a scan speed of 120 mm/sec under normal conditions, and V1 is a scan speed of 110 mm/sec on the uppermost-stream exposure chips.

Figure 55:
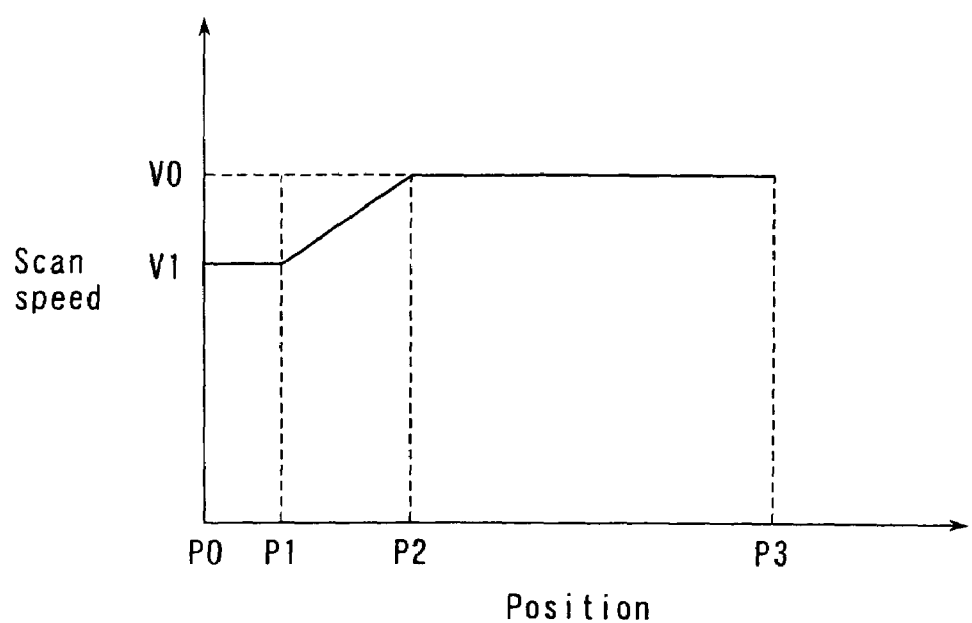
FIG. 55 is a graph showing the relationship between the nozzle position and the scan speed.

By using the relationship shown in FIG. 54, the nozzle is scanned by controlling scan speeds on the uppermost-stream and downstream exposure chips to optimal values, as shown in FIG. 55. That is, the nozzle is scanned at the scan speed V1 when the supply port of the supply nozzle moves from the position P0 to the position P1, and at the scan speed V0 after the position P2. The scan speed is controlled to linearly increase from V1 to V0 between the positions P1 and P2. The change in scan speed from the position P1 to the position P2 is not limited to this. The scan speed may be changed quadratically so as to obtain the highest uniformity.

The developing speed can be adjusted by changing the scan speed because the nozzle stay time on the substrate can be changed. More specifically, if the nozzle stays for a long time, the solution can be fully substituted to increase the developing speed. If the nozzle stays for a short time, the developing speed can be decreased. In the 19th embodiment, the scan speed is adjusted within the range (100 to 140 mm/sec) in which substitution of the solution by the stay time is dominant. Thus, developing can be promoted for a shorter distance. However, another experiment reveals that developing is more promoted for a higher scan speed when the scan speed is set to 200 mm/sec or more. This is because the solution flow effect by a nozzle force of trailing a solution is larger than the stay time. Hence, the scan speed for adjusting developing is preferably determined by obtaining the relationship between the pattern width and the scan speed in accordance with conditions.

As described above, the supply conditions of the developer on an upstream exposure chips are determined using the relationship between the pattern width and the control parameter (developer supply conditions) for downstream and uppermost-stream exposure chips. The uppermost-stream exposure chips are developed under the supply conditions different from those for the downstream exposure chips.

Developing processing is performed under the obtained supply amount conditions to remarkably improve the uniformity of the resist pattern width between exposure regions.

(20th Embodiment)

A resist pattern formation method according to the 20th embodiment of the present invention will be described with reference to the several views of the accompanying drawing. In the 20th embodiment, the concentration of a developer in the developing step is adjusted in accordance with the exposure chips. Similar to the 19th embodiment, the developing speed is adjusted such that the line width of a resist pattern is equal between an uppermost-stream exposure chips 1801A and a downstream exposure chips 1801B shown in FIG. 18. More specifically, the developing speed of the uppermost-stream exposure chips 1801A is increased by the following method.

Similar to the 11th embodiment, a 60-nm thick antireflection film is formed on a wafer W, and a 300-nm resist film is formed on the antireflection film.

Through the same exposure step as that of the first embodiment, exposure chips including 110-nm line & space patterns are transferred in an array of 11 (vertical)×13 (horizontal) (except for exposure chips outside the wafer) on the wafer to form a latent image. An exposure apparatus adopted in the 20th embodiment uses an ArF excimer laser (wavelength: 193 nm) as a light source. The exposure dose condition is the same between exposure chips.

Figure 47A:
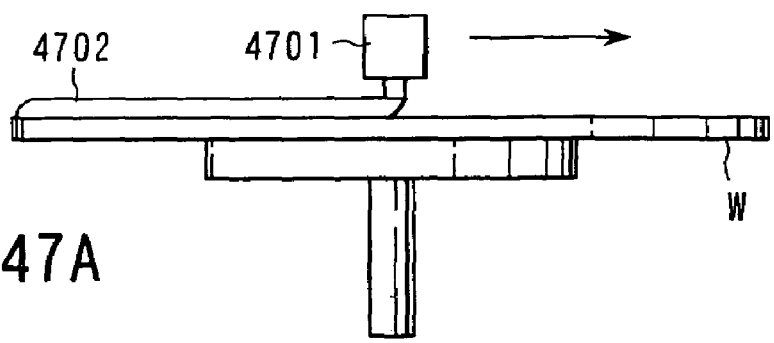
FIGS. 47A and 47B are views schematically showing a developer supply method.
Figure 47B:
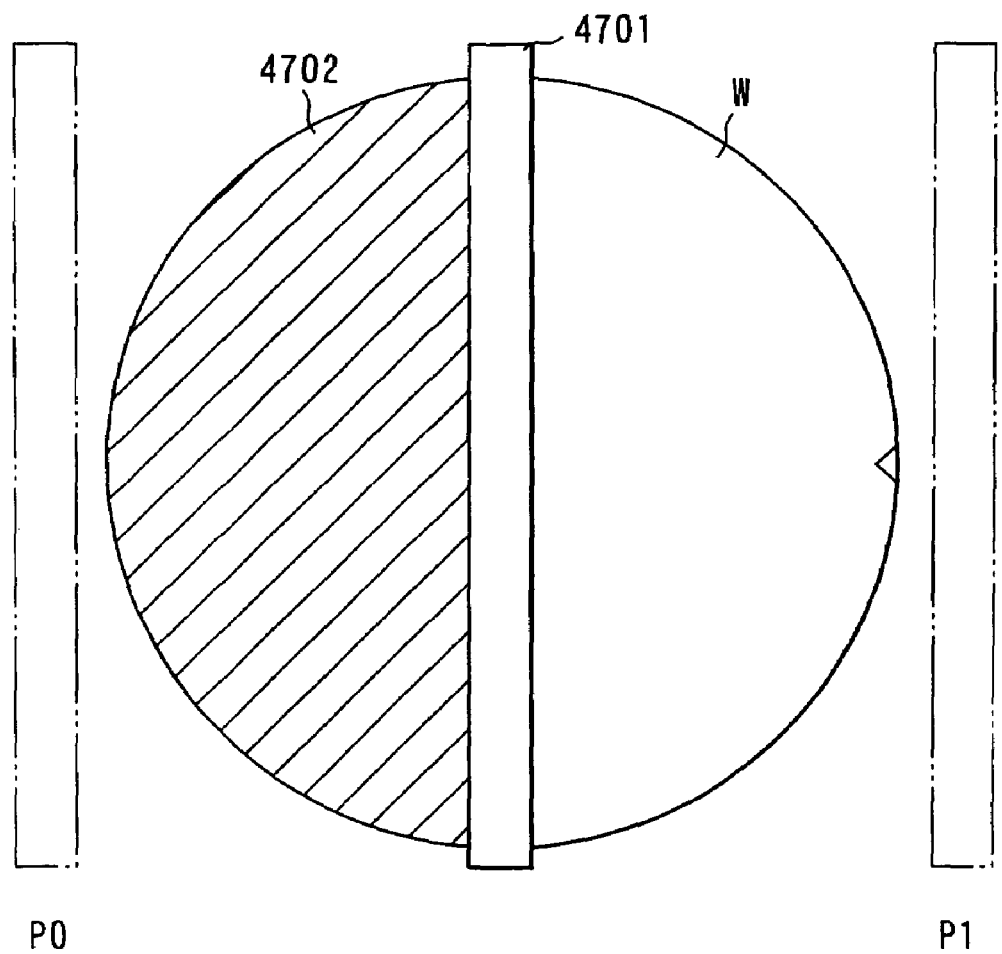
Figure 56A:
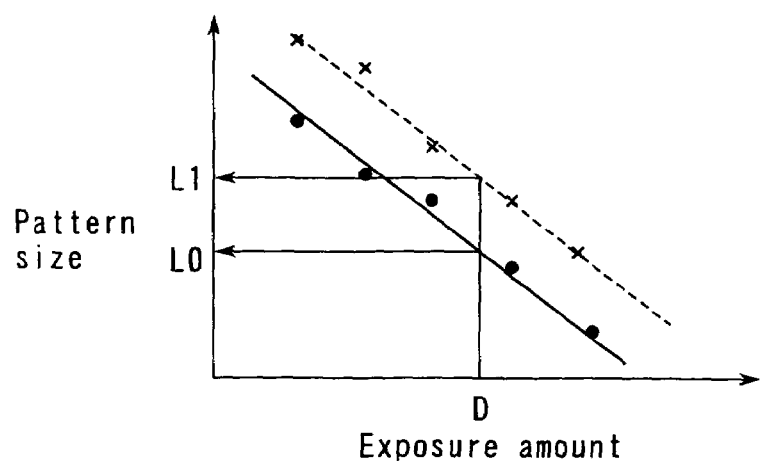
FIG. 56A is a graph showing the relationship between the exposure dose and the pattern width.

A resist pattern is formed, as described in the 19th embodiment with reference to FIGS. 47A and 47B. Since a desired width is 110 nm (L0) in the 20th embodiment, all the chips are exposed at 25.3 mJ/cm$^2$ (D) as shown in FIG. 56A. However, the width of the uppermost-stream exposure chips is 120 nm (L1). Thus, the concentration of the developer on the uppermost-stream exposure chips is increased. This promotes developing to make the width of the uppermost-stream exposure chips equal that of the downstream exposure chips. More specifically, the concentration of the developer is increased as follows.

Figure 56B:
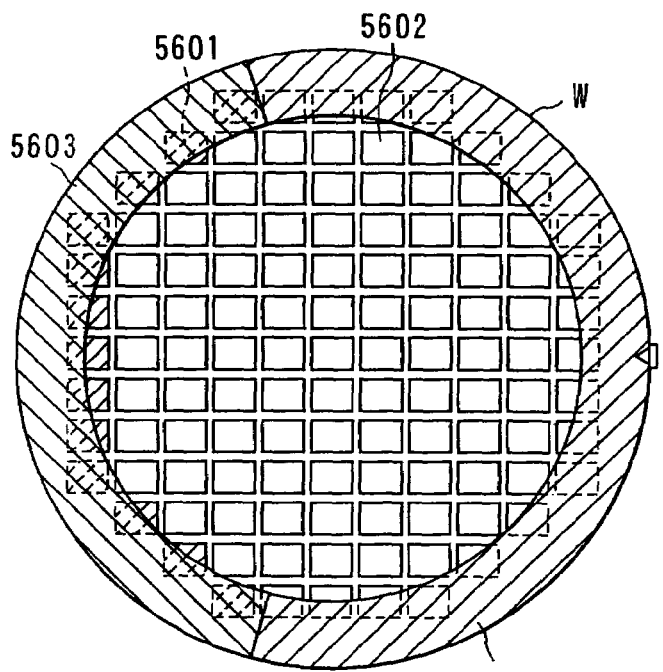
FIGS. 56B and 56C are views schematically showing a state wherein an air flow spray nozzle sprays an air flow.
Figure 56C:
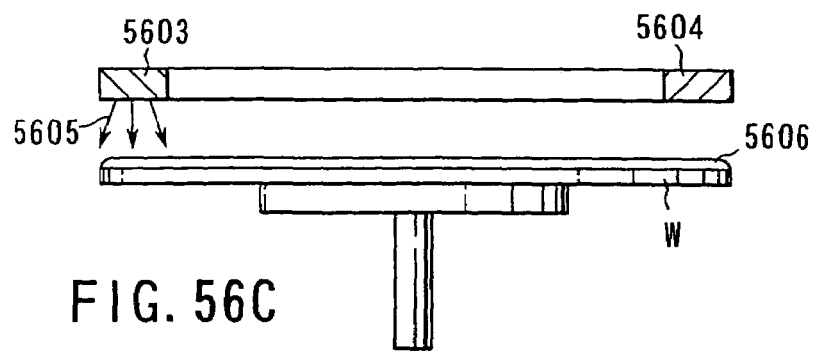

FIGS. 56B and 56C show a developer coating method. In FIGS. 56B and 56C, reference numeral 5601 denotes an uppermost-stream exposure chips; and 5602, a downstream exposure chips. An air flow 5605 is sprayed from air flow spray nozzles 5603 and 5604 to the uppermost-stream exposure chips 5601 while the wafer is kept still and developed. Then, part of the water evaporates to increase the concentration of the developer. Only the air flow spray nozzle 5603 can spray the air flow 5605 to spray the air flow to only the uppermost-stream exposure chips. Reference numeral 5606 denotes a developer.

Figure 57A:
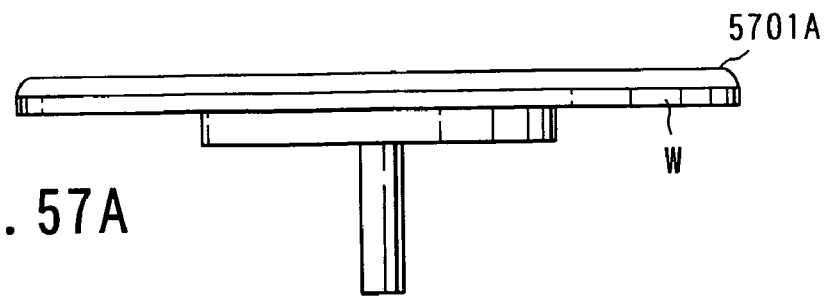
FIGS. 57A, 57B, and 57C are views for explaining formation of a thin film from a developer.
Figure 57B:
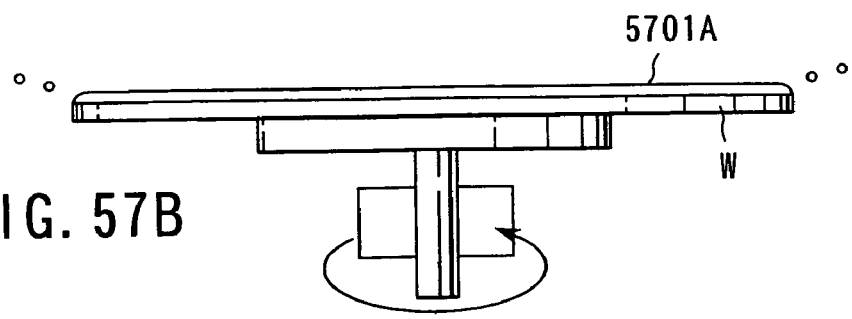
Figure 57C:
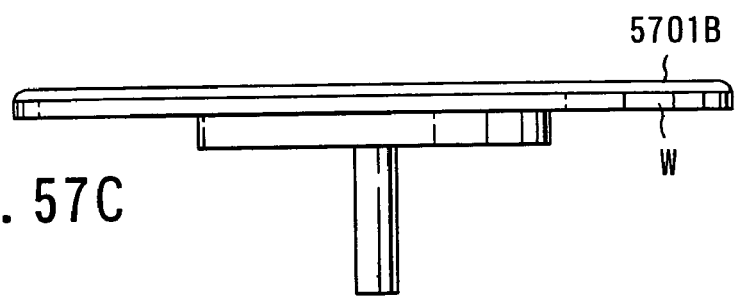

With the use of only the air flow, the evaporation amount of water is limited. For this reason, the solution thickness is adjusted before the air flow is sprayed. As shown in FIG. 57A, a developer 5701A is supplied. Then, the wafer W is rotated for 2 sec at 150 rpm, as shown in FIG. 57B, and a thin film 5701B with a solution thickness of 150 μm is formed, as shown in FIG. 57C. Thereafter, the air flow spray nozzle sprays an air flow. By decreasing the solution thickness from 1 mm to 150 μm, the concentration can be dramatically changed even with the same evaporation amount.

Figure 58:
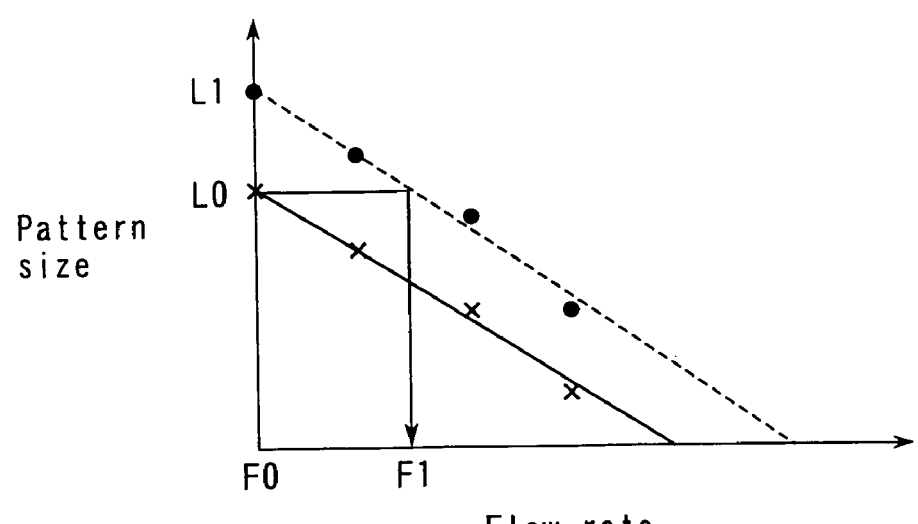
FIG. 58 is a graph showing the relationship between the spray flow rate and the pattern width.

FIG. 58 shows the relationship between the air flow amount and the pattern width of a resist formed through lithography. In FIG. 58, the solid line represents a downstream exposure chips, and the broken line represents an uppermost-stream exposure chips. A method of determining the spray flow rate of an air flow will be explained with reference to FIG. 58. In this case, the spray flow rate is a variable, and the distance between the nozzle and the wafer is kept constant at 15 mm. Under normal conditions, the flow rate is F0 (0 L/min). The downstream and uppermost-stream chips are finished with L0 and L1, respectively. From this relationship, the uppermost-stream chips which receive an effectively small exposure dose can be finished with the desired width (L0) by processing it at a flow rate F1 (0.9 L/min).

As described above, the flow rate of an air flow on an upstream exposure chips is so determined as to make the widths of downstream and uppermost-stream exposure chips equal each other by using the relationship between the pattern widths of the downstream and uppermost-stream exposure chips and the flow rate of the air flow. Developing is done under these conditions.

Developing processing is performed under the obtained air flow conditions to greatly improve the uniformity of the resist pattern width between exposure regions.

(21st Embodiment)

A resist pattern formation method according to the 21st embodiment of the present invention will be described with reference to the several views of the accompanying drawing. In the 21st embodiment, the temperature of a developer in the developing step is changed. This promotes developing to make the pattern width of the uppermost-stream exposure chips equal that of the downstream exposure chips. The developing speed becomes higher at a higher temperature in a combination of a resist and developer adopted in the 21st embodiment. Therefore, developing is promoted by increasing the temperature of the developer on the uppermost-stream exposure chips. More specifically, the developing speed of an uppermost-stream exposure chips 1801A shown in FIG. 18 is increased by the following method.

Figure 59A:
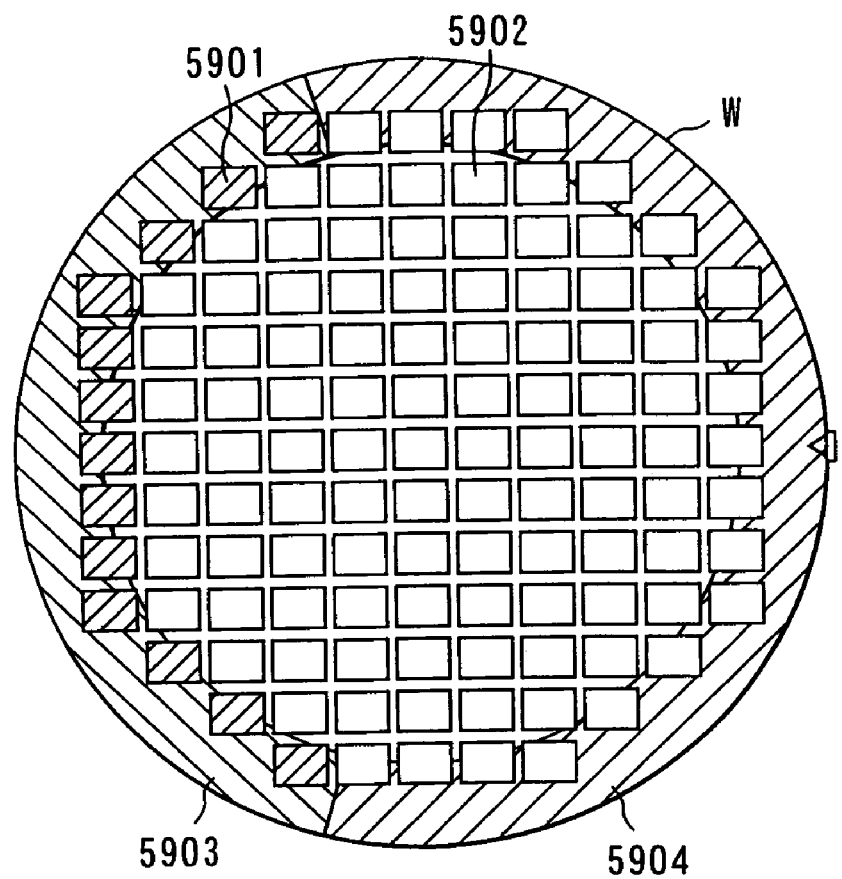
FIGS. 59A and 59B are views schematically showing a state wherein a substrate is heated by a hot plate.
Figure 59B:
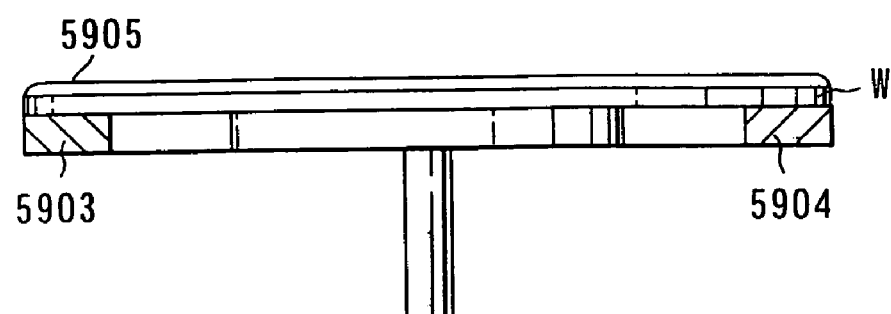

Up to exposure, processing is the same as that of the 11th embodiment. As shown in FIGS. 59A and 59B, uppermost-stream exposure chips 5901 are heated from the lower surface of a wafer by hot plates 5903 and 5904 to increase the temperature of the developer 5905. By supplying power to only the hot plate 5903, only the uppermost-stream exposure chips 5901 can be heated.

Figure 60:
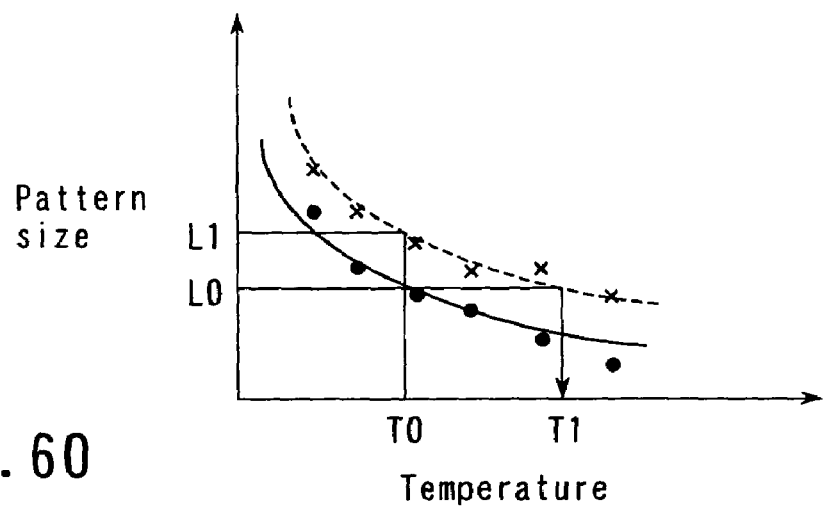
FIG. 60 is a graph showing the relationship between the temperature of a developer and the pattern width.

FIG. 60 shows the relationship between the temperature of the developer and the pattern width. In FIG. 60, the solid line represents a downstream exposure chips, and the broken line represents an uppermost-stream exposure chips. A method of determining the temperature will be explained with reference to FIG. 60. After a developer film is formed, the hot plate heated to a predetermined temperature is brought into contact with the lower surface of the wafer for 40 sec upon the lapse of 10 sec after formation of the solution film. Under normal conditions, the temperature is T0 (23° C.). The downward and uppermost-stream chips are finished with L0 and L1, respectively. From this relationship, the uppermost-stream chips can be finished with the desired width (L0) by processing it at the hot plate temperature T1 (28° C.)

As described above, the hot plate temperature on an upstream exposure chips is so determined as to make the widths of downward and uppermost-stream exposure chips equal each other by using the relationship between the pattern widths of the downstream and uppermost-stream exposure chips and the hot plate temperature. Developing is done under these conditions.

If the resist is positive and a decrease in developer temperature increases the developing speed, the hot plate temperature is so adjusted as to decrease the developer temperature on the uppermost-stream exposure chips.

In the 21st embodiment, the temperature is adjusted by heating exposure chips from the lower surface of the wafer by the hot plate. Alternatively, the exposure chips may be heated from the upper surface of the wafer by a lamp heater.

Developing processing is performed under the obtained temperature conditions to greatly improve the uniformity of the resist pattern width between exposure regions.

(22nd Embodiment)

A resist pattern formation method according to the 22nd embodiment of the present invention will be described with reference to the several views of the accompanying drawing. In the 22nd embodiment, the developing speed is adjusted by distributing the supply amount of a developer. The air stream direction in the heating step (PEB processing step) after exposure is different from those of the 19th to 21st embodiments. More specifically, the air stream is supplied from the peripheral portion to center of a substrate, as shown in FIG. 39.

Owing to the above-described reason, the line width of a resist pattern formed after developing becomes larger on uppermost-stream exposure chips 3902 than on downstream exposure chip 3901s. To prevent this, the line width of a resist pattern formed after developing is so adjusted as to be equal between the uppermost-stream exposure chips 3902 and the downstream exposure chips 3901. More specifically, the developing speed of the uppermost-stream exposure chips 3902 is increased by the following method.

Figure 61A:
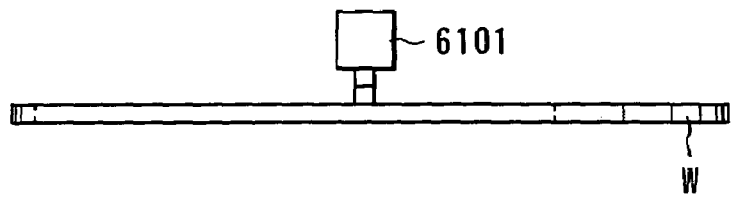
FIGS. 61A and 61B are views schematically showing a developer supply method.
Figure 61B:
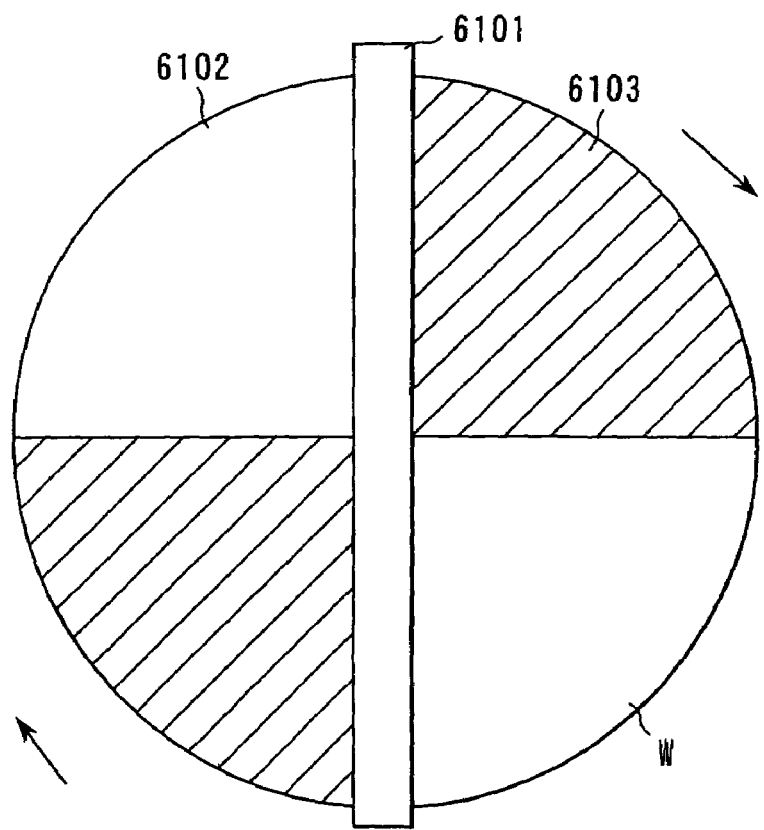

Up to exposure, processing is the same as that of the 11th embodiment. While a linear supply nozzle 6101 stands still at almost the center of a wafer W and supplies a chemical, the wafer W is rotated, as shown in FIGS. 61A and 61B. As a result, a chemical film 6103 is formed on the substrate to be processed. At this time, the nozzle supply amount, the distance between the nozzle and the wafer, and the rotational speed of the substrate are 1.0 L/min, 1.5 mm, and 40 rpm, respectively. After the wafer is kept still and developed for 60 sec, it is rinsed and spin-dried to form a uniform resist pattern.

Figure 62A:
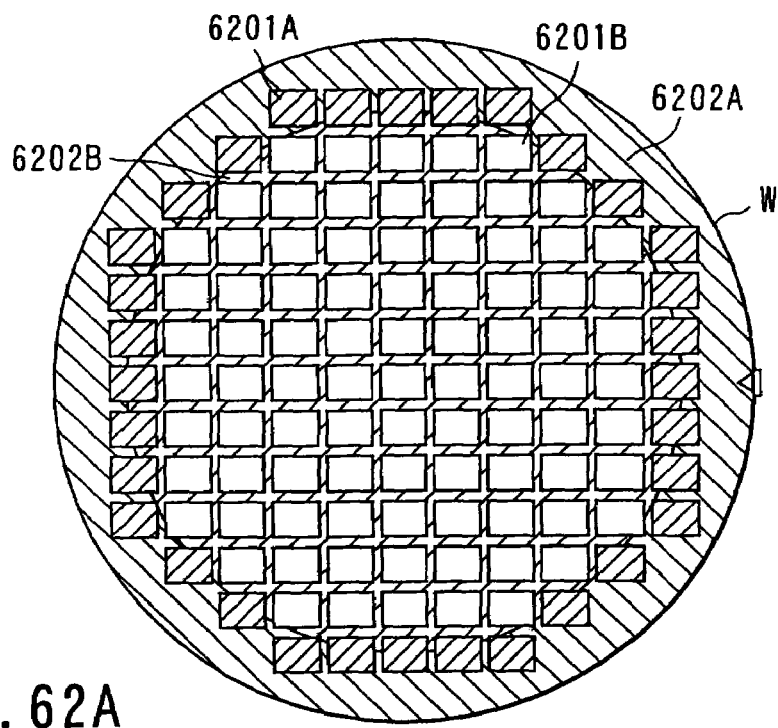
FIGS. 62A, 62B, and 62C are views schematically showing a method of controlling the supply amount in accordance with the nozzle position.
Figure 62B:
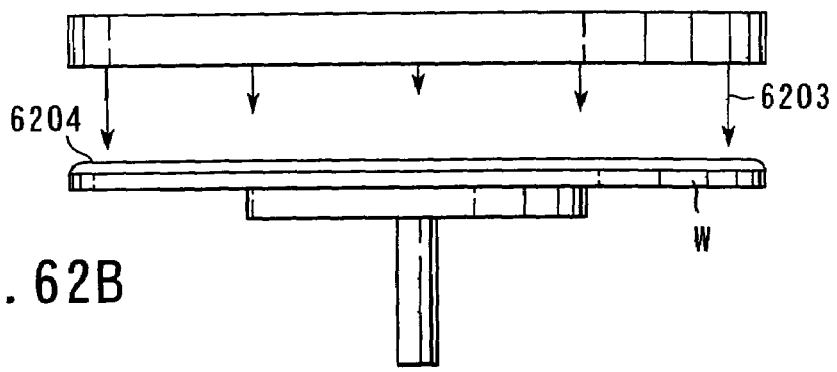
Figure 62C:
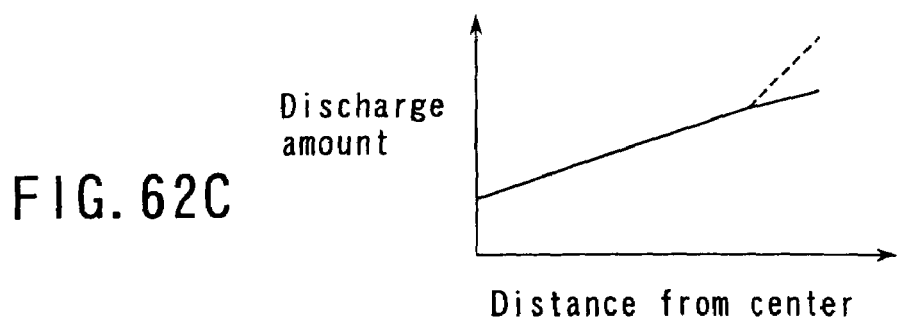

To more uniformly process the wafer surface, the supply amount is radially distributed, as shown in FIGS. 62A and 62B, so as to supply the same amount per unit area. In FIGS. 62A and 62B, reference numeral 6202A denotes an uppermost-stream exposure chips; 6202B, a downstream exposure chips; 6203 and 6204, developer. More specifically, the supply amount is increased in accordance with the distance from the center, as represented by the solid line in FIG. 62C.

As described in the 19th embodiment, the relationship between the exposure dose and the resist line width shown in FIG. 48 is attained through a general exposure step. In the 22nd embodiment, the supply amount on the uppermost-stream exposure chips is set larger than the supply amount (solid line) under uniform processing conditions, as represented by the broken line in FIG. 62C. The region with the supply amount of the broken line corresponds to the numeral number 6202B in FIG. 62A; and the rest 6202A. Accordingly, the width of the uppermost-stream exposure chips can become equal that of the downstream exposure chip.

As described above, the supply amount of a developer on the uppermost-stream exposure chips is set larger than the supply amount used for uniform processing. The developing speed on the uppermost-stream exposure chips can increase to make the width of the uppermost-stream exposure chips equal that of the downstream exposure chips.

In the 22nd embodiment, the developing speed is made equal between the uppermost-stream and downstream exposure chips by changing the supply amount from the supply nozzle. However, the developing speed can also be made equal by changing the concentration, as described in the 20th embodiment. In this case, an air flow is sprayed by air flow spray nozzles 5603 and 5604. Further, the developing speed can also be made equal by changing the temperature, as described in the 21st embodiment. In this case, a wafer is heated by hot plates 5903 and 5904.

Developing processing is performed under the obtained air flow conditions to greatly improve the uniformity of the resist pattern width between exposure regions.

(23rd Embodiment)

A resist pattern formation method according to the 23rd embodiment of the present invention will be described with reference to the several views of the accompanying drawing. In the 23rd embodiment, the developing speed is adjusted using hydrophilization processing. An uppermost-stream exposure chips 3902 shown in FIG. 39 is made more hydrophilic than a downstream exposure chips 3901. This can increase the developing speed of the uppermost-stream exposure chips 3902. More specifically, the developing speed is increased as follows. Note that the air stream direction in the PEB processing is the same as that in the 22nd embodiment.

Figure 63:
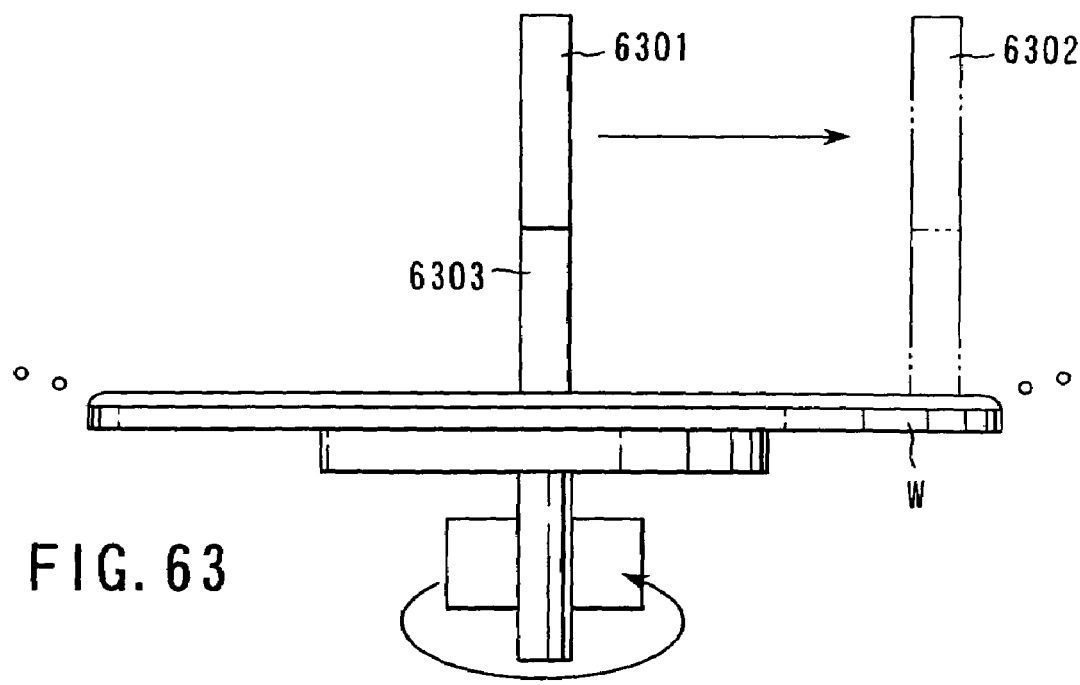
FIG. 63 is a view schematically showing an ozonated water supply method.

Up to exposure, processing is the same as that of the 11th embodiment. Then, as shown in FIG. 63, ozonated water 6303 in which ozone molecules are dissolved at 1 ppm is supplied from a straight nozzle 6301 before supply of a developer. As a result, the surface of a resist film undergoes hydrophilization processing. Ozonated water suffices to be at 5 ppm or less.

While the wafer W is rotated at 500 rpm, the straight nozzle is located at the center of the substrate (6301 in FIG. 63). The straight nozzle supplys ozonated water 6303 for 1 sec. During supply, the straight nozzle is moved up to the peripheral portion at 100 mm/sec (6302 in FIG. 63). Then, the straight nozzle is kept still for a predetermined time (to be referred to as a "stay time at the peripheral portion" hereinafter). By supplying a larger amount of ozonated water to the peripheral portion, the peripheral portion is made more hydrophilic. Supply of ozonated water stops upon the lapse of a predetermined time. The substrate is rotated and dried.

As shown in FIGS. 47A and 47B, the linear supply nozzle 4702 is scanned from one end (start position in FIGS. 47A and 47B) to the other end (end position in FIGS. 47A and 47B) of the wafer W while supplying a chemical. As a result, a chemical film 4702 is formed on the wafer W. A developer film is formed while the nozzle supply amount, the distance between the nozzle and the wafer, and the nozzle scan speed are kept constant (1.0 L/min, 1.5 mm, and 120 mm/sec, respectively). After the wafer is kept still and developed for 60 sec, it is rinsed and spin-dried to form a resist pattern.

Since a desired width is 150 nm (L0) in the 23rd embodiment, all the chips are exposed at 17.5 mJ/cm$^2$ (D), as shown in FIG. 48. However, the width of the uppermost-stream exposure chips is 158 nm (L1) because of a small effective exposure dose. This width is therefore adjusted by optimizing the stay time at the peripheral portion.

Figure 64:
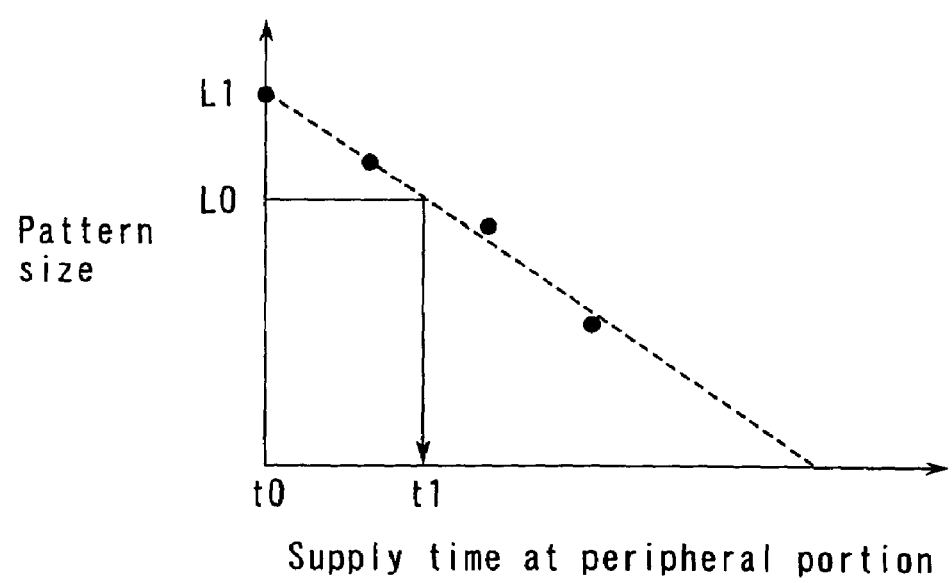
FIG. 64 is a graph showing the relationship between the pattern width and the supply time at a peripheral portion.

FIG. 64 shows the relationship between the stay time at the peripheral portion and the pattern width on the uppermost-stream exposure chips. For a stay time t0 (=0 sec), the downstream and uppermost-stream chips are finished with L0 and L1, respectively. From this relationship, the uppermost-stream chips can be finished with the desired width (L0) by processing it for a stay time t1 (=3 sec).

As described above, the developing speed on the uppermost-stream exposure chips increases by making the resist surface of the uppermost-stream exposure chips more hydrophilic. As a result, the width of the uppermost-stream exposure chips can become equal that of the downward exposure chip.

The 23rd embodiment uses ozonated water for hydrophilization processing, but the present invention is not limited to this. Pure water or an oxide liquid such as an oxygen solution, carbon monoxide solution, or hydrogen peroxide solution can also achieve the same effects and can be applied.

The 18th, 22nd, and 23rd embodiments have exemplified a one-directional supply flow in PEB, but the present invention is not limited to this. Correction can be realized by the same procedures even by using a PEB unit with a radial air stream from the peripheral portion to center of a wafer or from the center to peripheral portion of a wafer.

The 19th, and 21st to 23rd embodiments have exemplified a chemically amplified resist for a KrF excimer laser, but the present invention is not limited to this. The present invention can also be applied to an ArF resist. The 20th embodiment has exemplified a chemically amplified resist for an ArF excimer laser, but the present invention is not limited to this. The present invention can also be applied to a KrF resist. The 19th to 23rd embodiments can also be applied to $F_2$ resist, EB resist, EUV resist, and the like.

The first to 23rd embodiments have exemplified a 140-nm isolated line pattern and a line & space pattern. However, the present invention is not limited to this and can be applied for formation of a hole pattern or the like.

The first to 23rd embodiments use an excimer laser in exposure. However, the present invention is not limited to this and can adopt ultraviolet rays, far-ultraviolet rays, vacuum ultraviolet rays, electron beams, and X-rays.

The present invention is not limited to a positive chemically amplified resist described in the above embodiments, and can also be applied to a negative chemically amplified resist. For a negative resist, the developing speed of an uppermost-stream exposure chips is controlled to a lower one in the 19th to 23rd embodiments. That is, the supply conditions of the developer are controlled in the 19th and 22nd embodiments. In the 20th embodiment, an air flow is sprayed to a downward exposure chips so as to relatively decrease the developing speed of an uppermost-stream exposure chips. In the 21st embodiment, the temperature of a developer is adjusted. In the 23rd embodiment, the surface state of the resist of a developer is adjusted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A processing method for a resist film comprising:
    forming a resist film on a substrate to be processed;
    heating said substrate to be processed within a chamber,
        said chamber having an adsorption plate so arranged as to face the substrate to be processed;
        adsorbing a substance evaporated from said substrate to be processed by a surface of the adsorption plate which faces the substrate to be processed during said heating;
    exposing said resist film by irradiating said resist film with an energy radiation to form an exposure region having a latent image pattern; and
    developing said resist film.

2. The method according to claim 1, wherein said exposing is performed after said heating.

3. The method according to claim 2, wherein said developing is performed after said exposing.

4. The method according to claim 1, wherein said exposing is performed before said heating.

5. The method according to claim 4, wherein said developing is performed after said heating.

6. The method according to claim 1, wherein a temperature of said adsorption plate is controlled.

7. The method according to claim 6, wherein said adsorption plate is controlled to be lower in temperature than said substrate to be processed.

8. The method according to claim 6, wherein said adsorption plate is controlled to be higher in temperature than said substrate to be processed.

9. The method according to claim 1, wherein said resist film is a chemically amplified resist.

10. The method according to claim 1, wherein said energy radiation is selected from the group consisting of an ultraviolet ray, a far-ultraviolet ray, a vacuum ultraviolet ray, an electron beam, and an X-ray.

11. The method according to claim 1, wherein
    said adsorption plate is formed from a metal member, and
    an electric field is generated between said adsorption plate and a heating plate during heating in a direction selected from the group consisting of a direction in which said evaporated substance is adsorbed by said adsorption plate, and a direction in which generation of said evaporated substance is suppressed.

12. The method according to claim 11, wherein said exposing is performed after said heating.

13. The method according to claim 12, wherein said developing is performed after said exposing.

14. The method according to claim 11, wherein said exposing is performed before said heating.

15. The method according to claim 14, wherein said developing is performed after said heating.

16. The method according to claim 11, wherein a potential lower than that of said heating plate is applied to said adsorption plate to adsorb said evaporated substance to a surface of said adsorption plate.

17. The method according to claim 11, wherein a potential higher than that of said heating plate is applied to said adsorption plate to suppress generation of said evaporated substance from the resist film.

18. The method according to claim 11, wherein a positive potential is applied to said adsorption plate after said heating to eliminate said evaporated substance adsorbed to a surface of said adsorption plate from said adsorption plate.

19. The method according to claim 11, wherein said resist film is a chemically amplified resist.

20. The method according to claim 11, wherein said energy radiation is selected from the group consisting of an ultraviolet ray, a far-ultraviolet ray, a vacuum ultraviolet ray, an electron beam, and an X-ray.

* * * * *